US012094897B2

(12) United States Patent
Kamei

(10) Patent No.: US 12,094,897 B2
(45) Date of Patent: Sep. 17, 2024

(54) IMAGING ELEMENT AND IMAGING DEVICE

(71) Applicant: Sony SemiConductor Solutions Corporation, Kanagawa (JP)

(72) Inventor: Takahiro Kamei, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 474 days.

(21) Appl. No.: 17/430,760

(22) PCT Filed: Jan. 27, 2020

(86) PCT No.: PCT/JP2020/002674
§ 371 (c)(1),
(2) Date: Aug. 13, 2021

(87) PCT Pub. No.: WO2020/166309
PCT Pub. Date: Aug. 20, 2020

(65) Prior Publication Data
US 2022/0139978 A1    May 5, 2022

(30) Foreign Application Priority Data

Feb. 15, 2019 (JP) ................................. 2019-025595

(51) Int. Cl.
*H01L 27/146* (2006.01)

(52) U.S. Cl.
CPC .. *H01L 27/14614* (2013.01); *H01L 27/14607* (2013.01); *H01L 27/14621* (2013.01); *H01L 27/14647* (2013.01)

(58) Field of Classification Search
CPC ........ H01L 27/14614; H01L 27/14607; H01L 27/14621; H01L 27/14647; H01L 27/1463; H01L 27/14645; H01L 27/14612; H01L 27/1462; H01L 27/14627; H01L 27/14634; H01L 31/10; Y02E 10/549; H10K 39/00; H10K 39/32
See application file for complete search history.

(56) References Cited

U.S. PATENT DOCUMENTS

2015/0364513 A1   12/2015   Takahashi et al.
2018/0076252 A1*  3/2018    Togashi ................. H10K 30/82
(Continued)

FOREIGN PATENT DOCUMENTS

JP     2006147632 A    6/2006
JP     2016015485 A    1/2016
(Continued)

OTHER PUBLICATIONS

International Search Report mailed Mar. 31, 2020 in connection with PCT/JP2020/002674.

*Primary Examiner* — Marcos D. Pizarro
*Assistant Examiner* — Tiberiu Dan Onuta
(74) *Attorney, Agent, or Firm* — K&L Gates LLP

(57) ABSTRACT

An imaging element according to an embodiment of the present disclosure includes: a semiconductor substrate having an effective pixel region in which a plurality of pixels is disposed and a peripheral region provided around the effective pixel region; a photoelectric converter; a first hydrogen block layer; an interlayer insulating layer; and a separation groove. The photoelectric converter includes a first electrode, a second electrode, and an electric charge accumulation layer and a photoelectric conversion layer. The first electrode is provided on a light receiving surface side of the semiconductor substrate and includes a plurality of electrodes. The second electrode is disposed to be opposed to the first electrode. The electric charge accumulation layer and the photoelectric conversion layer are stacked and provided in order between the first electrode and the second electrode and extend in the effective pixel region. The first hydrogen block layer covers a top and a side surface of the photoelectric conversion layer and a side surface of the electric charge accumulation layer. The interlayer insulating layer is provided between the semiconductor substrate and the photoelectric converter. The separation groove separates the (Continued)

interlayer insulating layer in at least a portion of a region between the effective pixel region and the peripheral region. The separation groove has a side surface and a bottom surface covered with the first hydrogen block layer.

20 Claims, 41 Drawing Sheets

(56) References Cited

U.S. PATENT DOCUMENTS

| | | | |
|---|---|---|---|
| 2018/0175102 | A1 | 6/2018 | Togashi et al. |
| 2019/0259815 | A1* | 8/2019 | Kataoka ............ H01L 27/14623 |
| 2020/0035736 | A1 | 1/2020 | Nagahama |
| 2020/0119099 | A1 | 4/2020 | Shibuta |
| 2021/0193739 | A1* | 6/2021 | Ogasahara ........ H01L 27/14647 |
| 2023/0215880 | A1* | 7/2023 | Joei ...................... H01L 27/142 |
| | | | 257/431 |

FOREIGN PATENT DOCUMENTS

| | | |
|---|---|---|
| JP | 2017157816 A | 9/2017 |
| JP | 2018060910 A | 4/2018 |
| JP | 2019009437 A | 1/2019 |
| JP | 2019016667 A | 1/2019 |
| KR | 20170018256 A | 2/2017 |
| WO | WO-2018066256 A1 | 4/2018 |
| WO | 2018186026 A1 | 10/2018 |
| WO | WO-2018235895 A1 | 12/2018 |
| WO | WO-2019009024 A1 | 1/2019 |

* cited by examiner

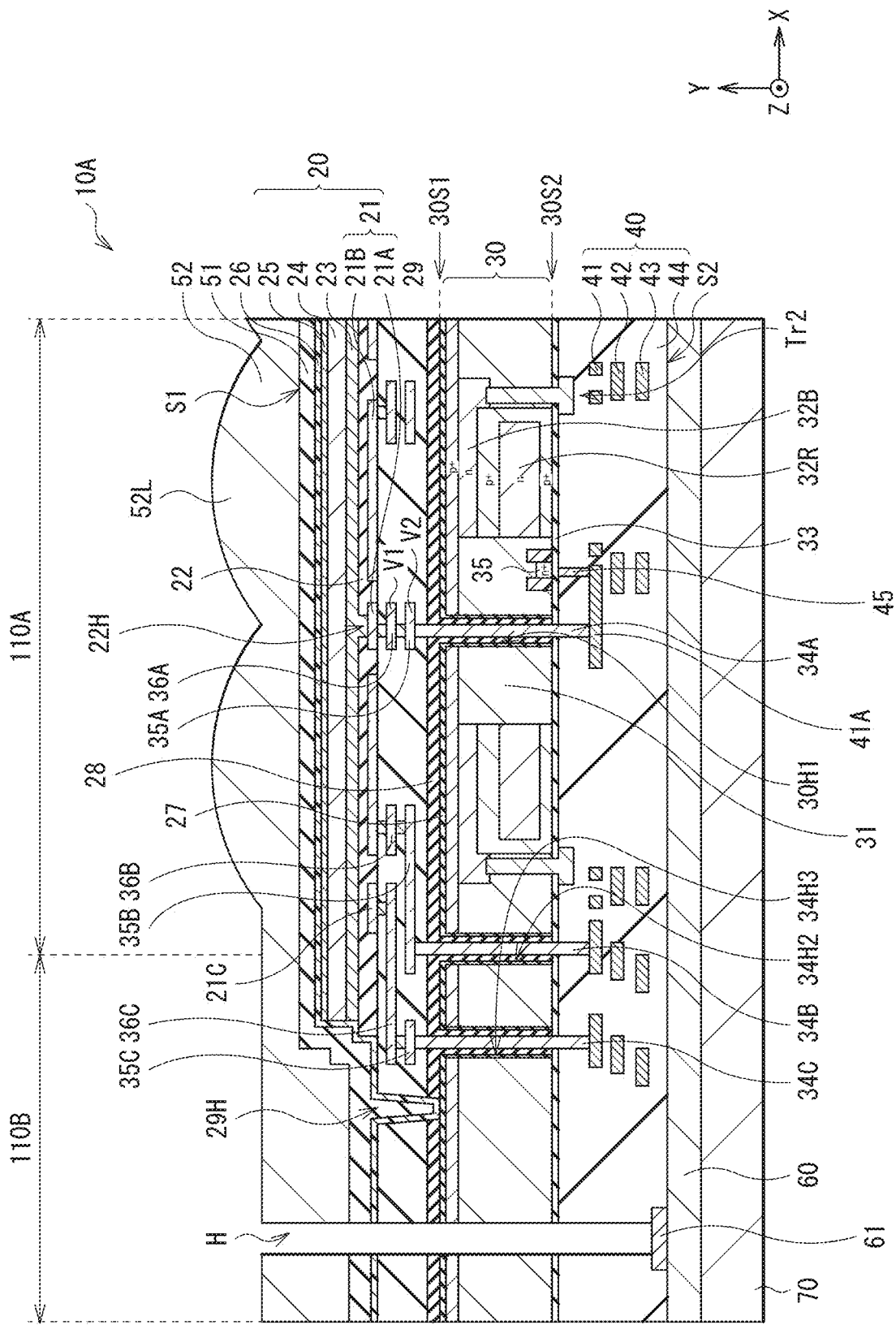
[FIG. 1]

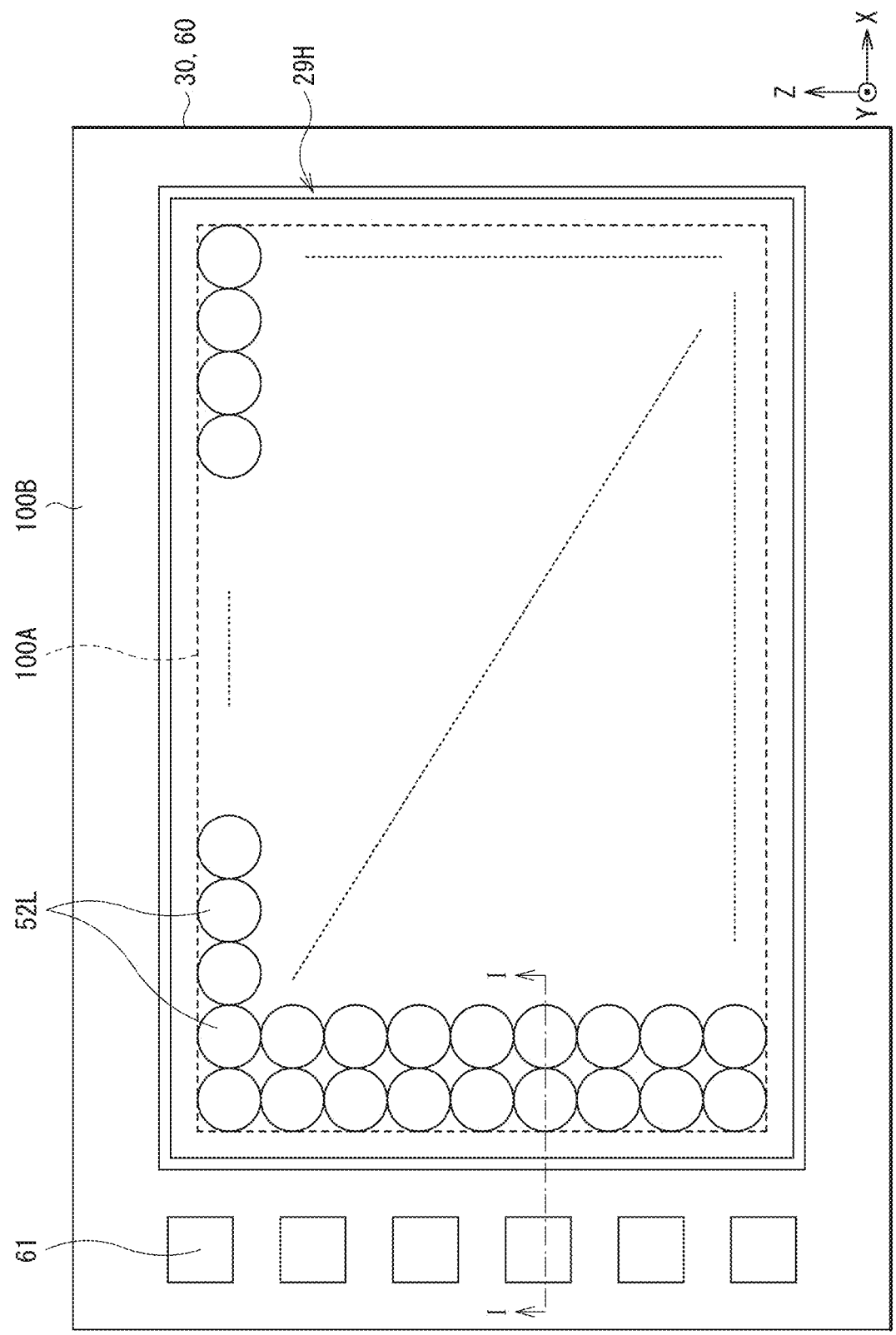
[ FIG. 2 ]

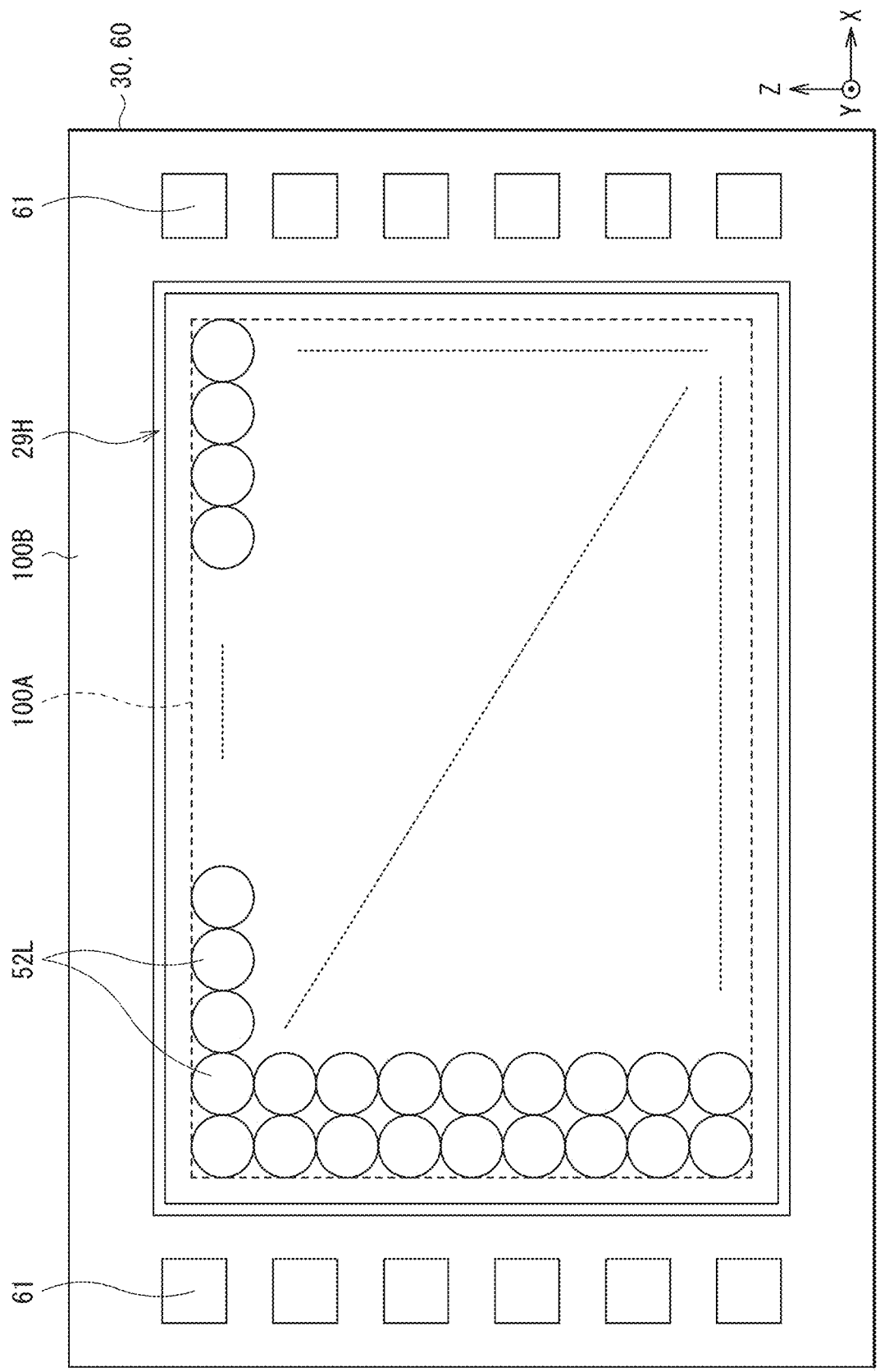
[ FIG. 3 ]

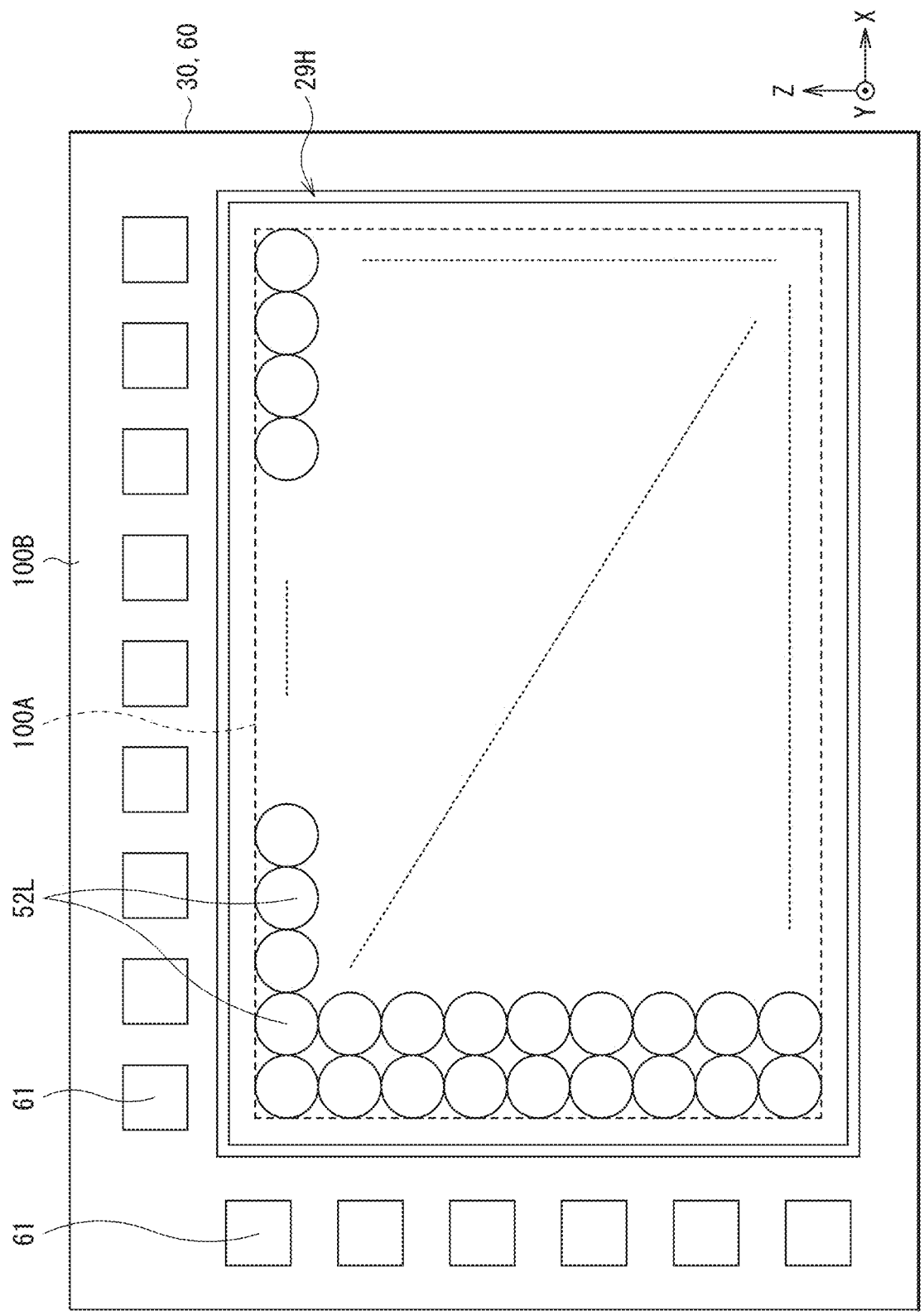
[ FIG. 4 ]

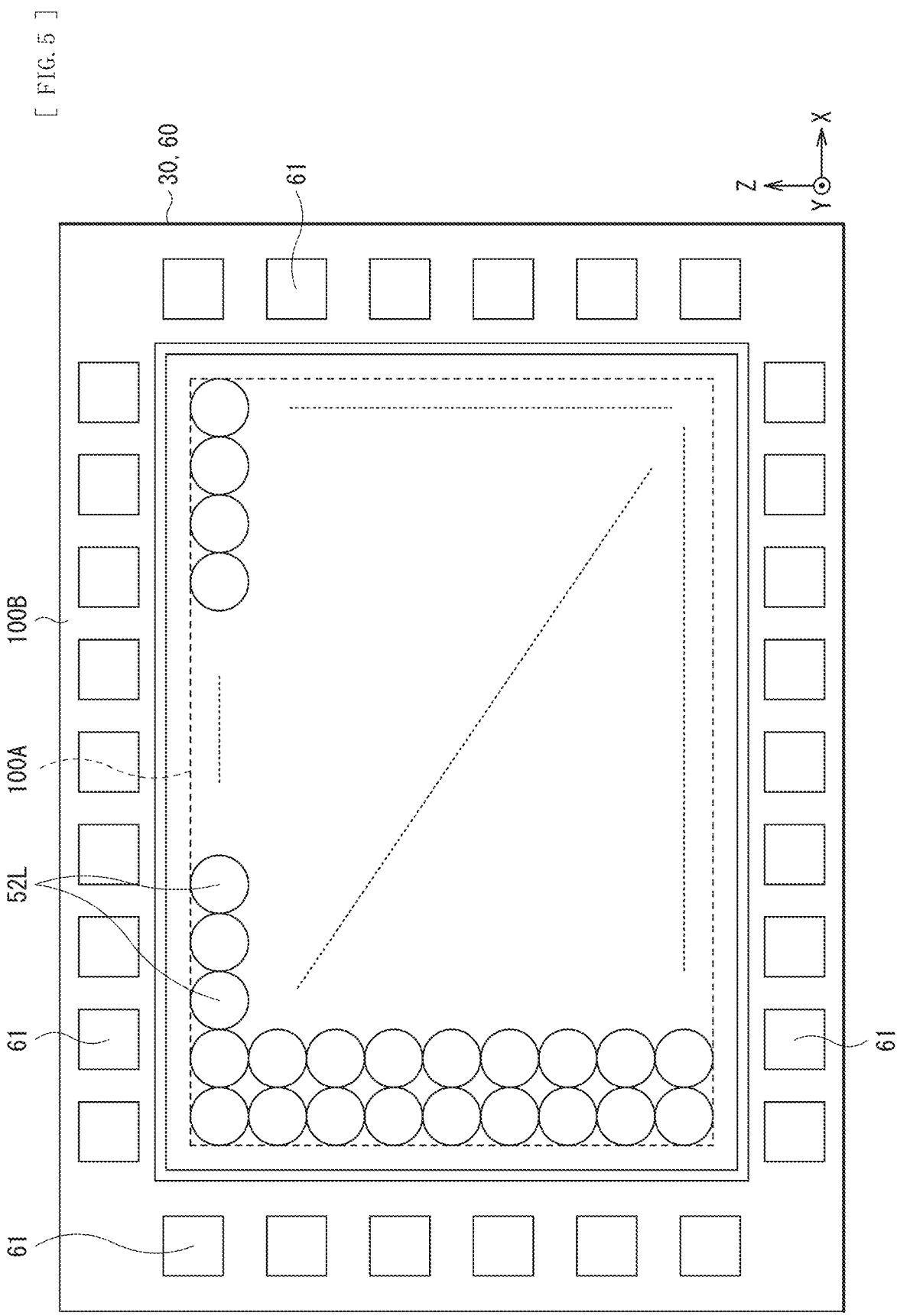
[FIG. 5]

[FIG. 6]
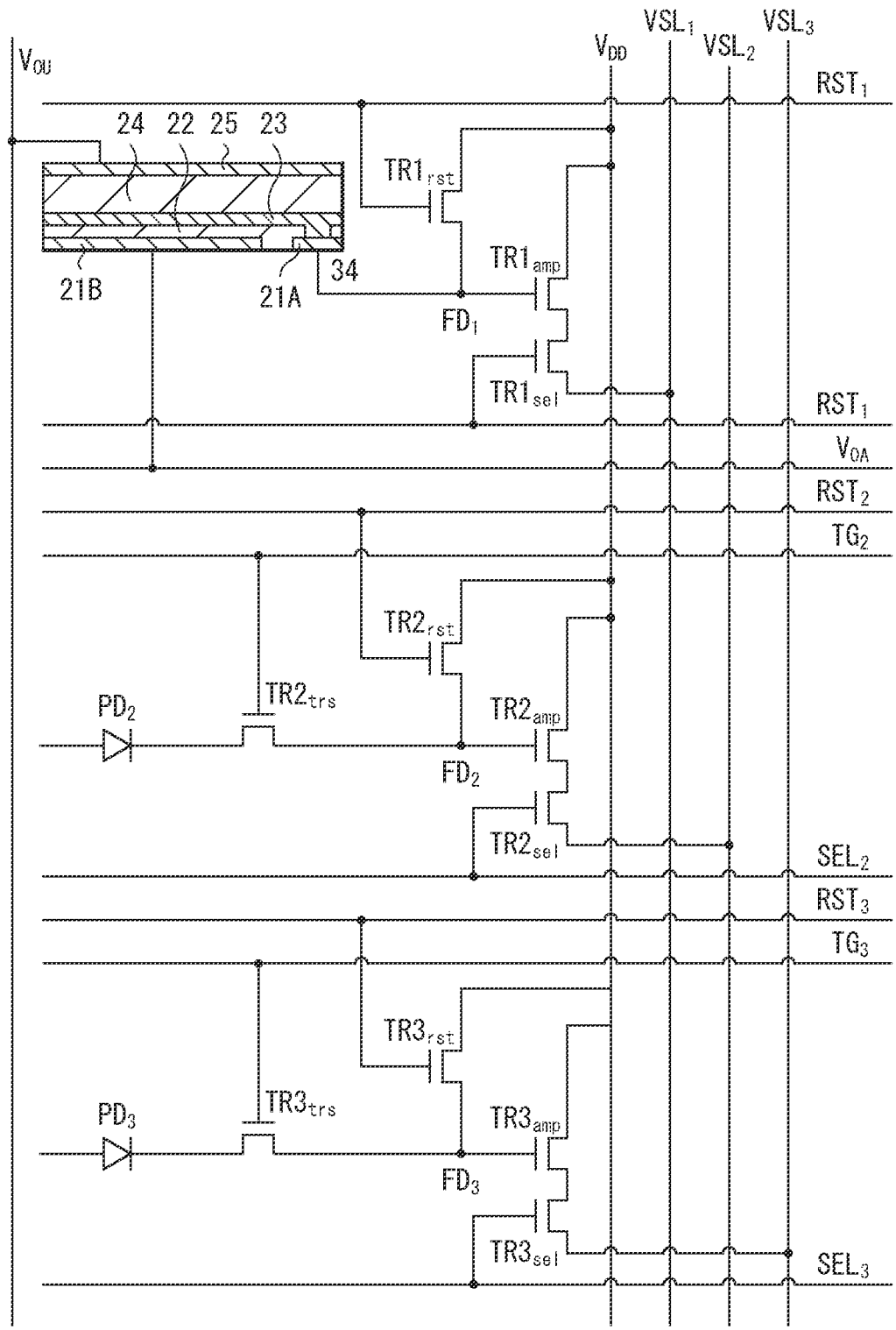

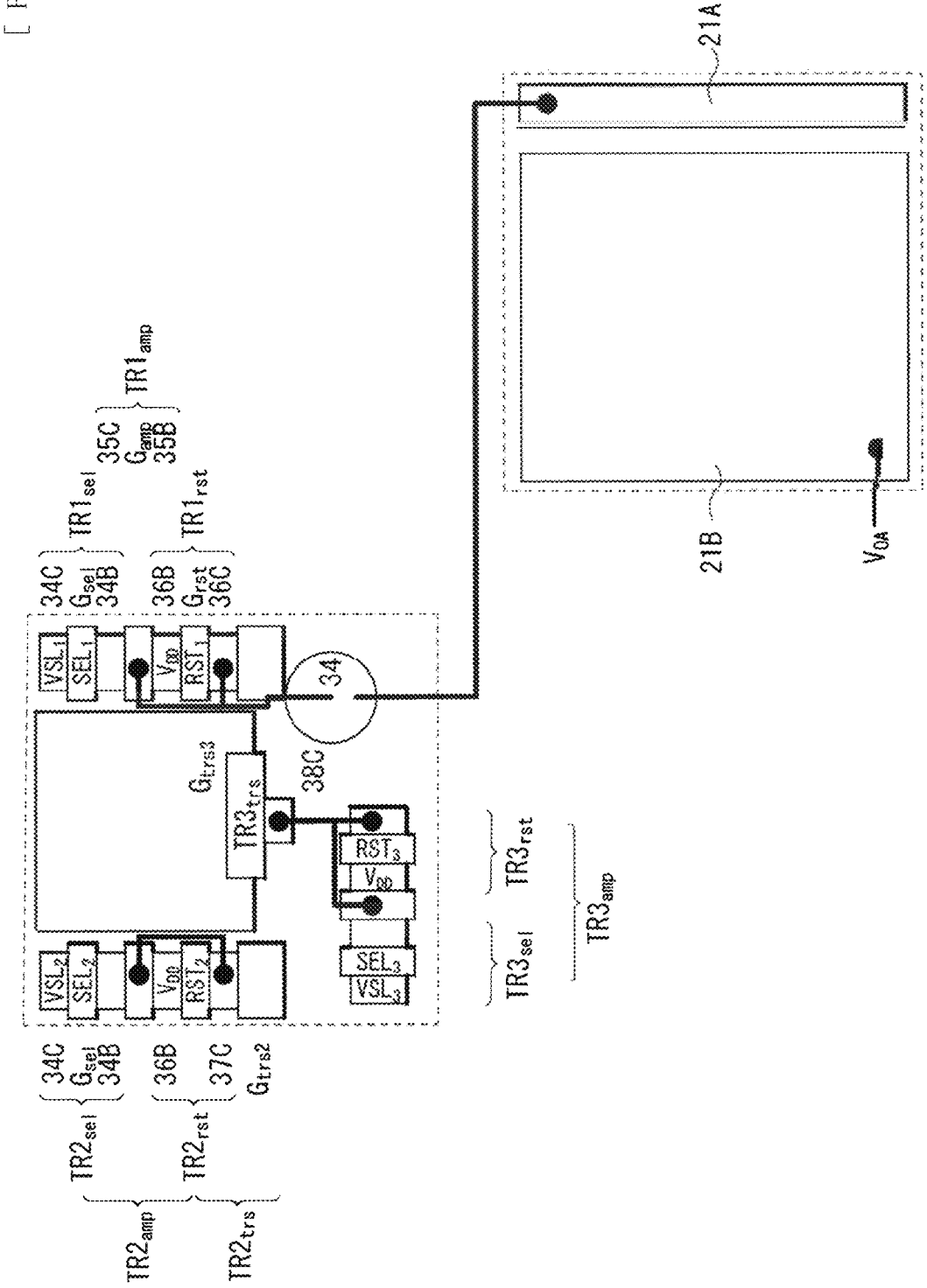
[FIG. 7]

[FIG. 8A]
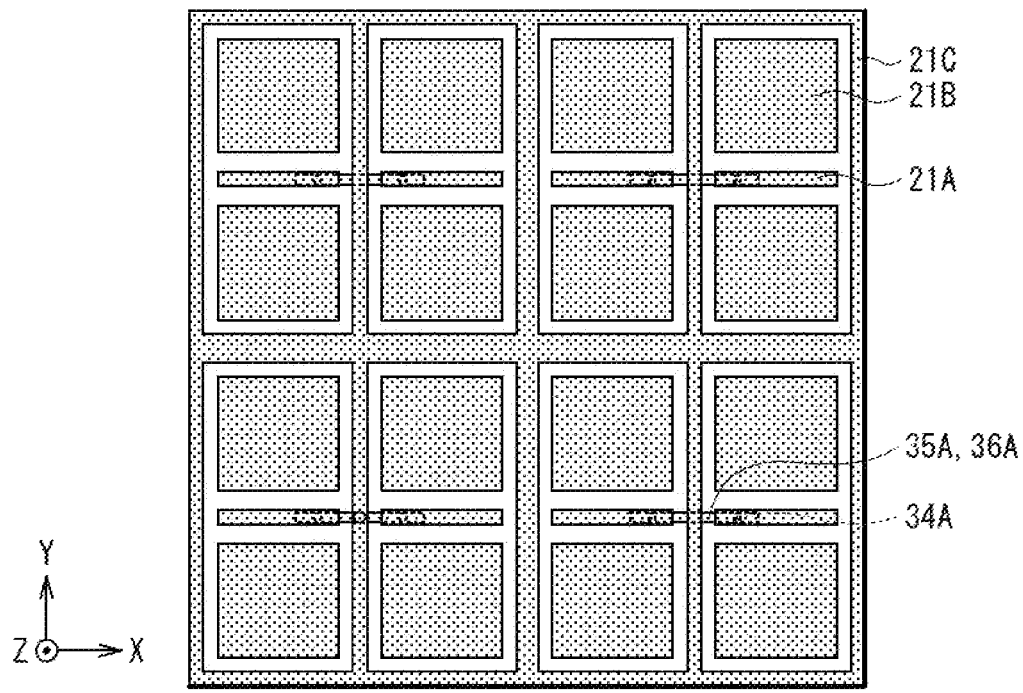
[FIG. 8B]
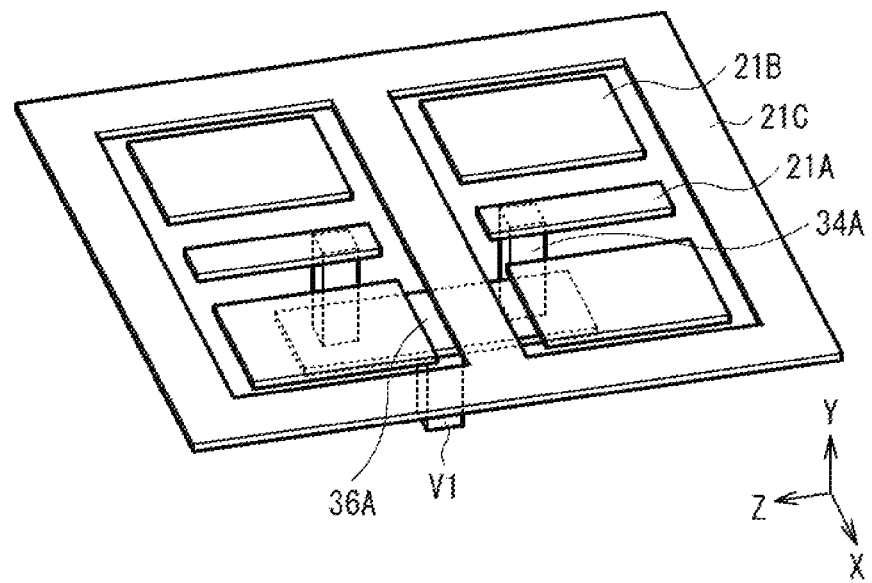

[ FIG. 9A ]
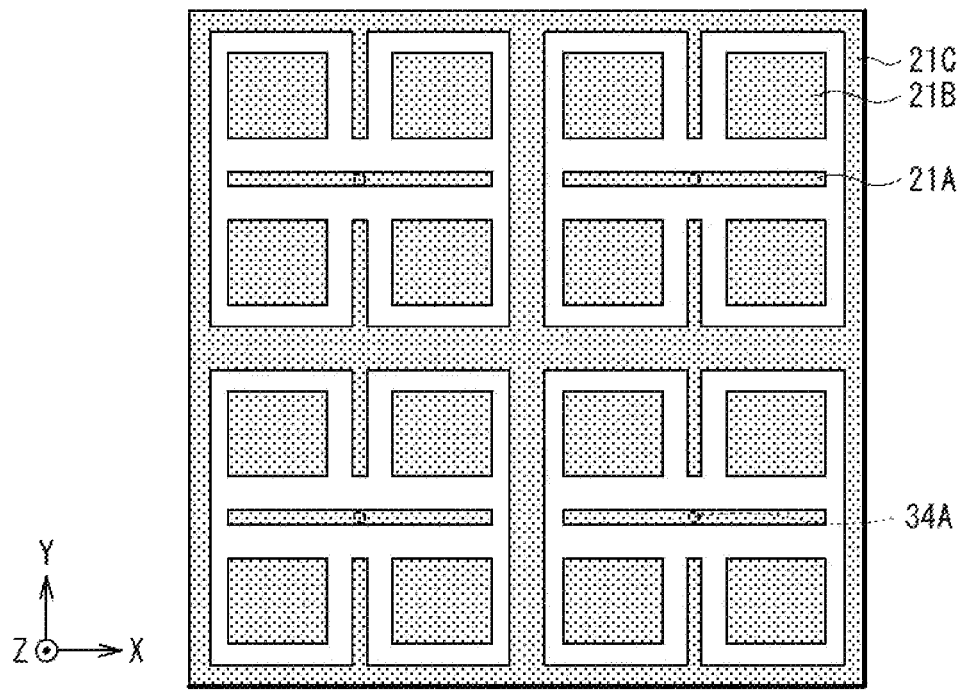
[ FIG. 9B ]
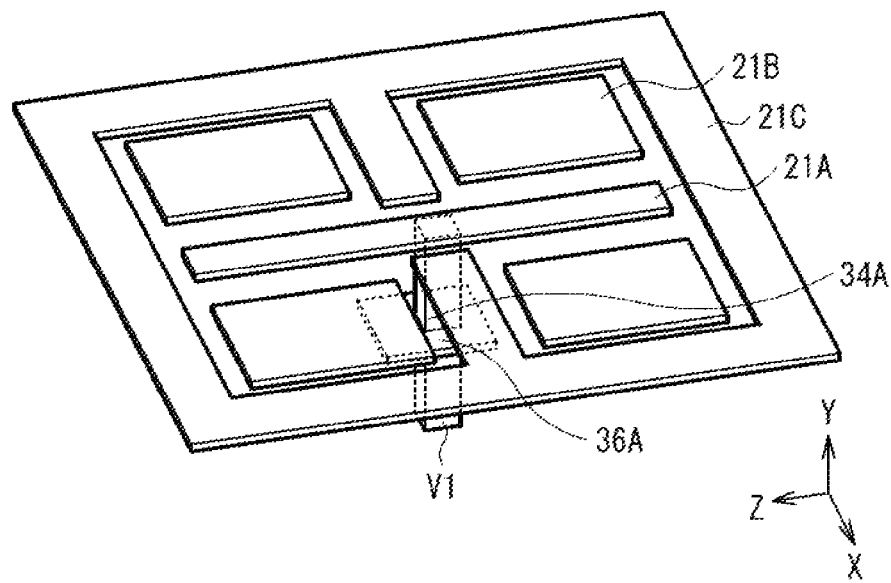

[FIG. 10]
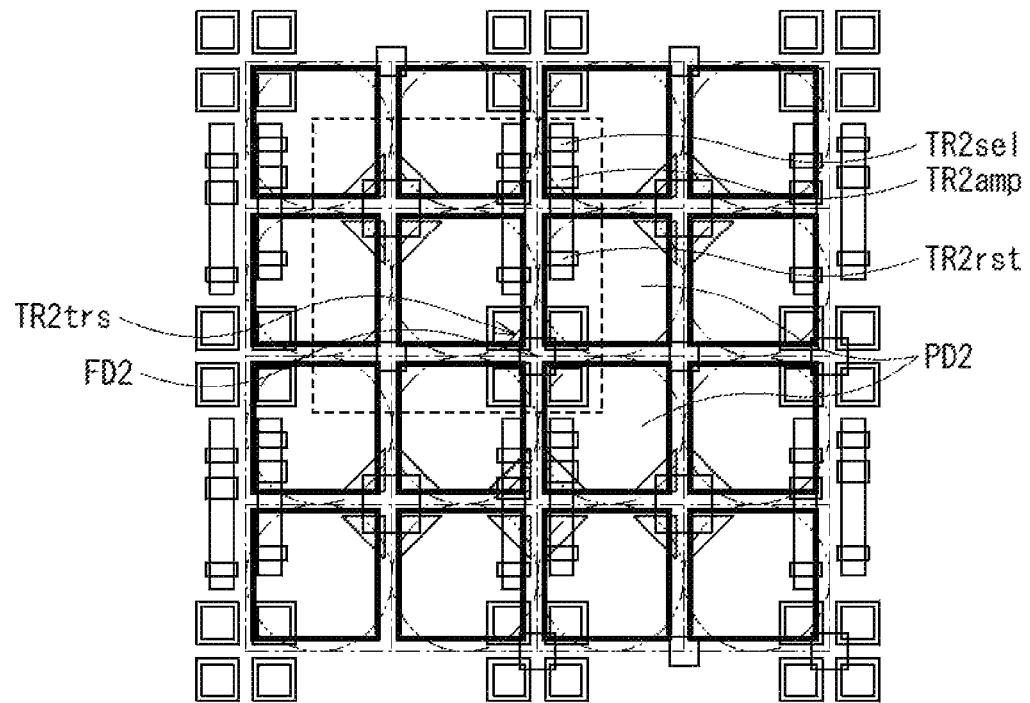
[FIG. 11]
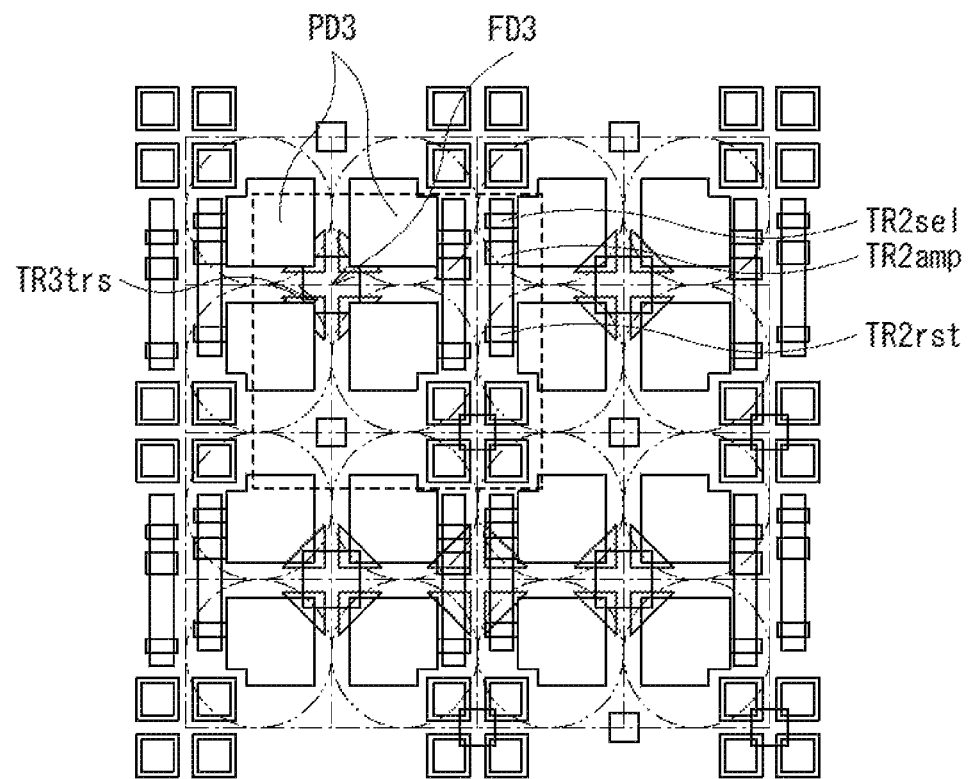

[ FIG. 12 ]
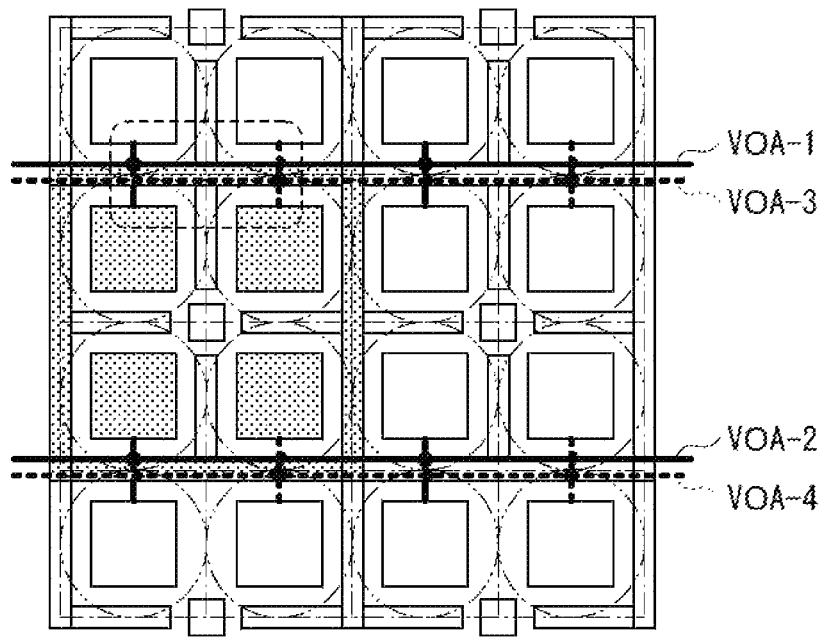
[ FIG. 13 ]
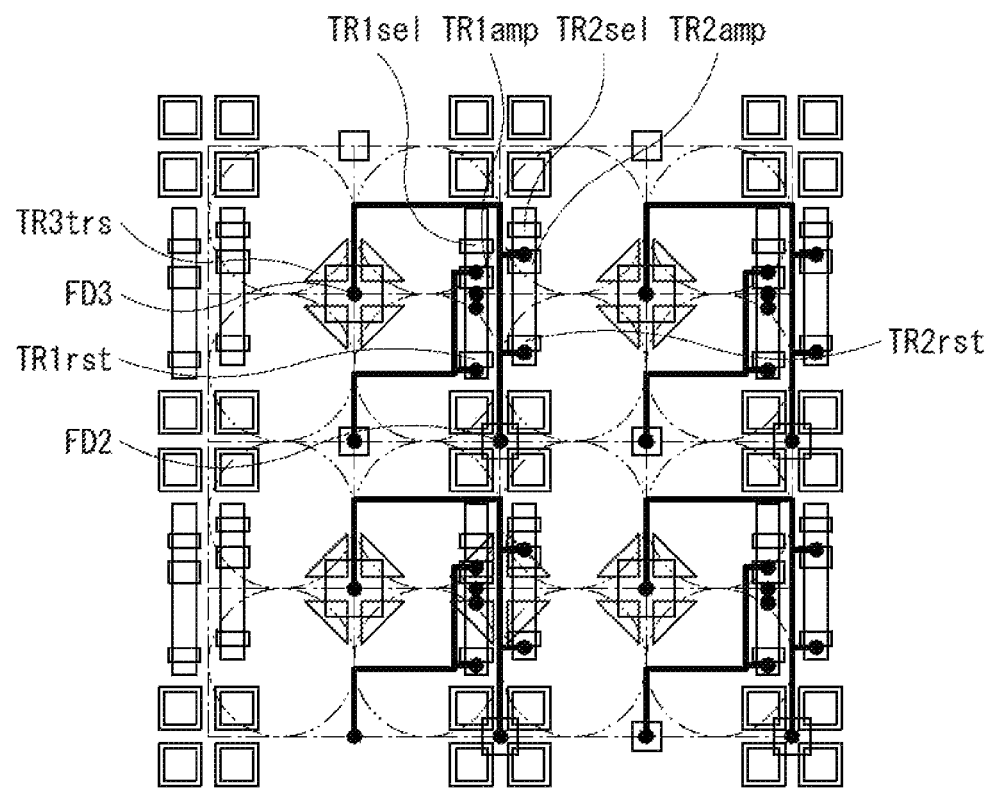

[ FIG. 14 ]
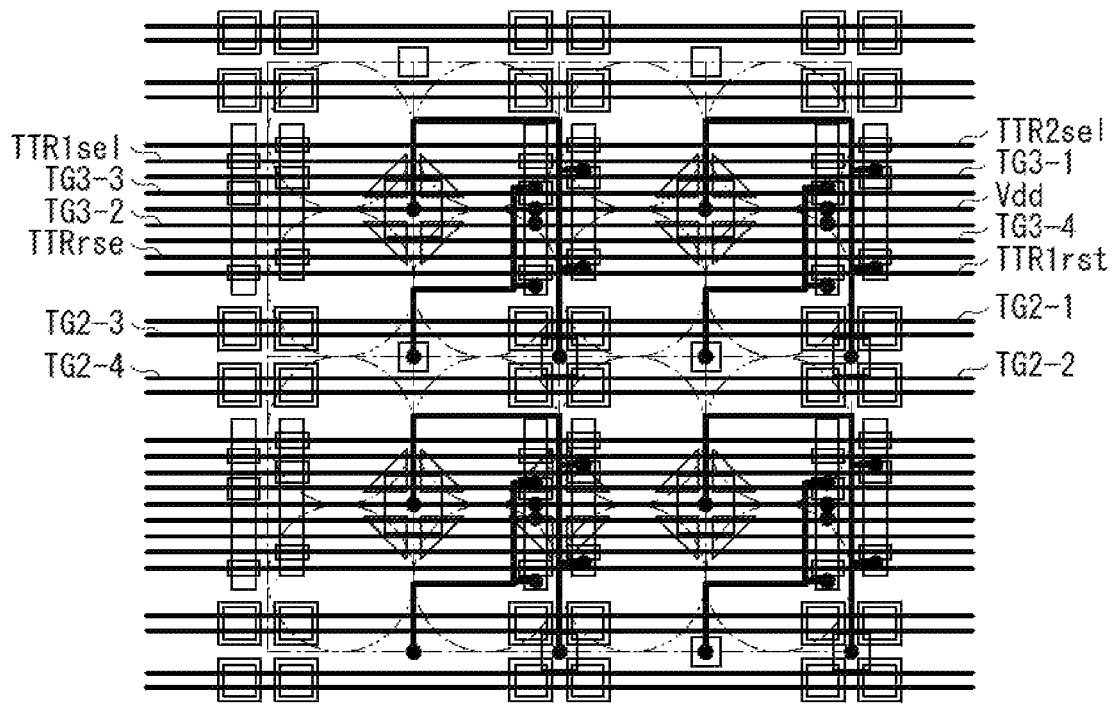
[ FIG. 15 ]
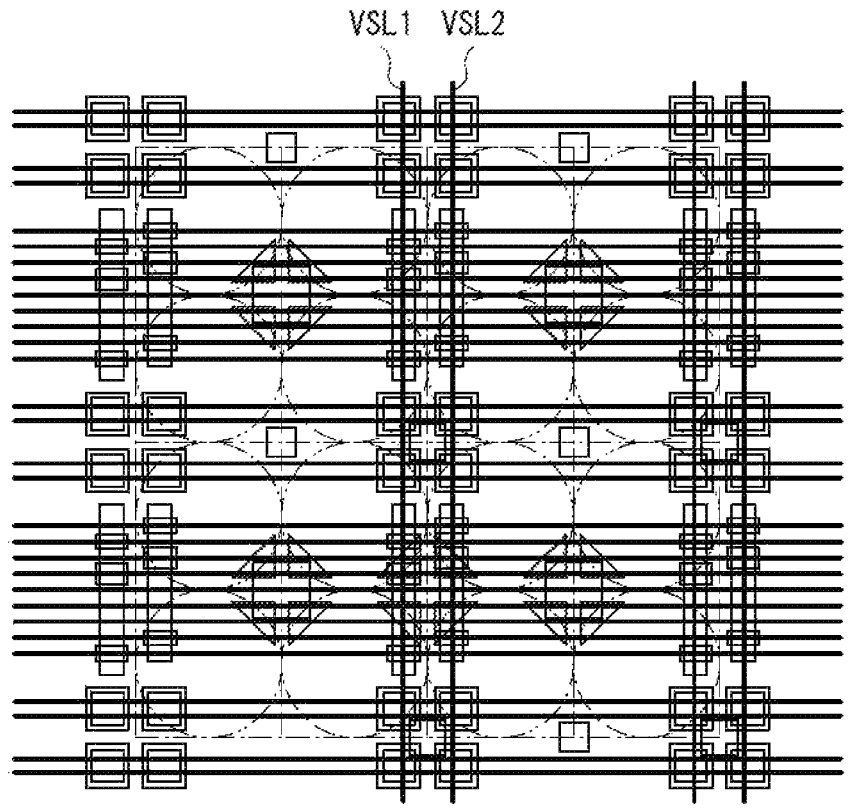

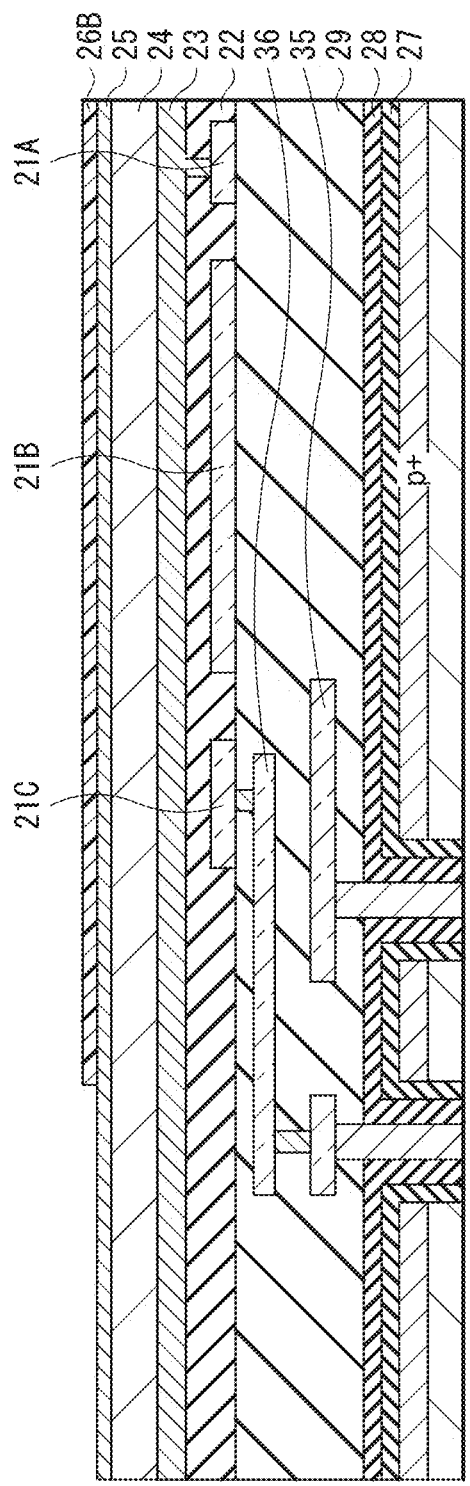
[ FIG. 16A ]

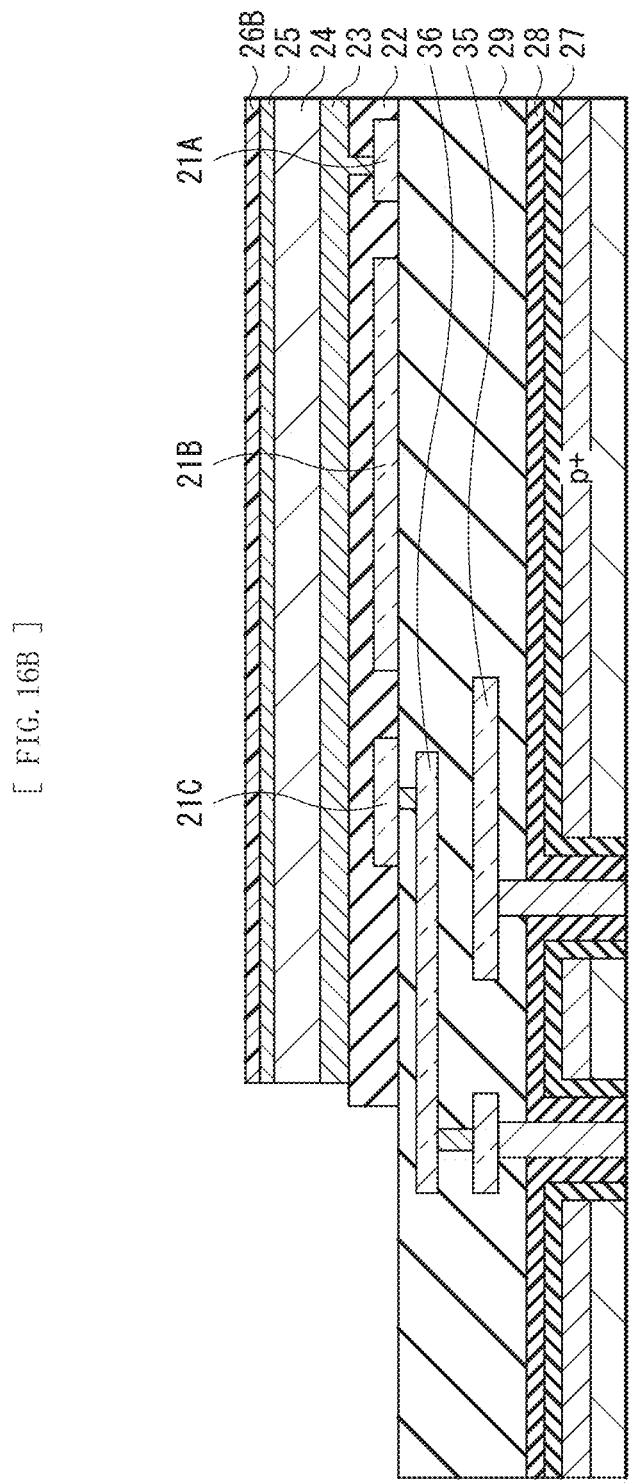
[FIG. 16B]

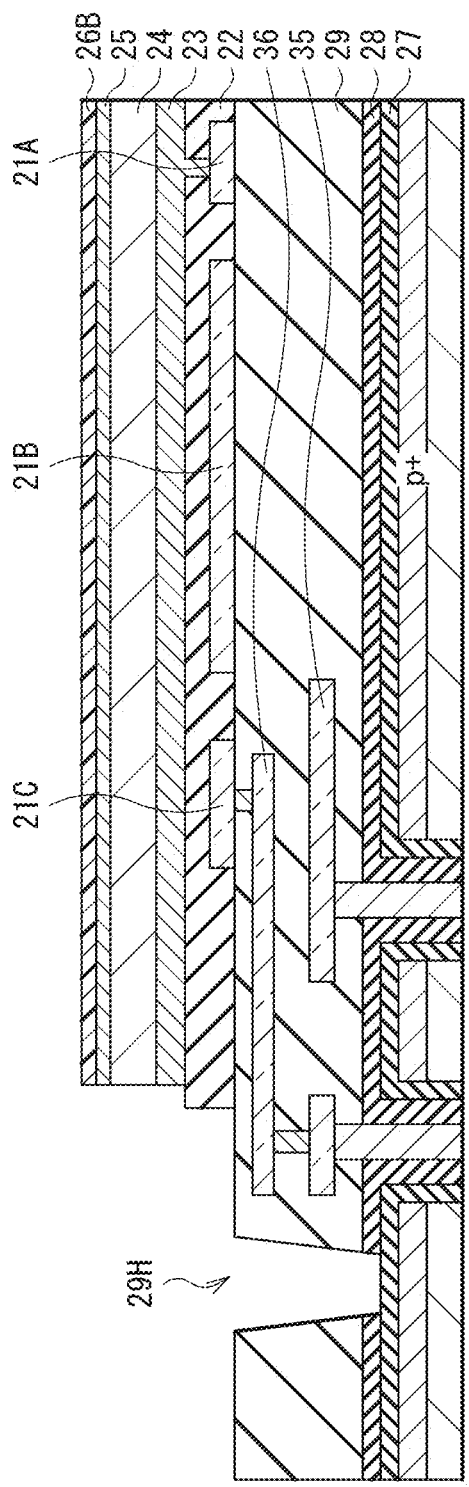
[ FIG. 16C ]

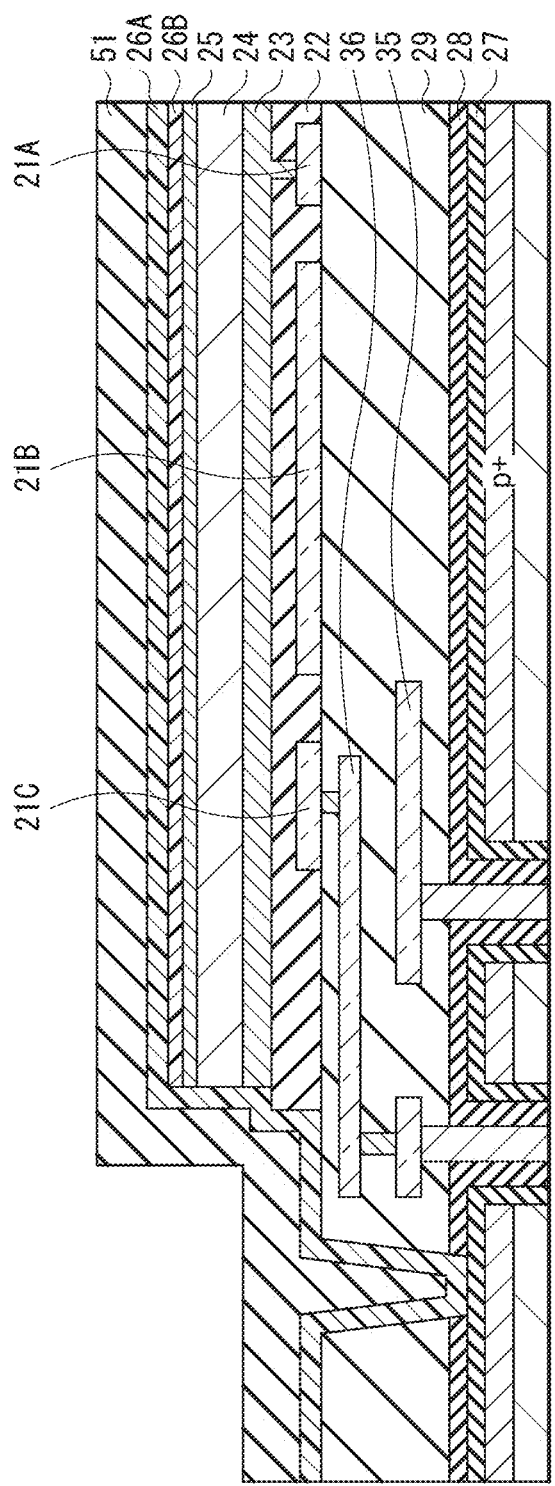
[ FIG. 16D ]

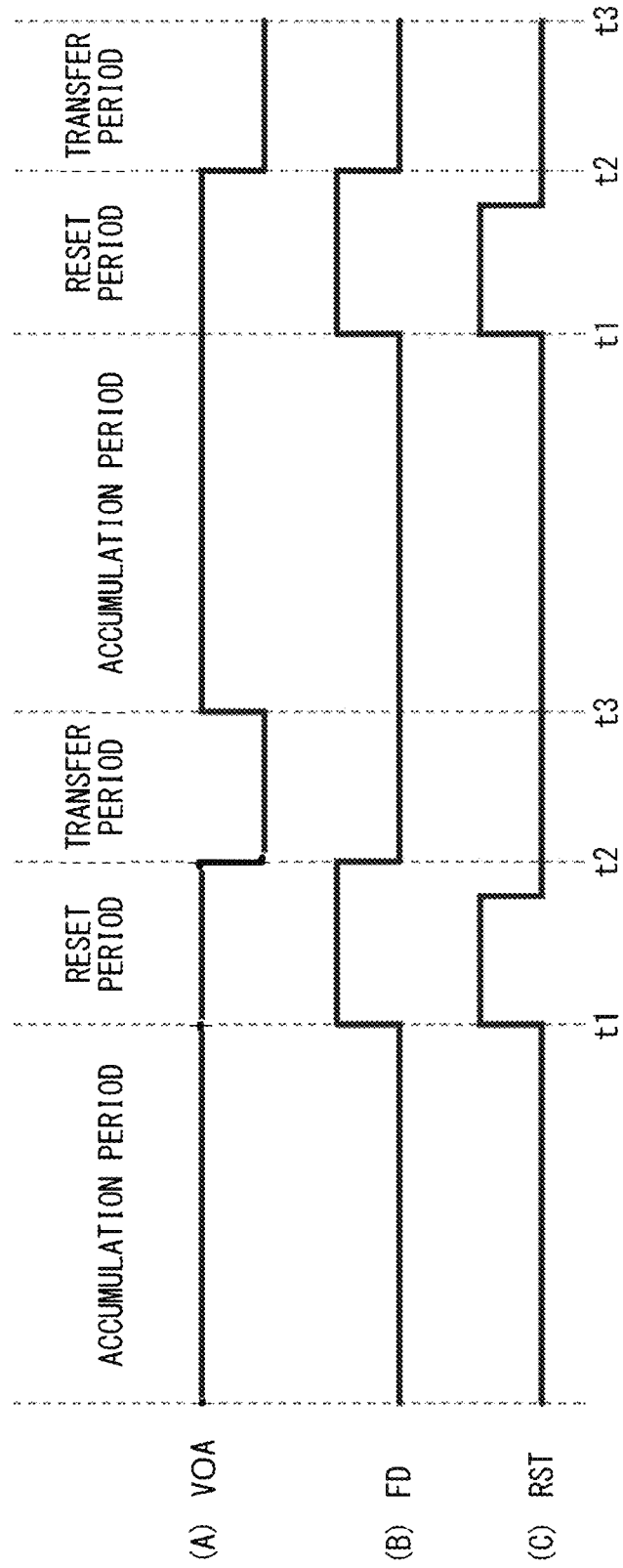

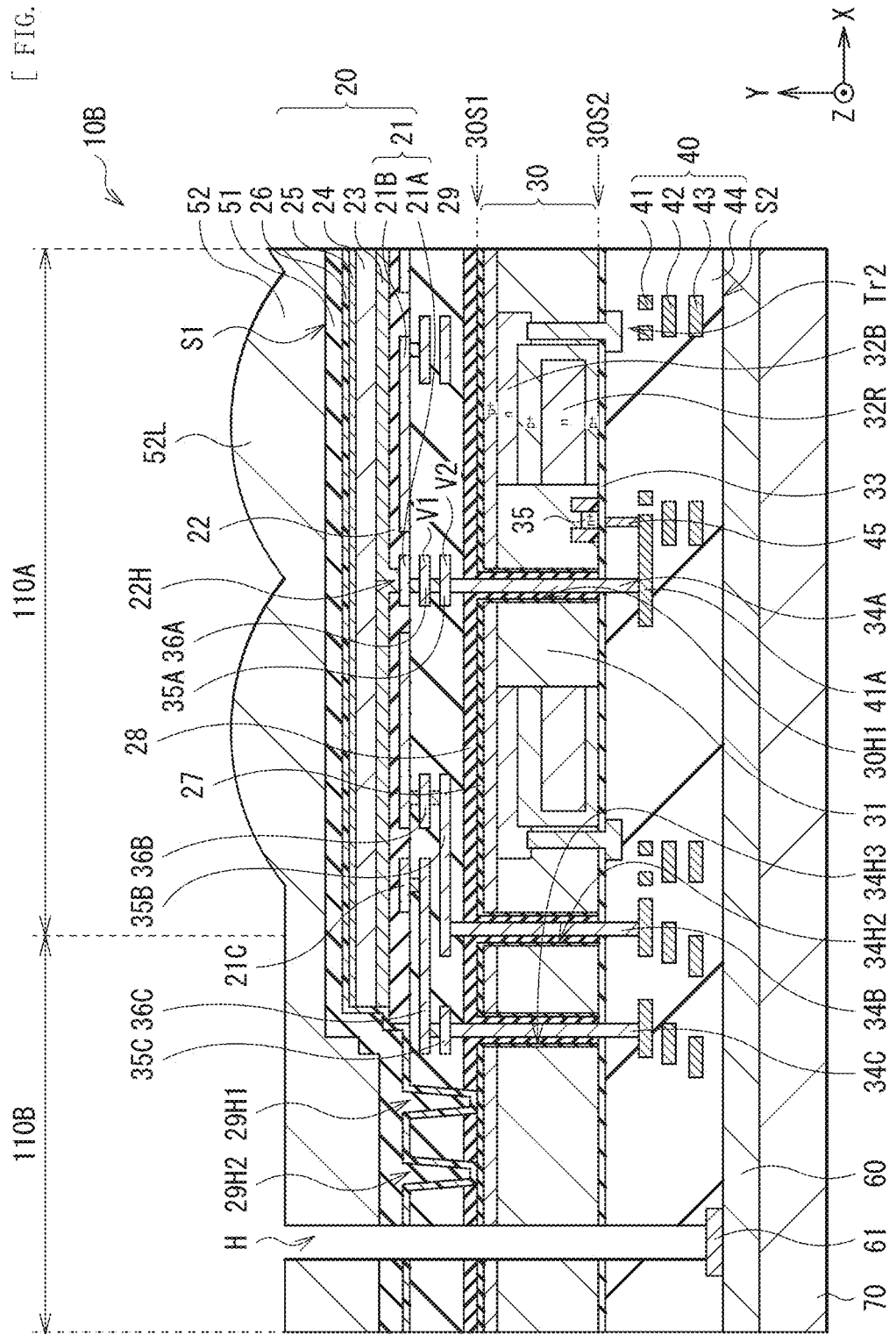
[FIG. 18]

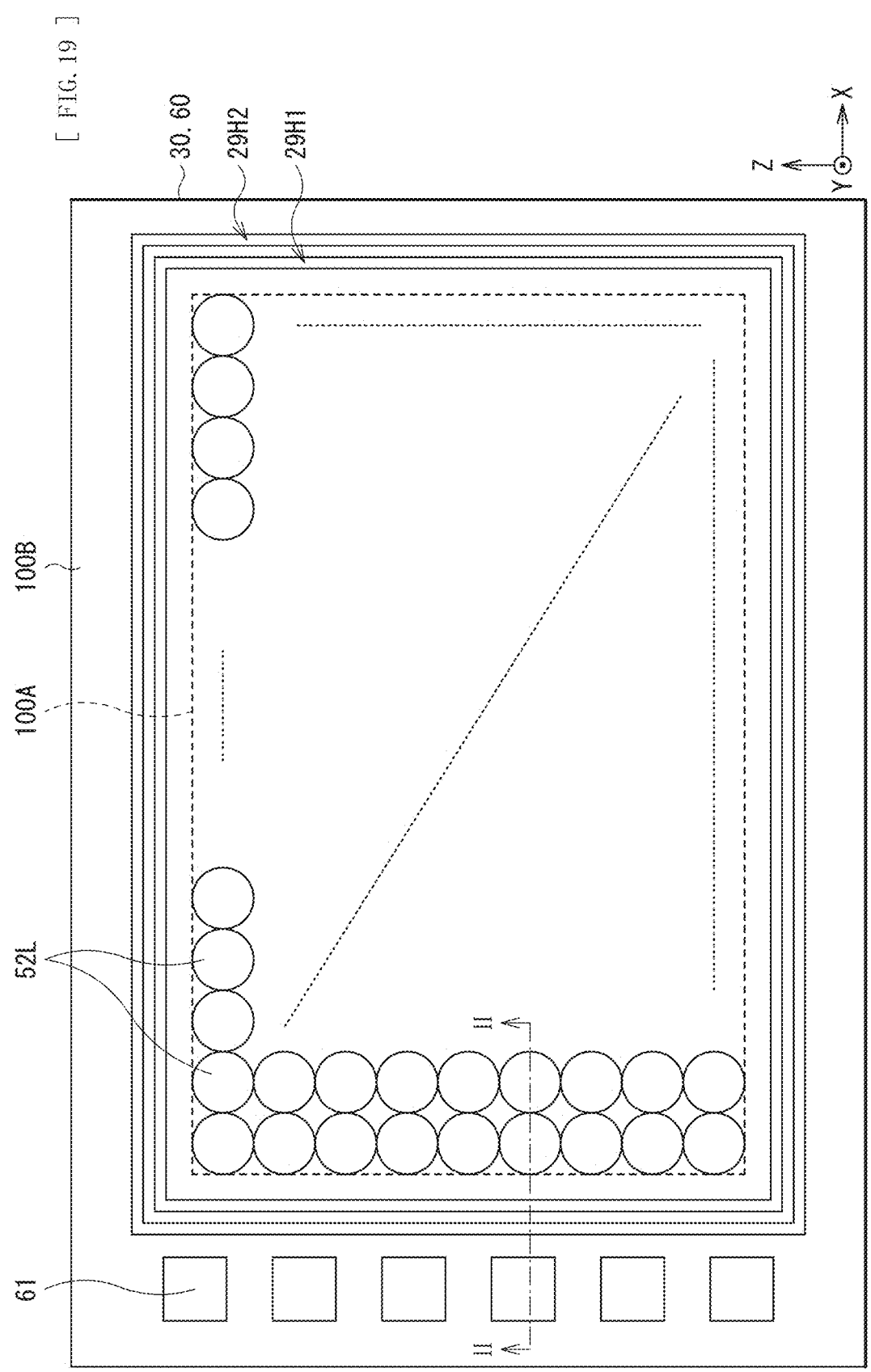

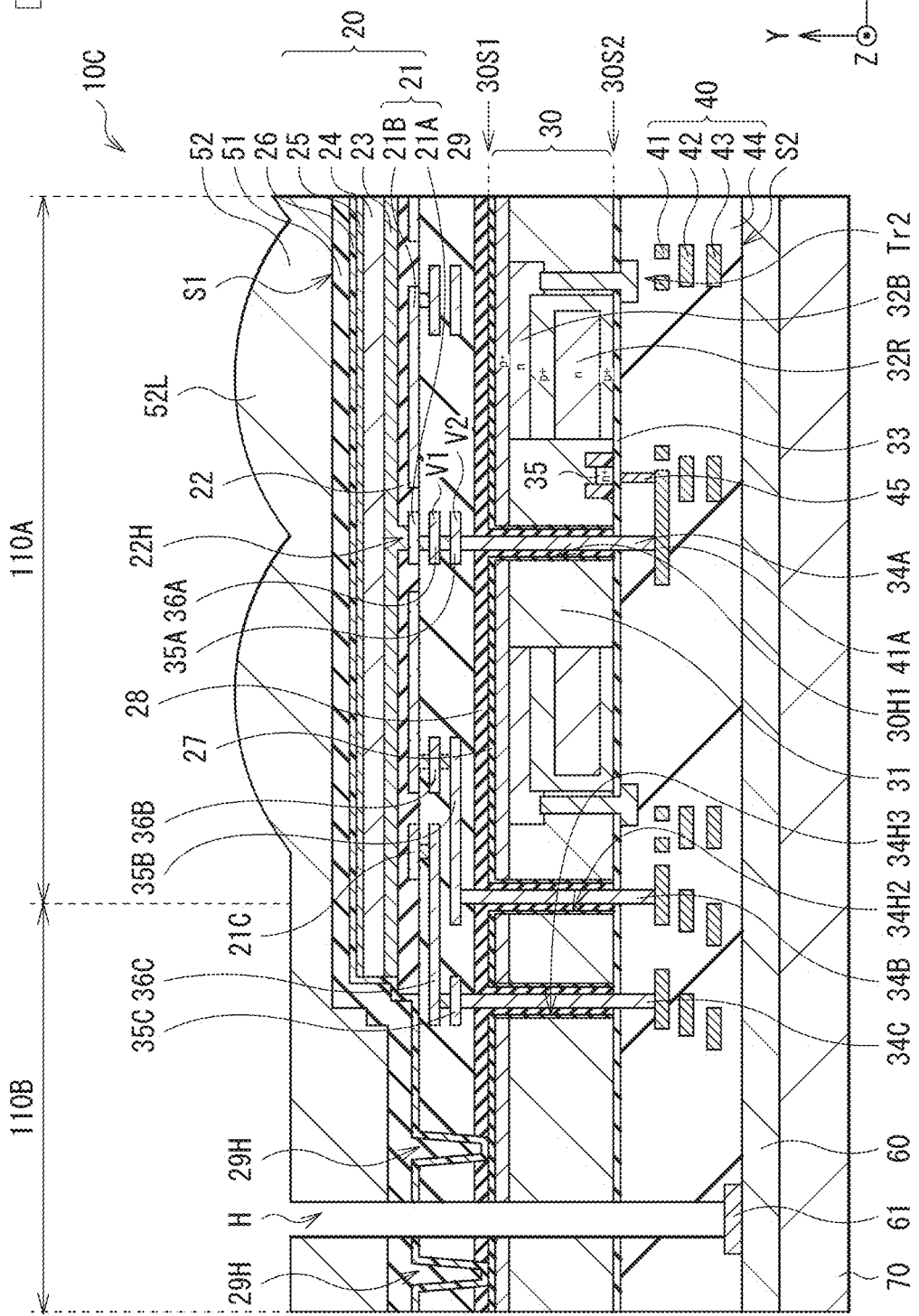
[FIG. 20]

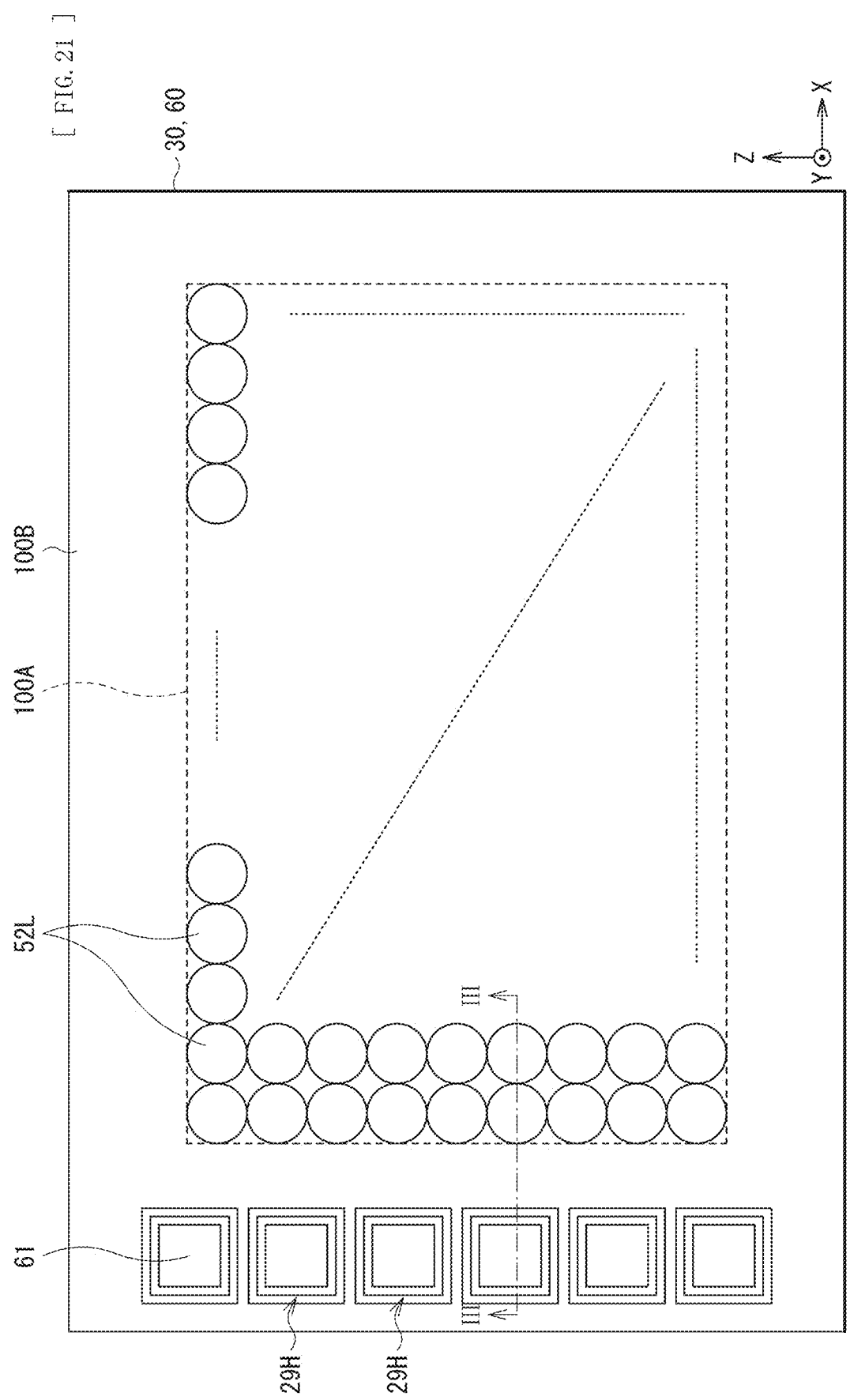
[FIG. 21]

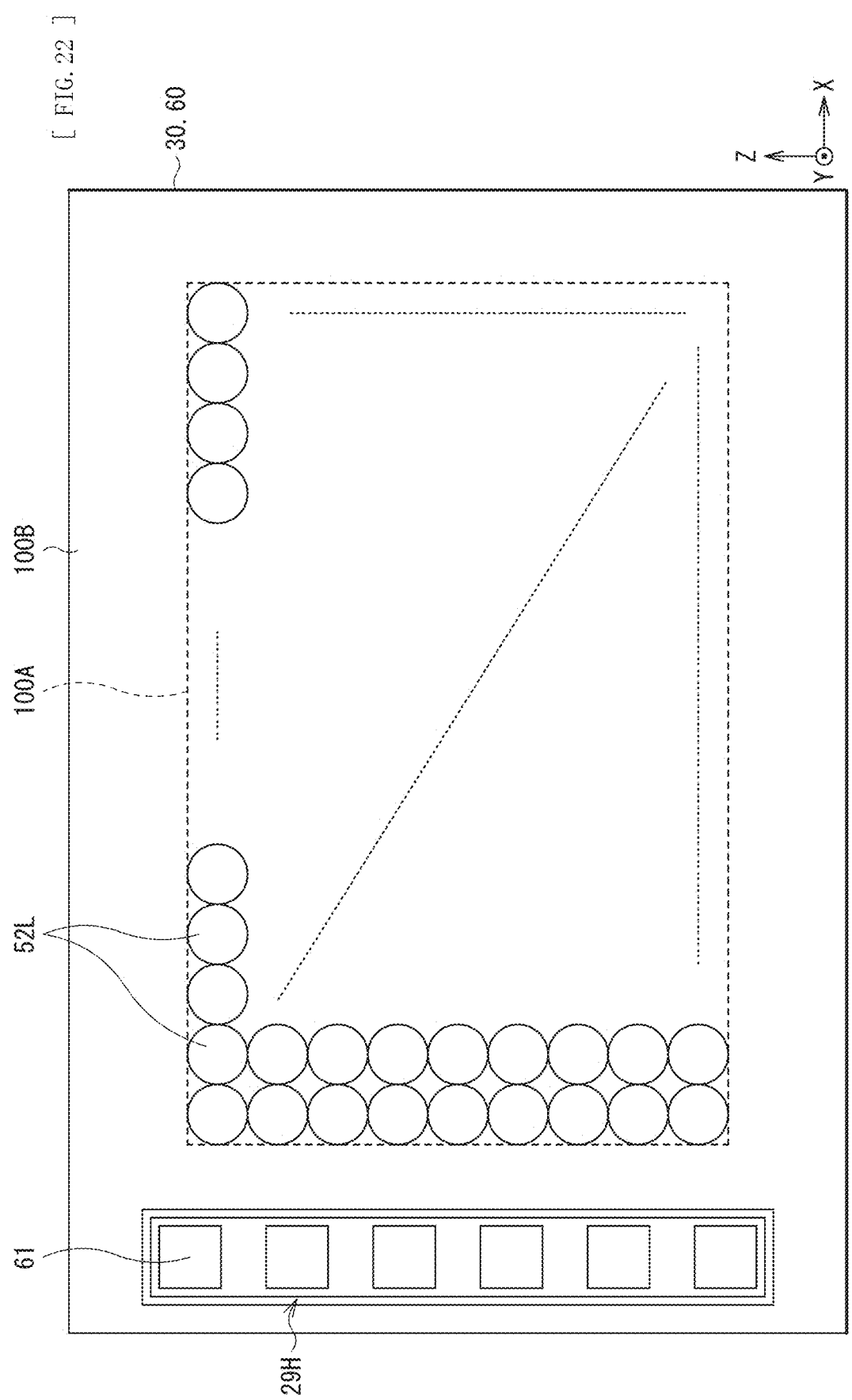
[FIG. 22]

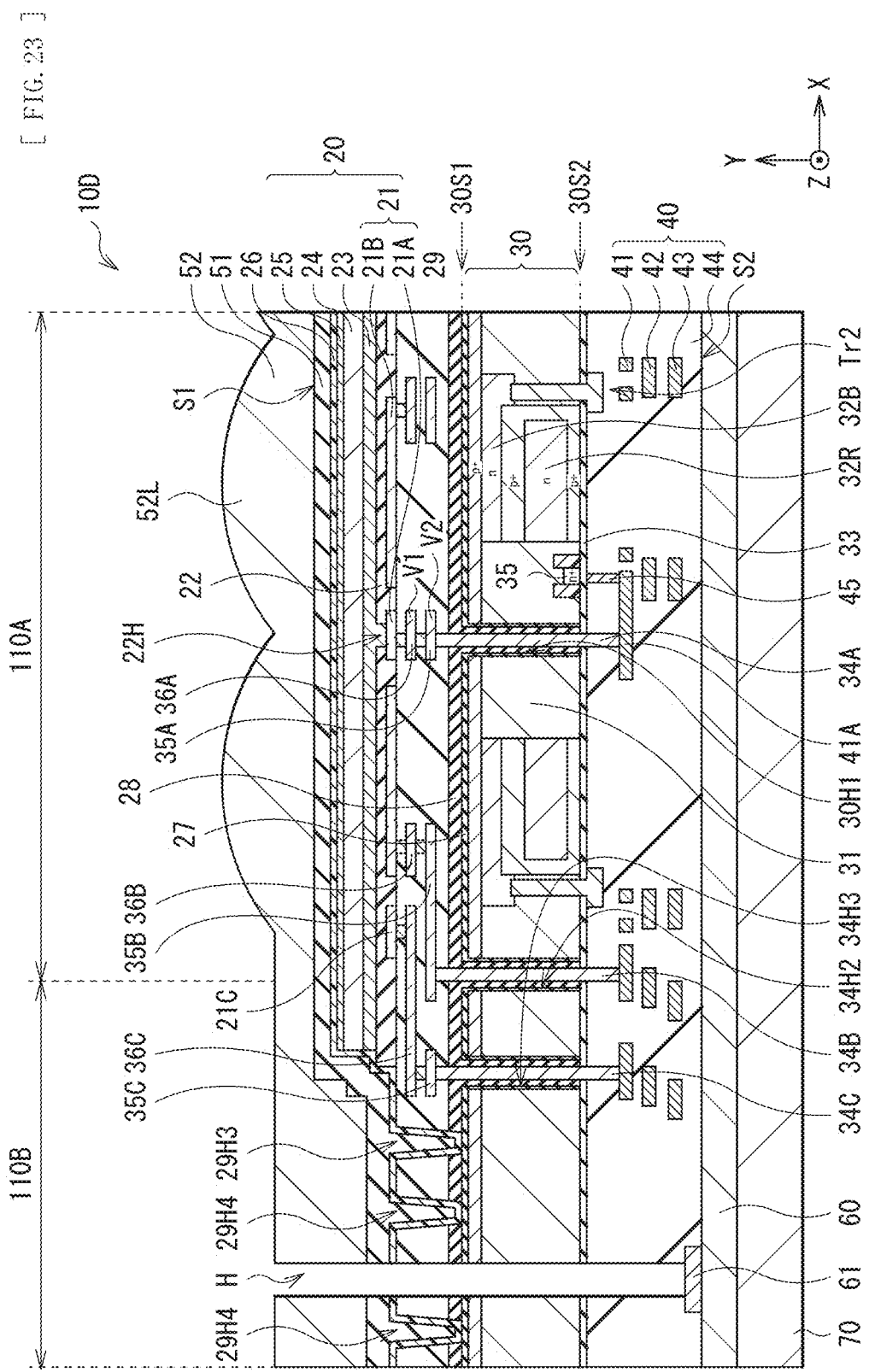
[FIG. 23]

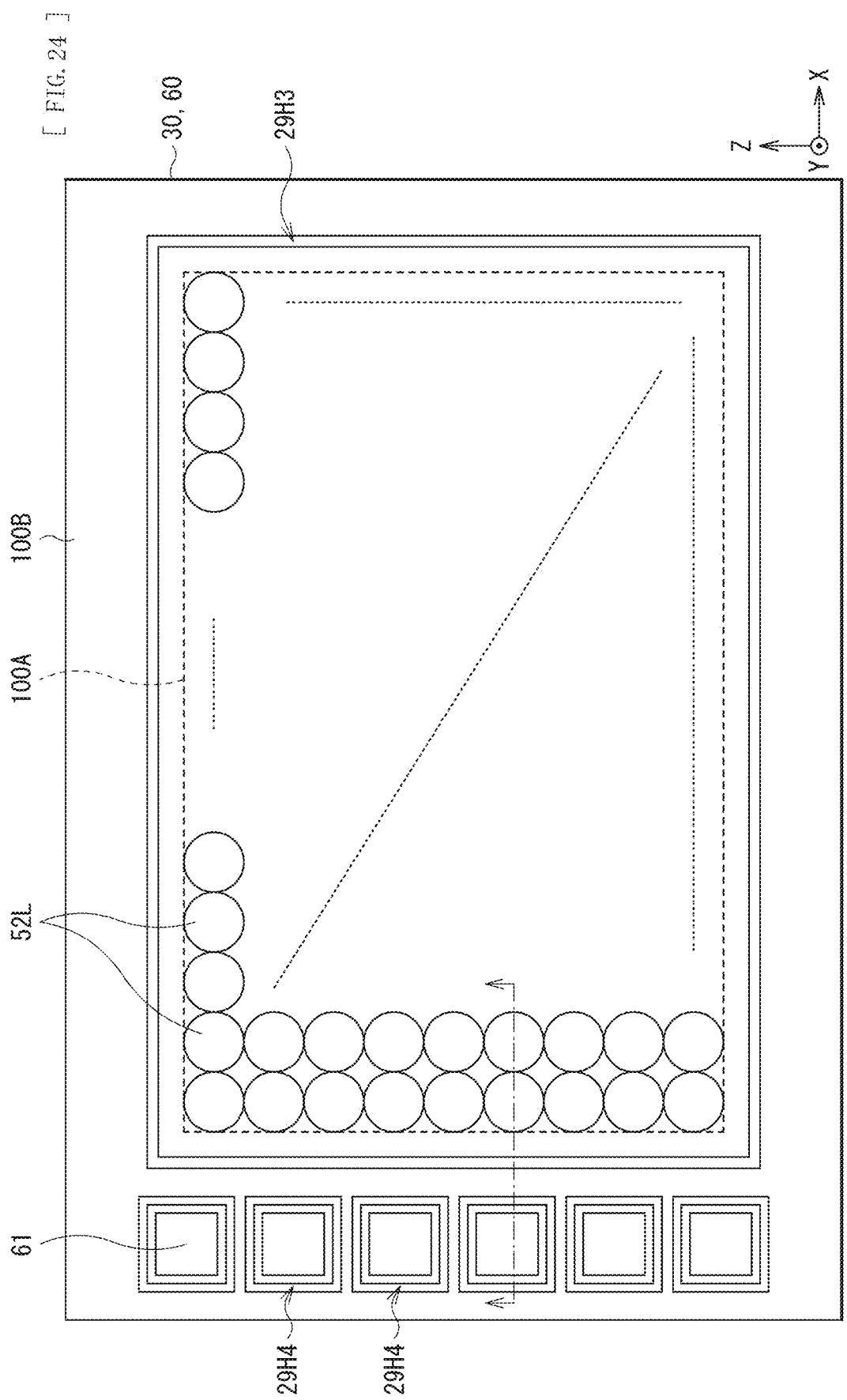

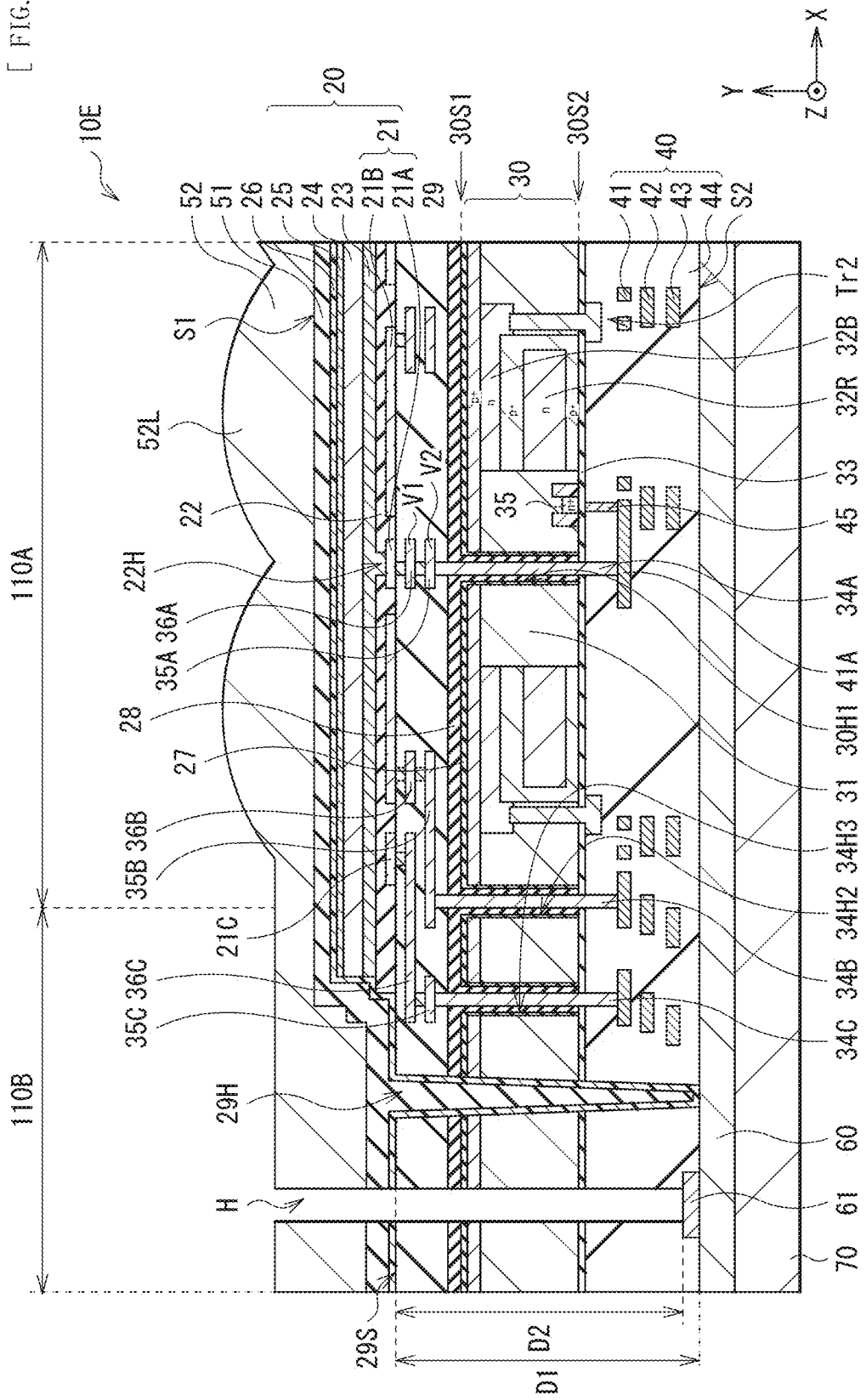
[FIG. 25]

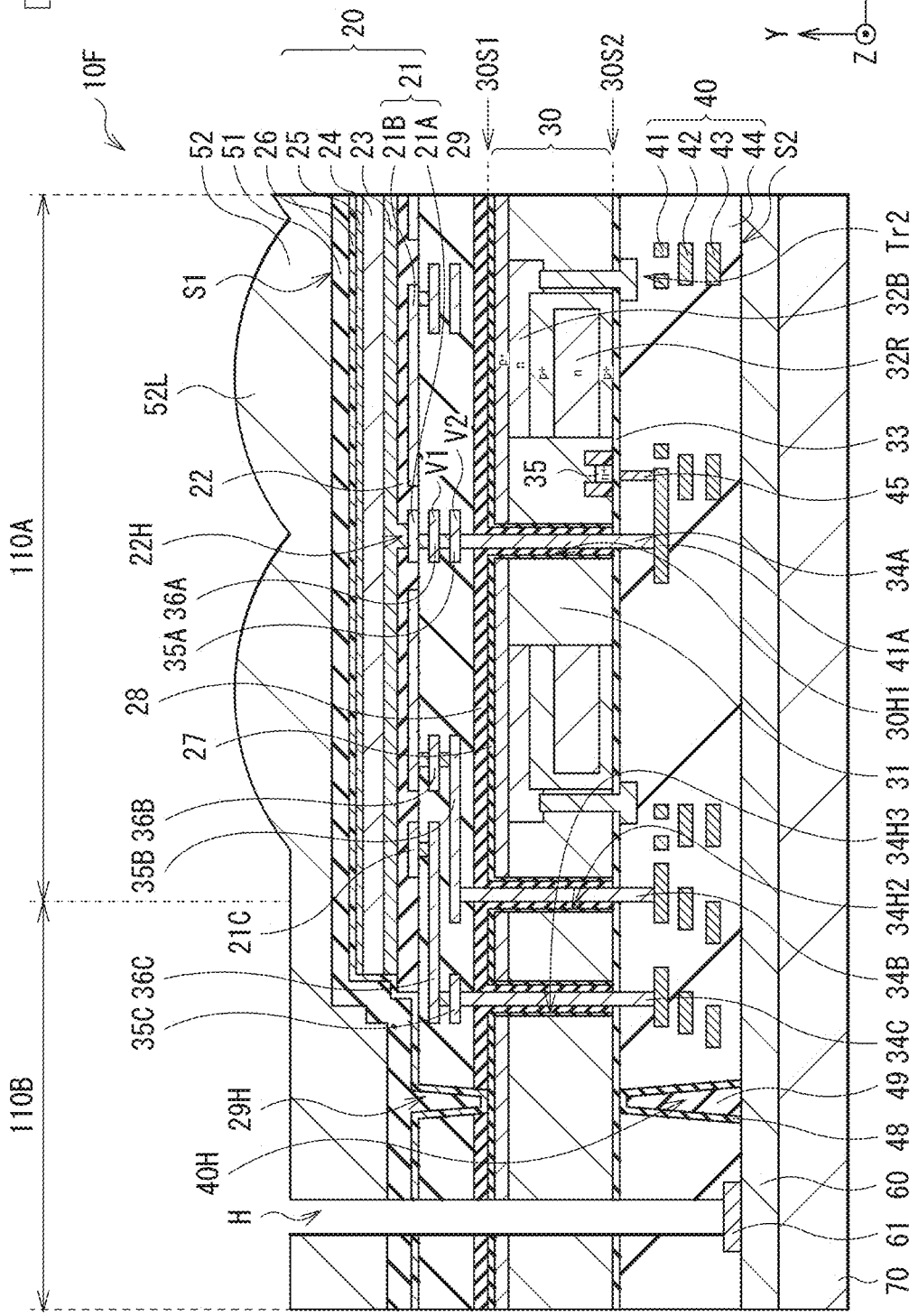
[FIG. 26]

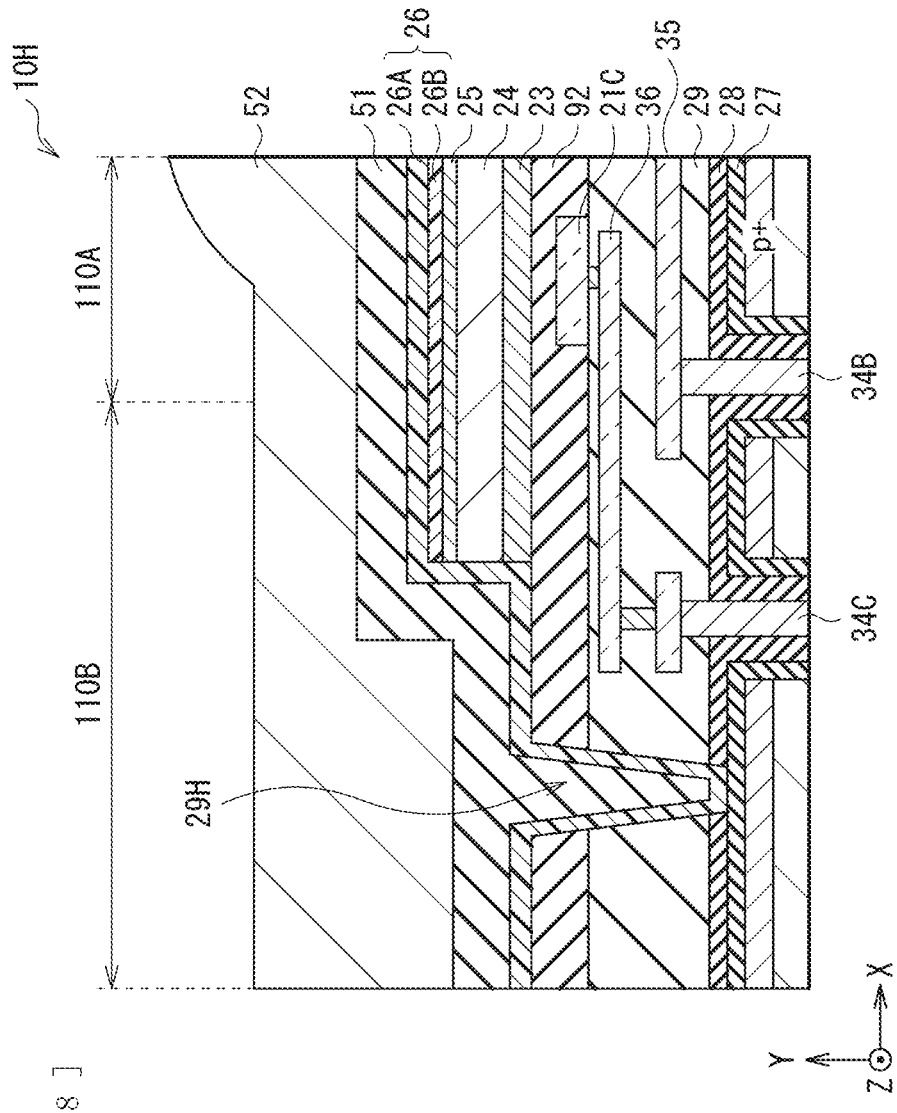
[FIG. 28]

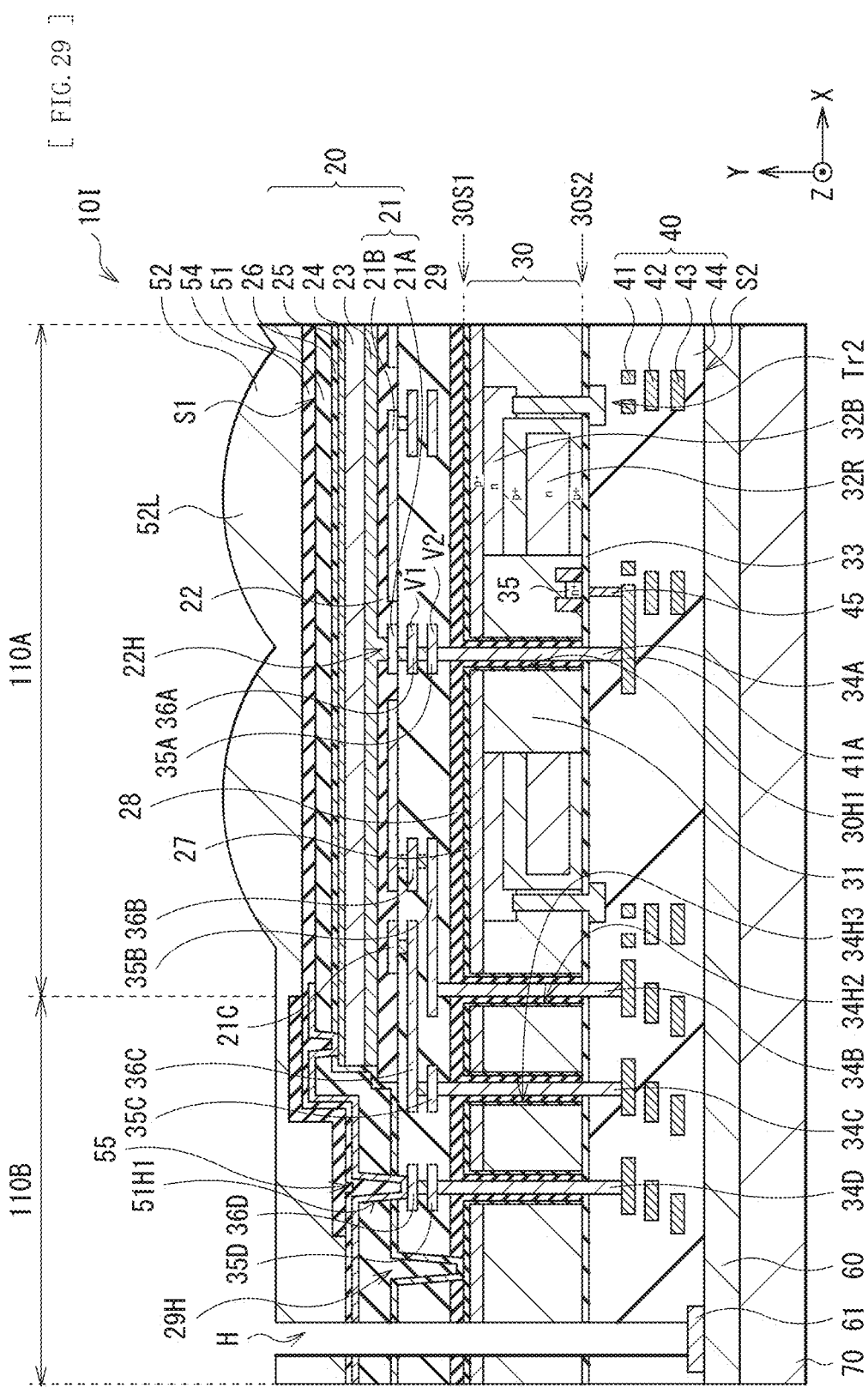

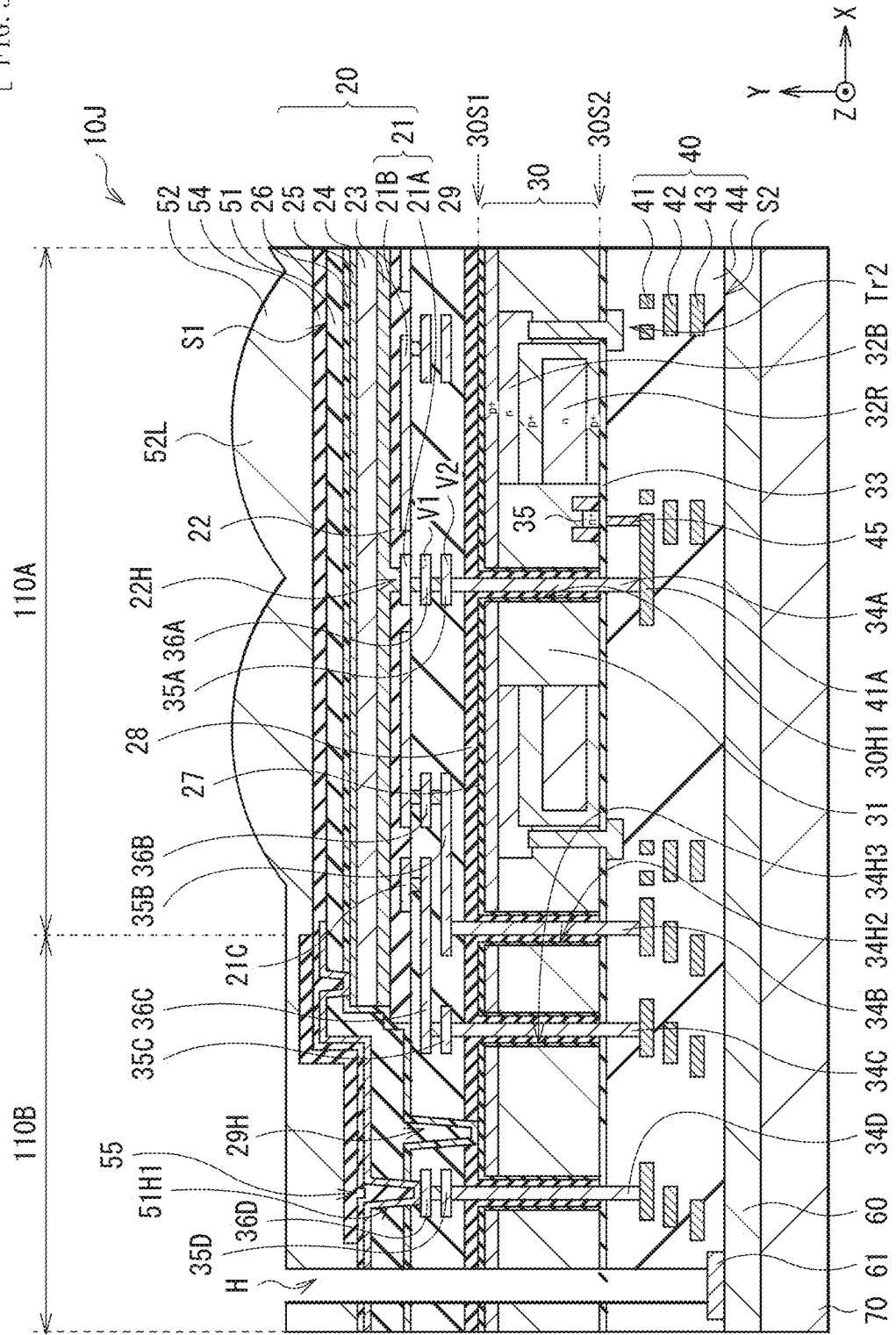
[FIG. 30]

[ FIG. 31 ]
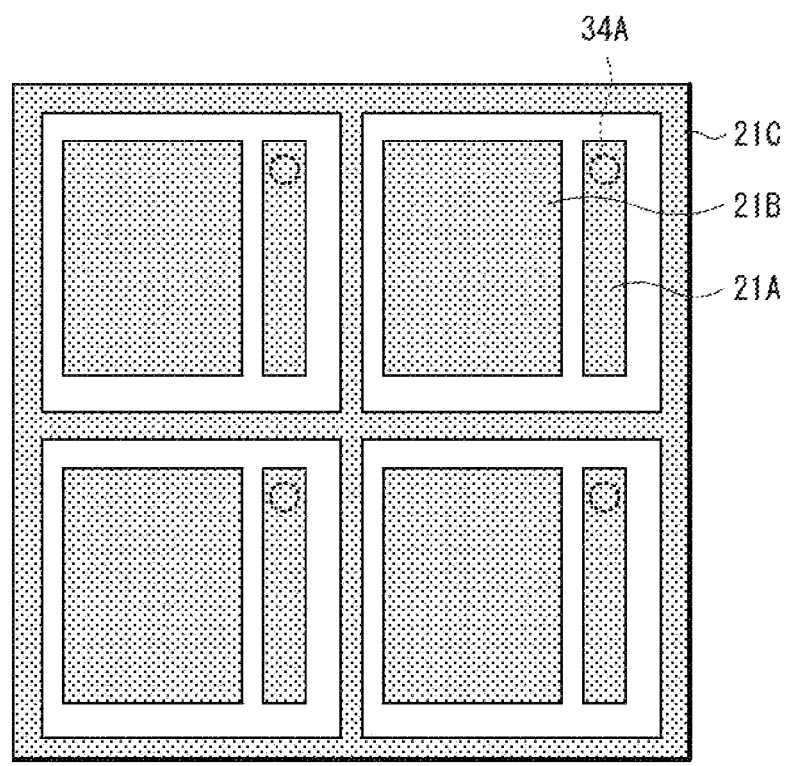

[FIG. 32]
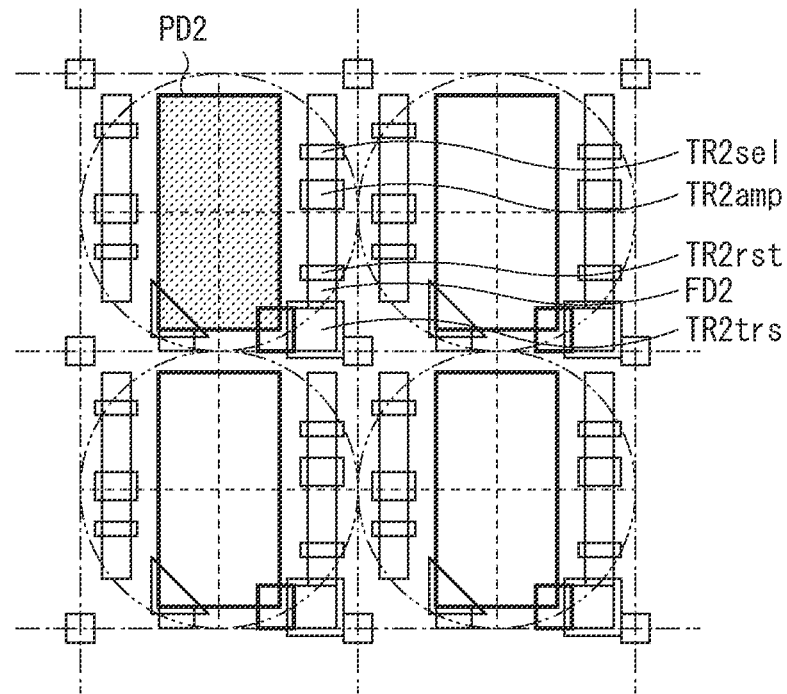
[FIG. 33]
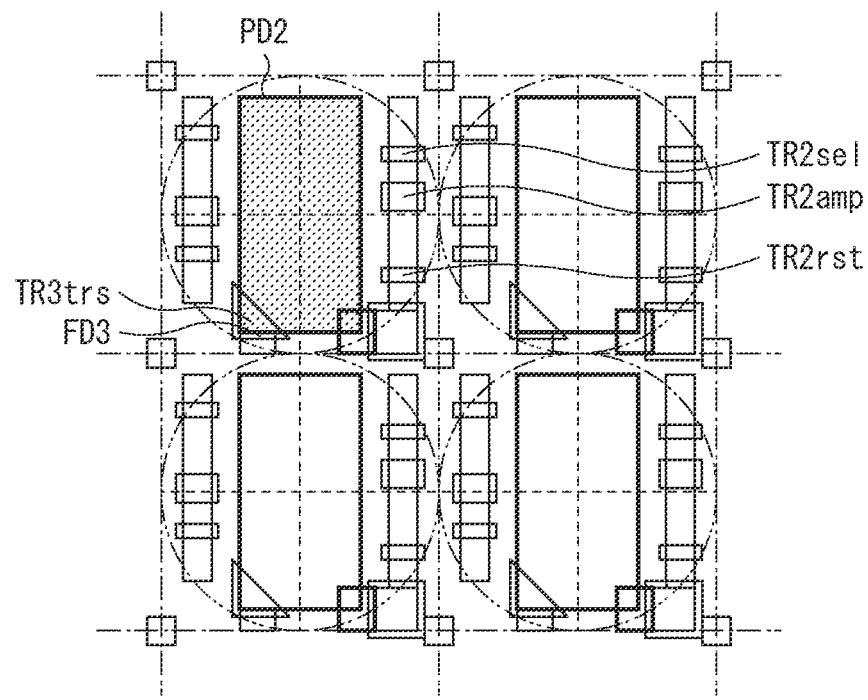

[ FIG. 34 ]
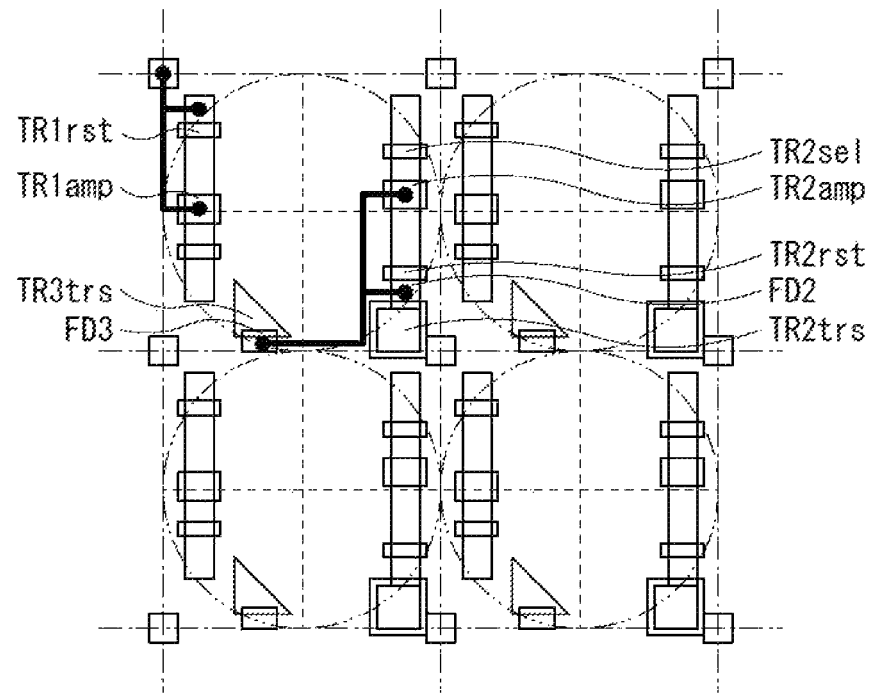
[ FIG. 35 ]
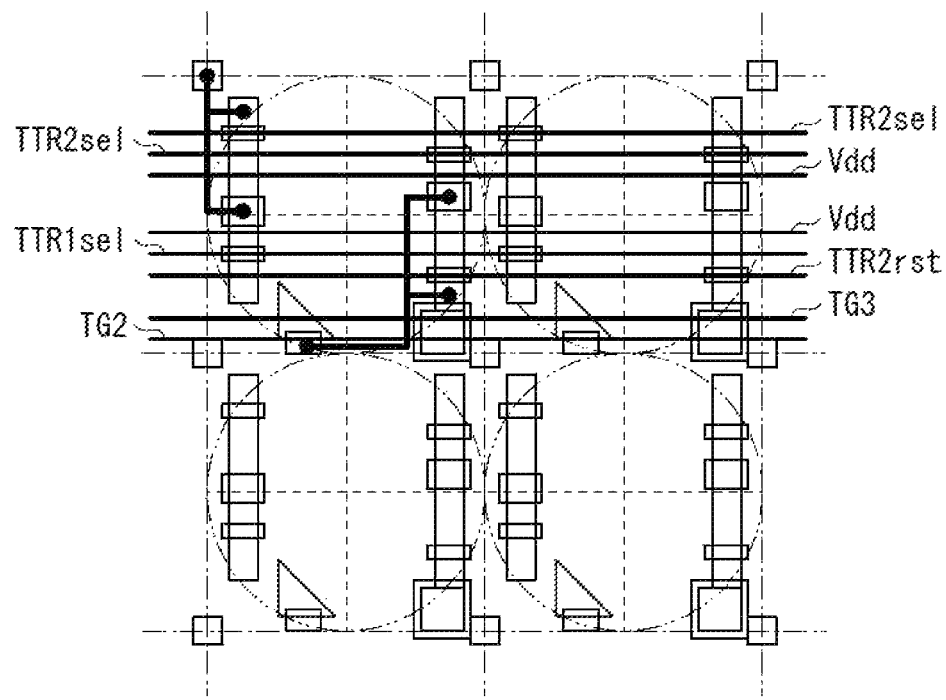

[ FIG. 36 ]
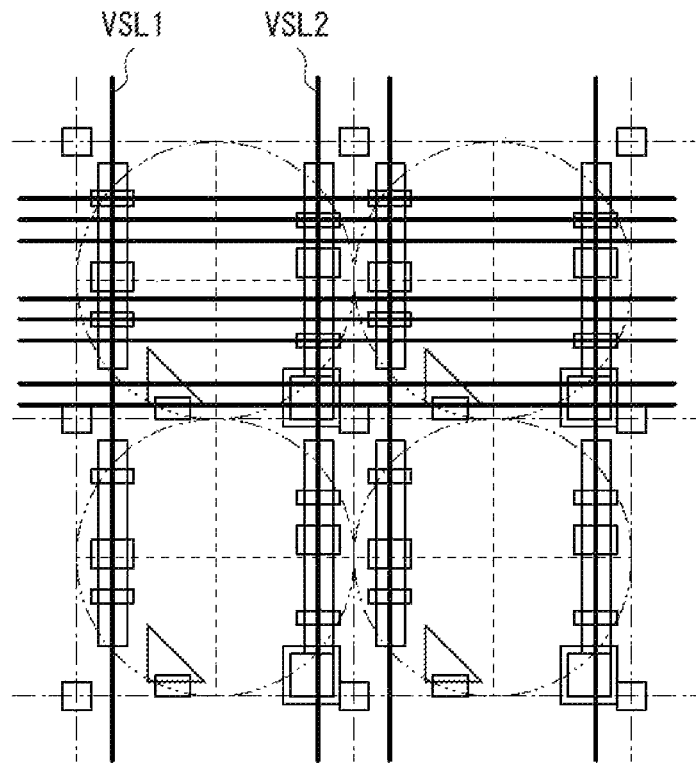
[ FIG. 37 ]
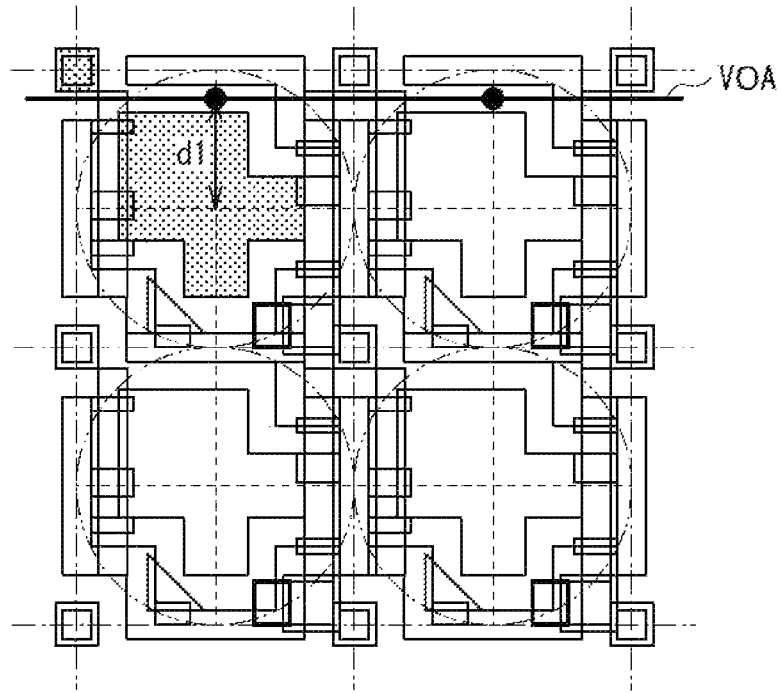

[FIG. 38]
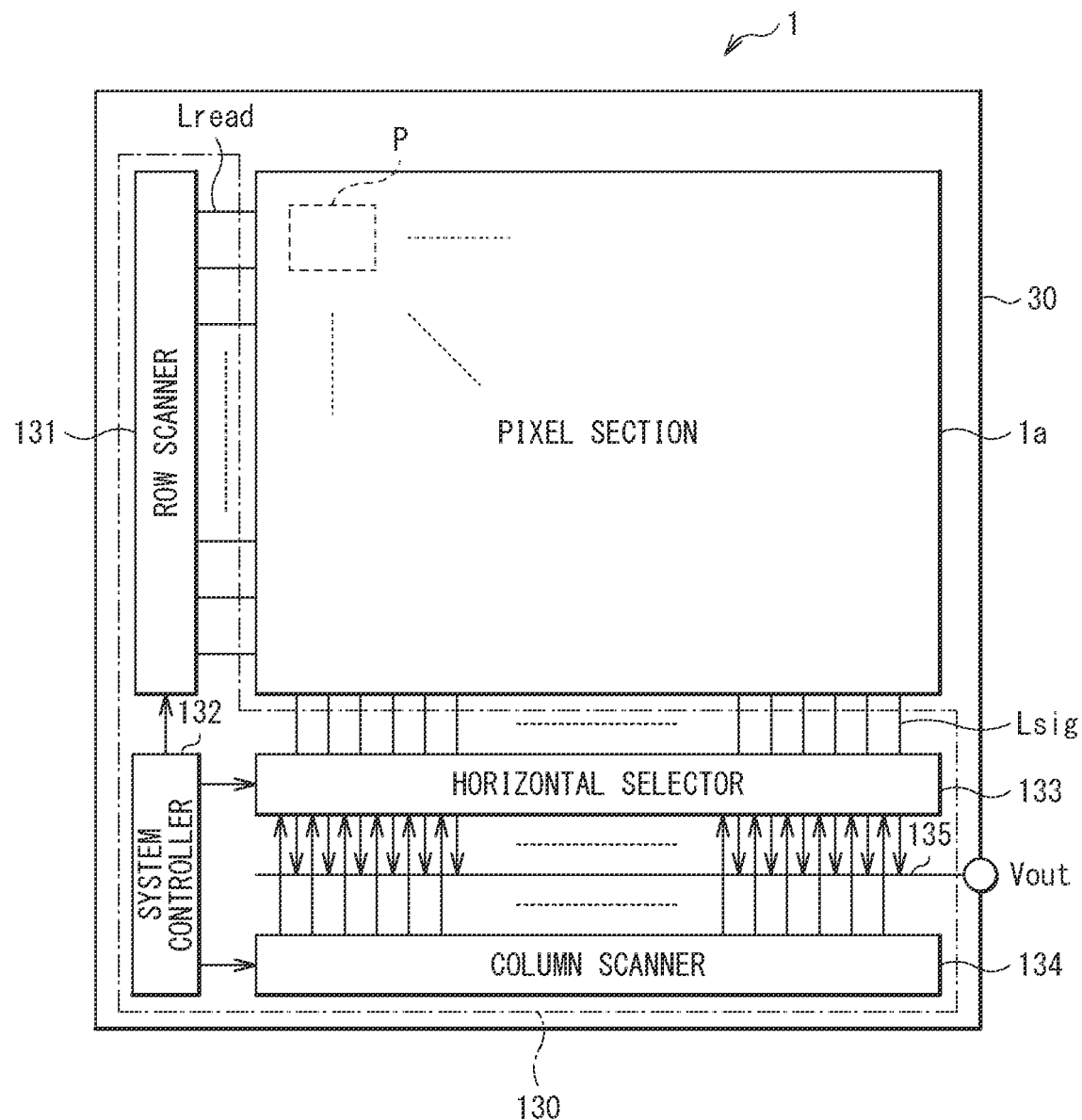

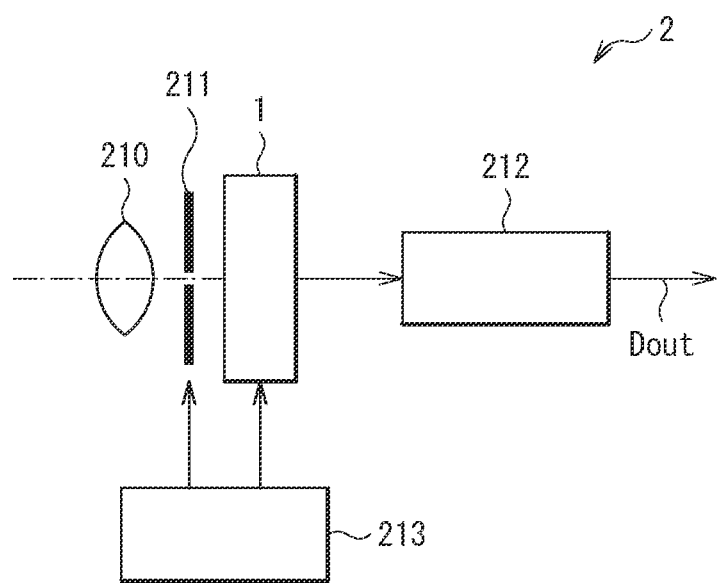
[FIG. 39]

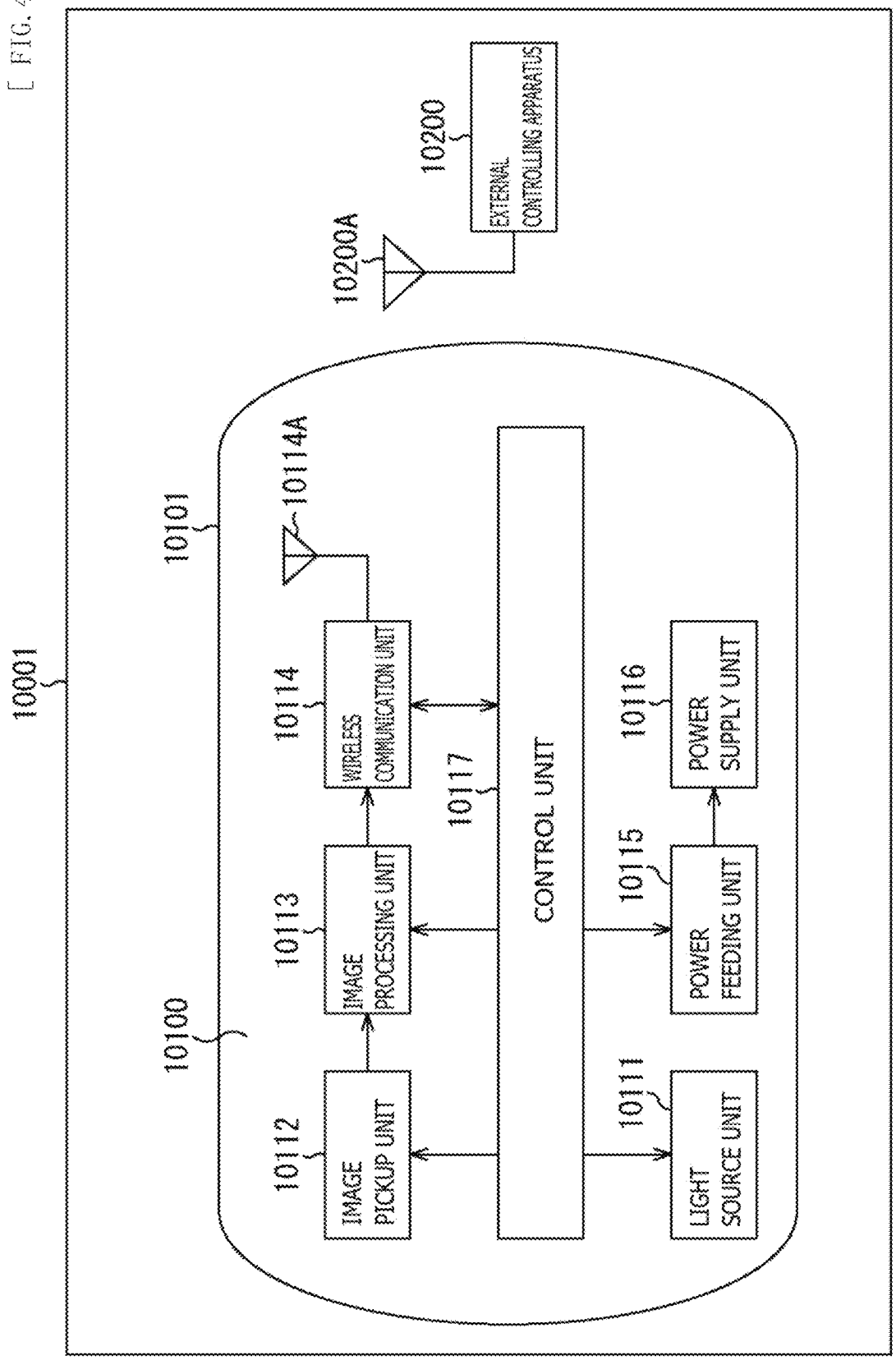
[FIG. 40]

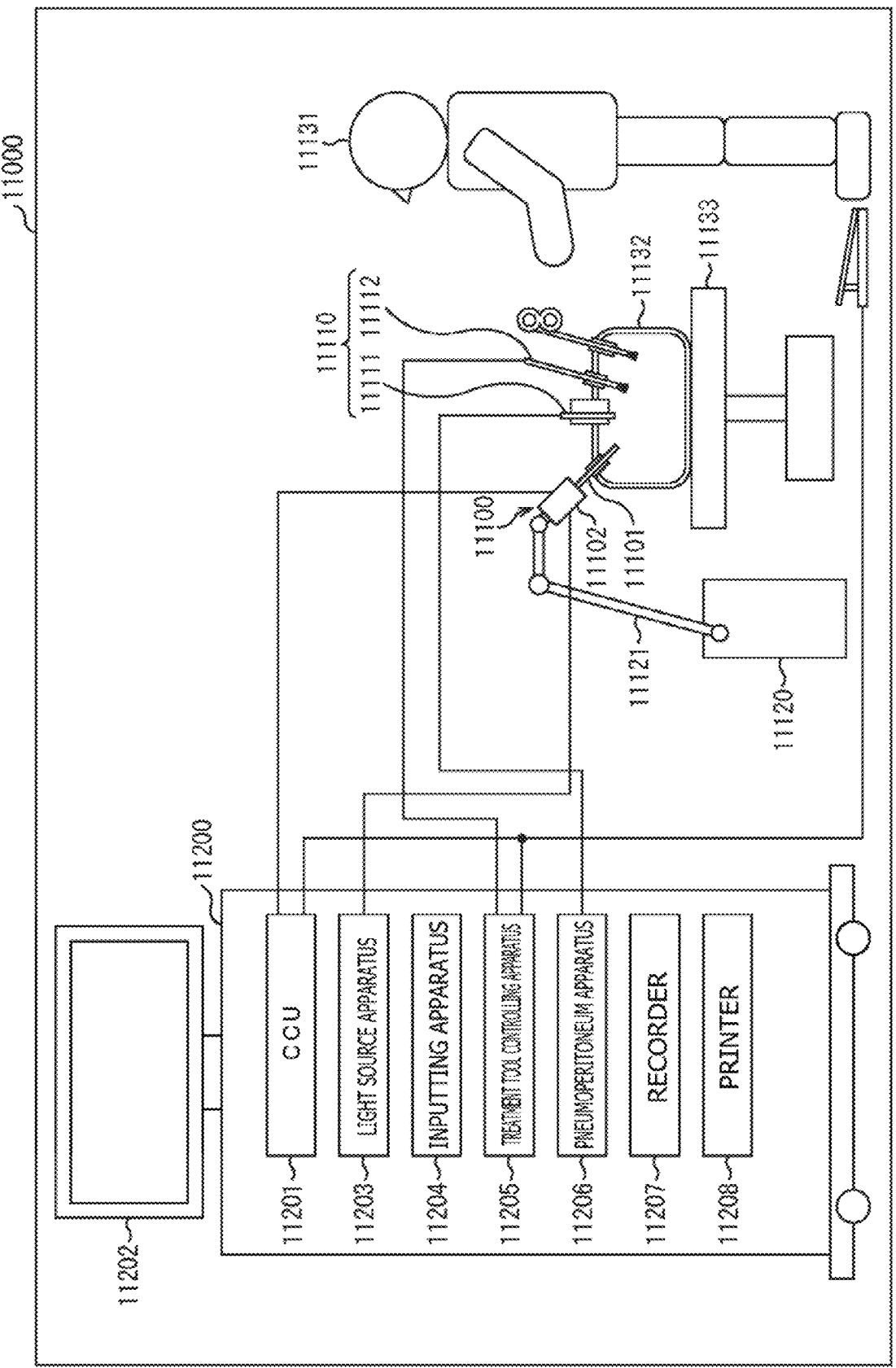
[ FIG. 41 ]

[FIG. 42]
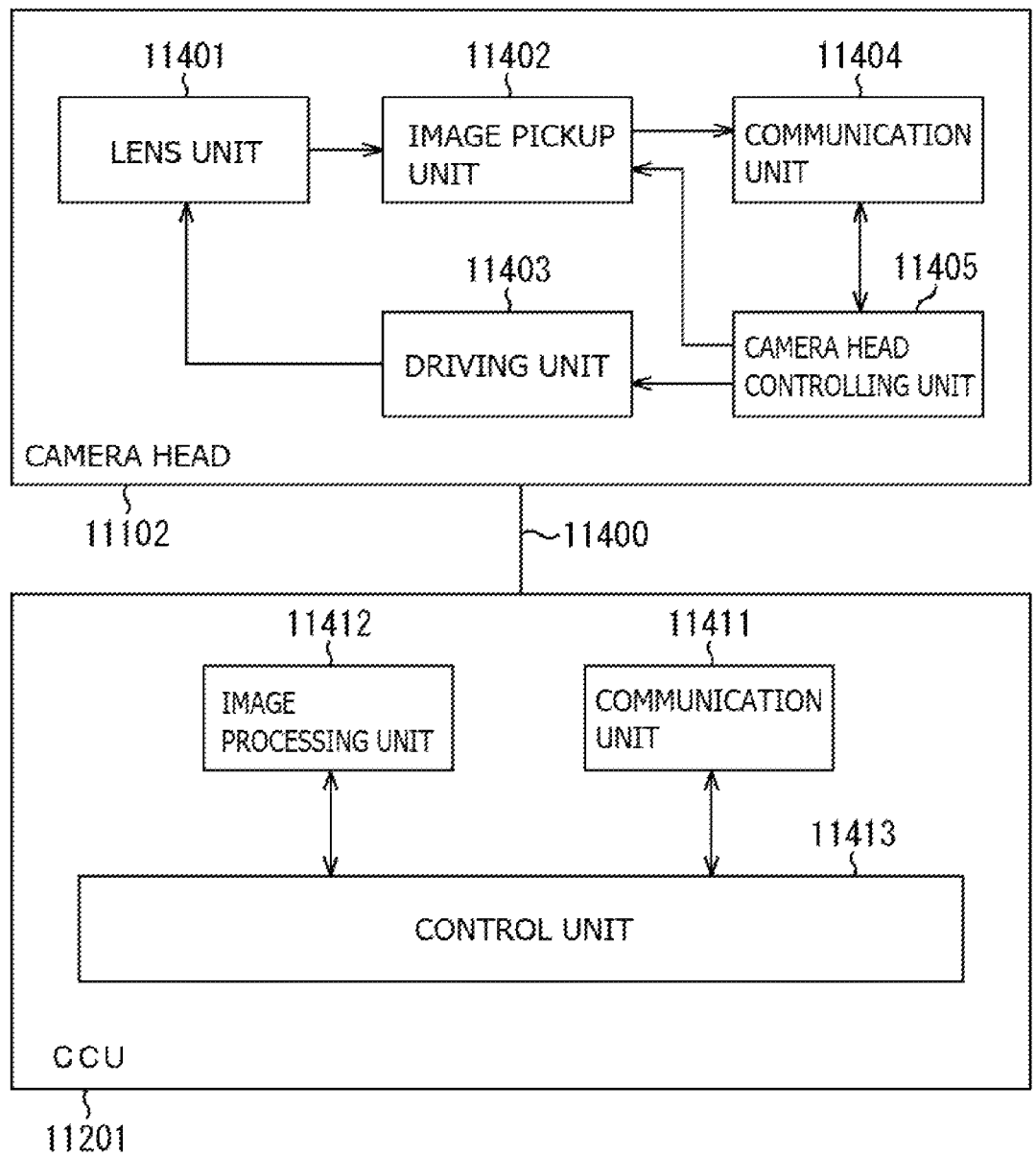

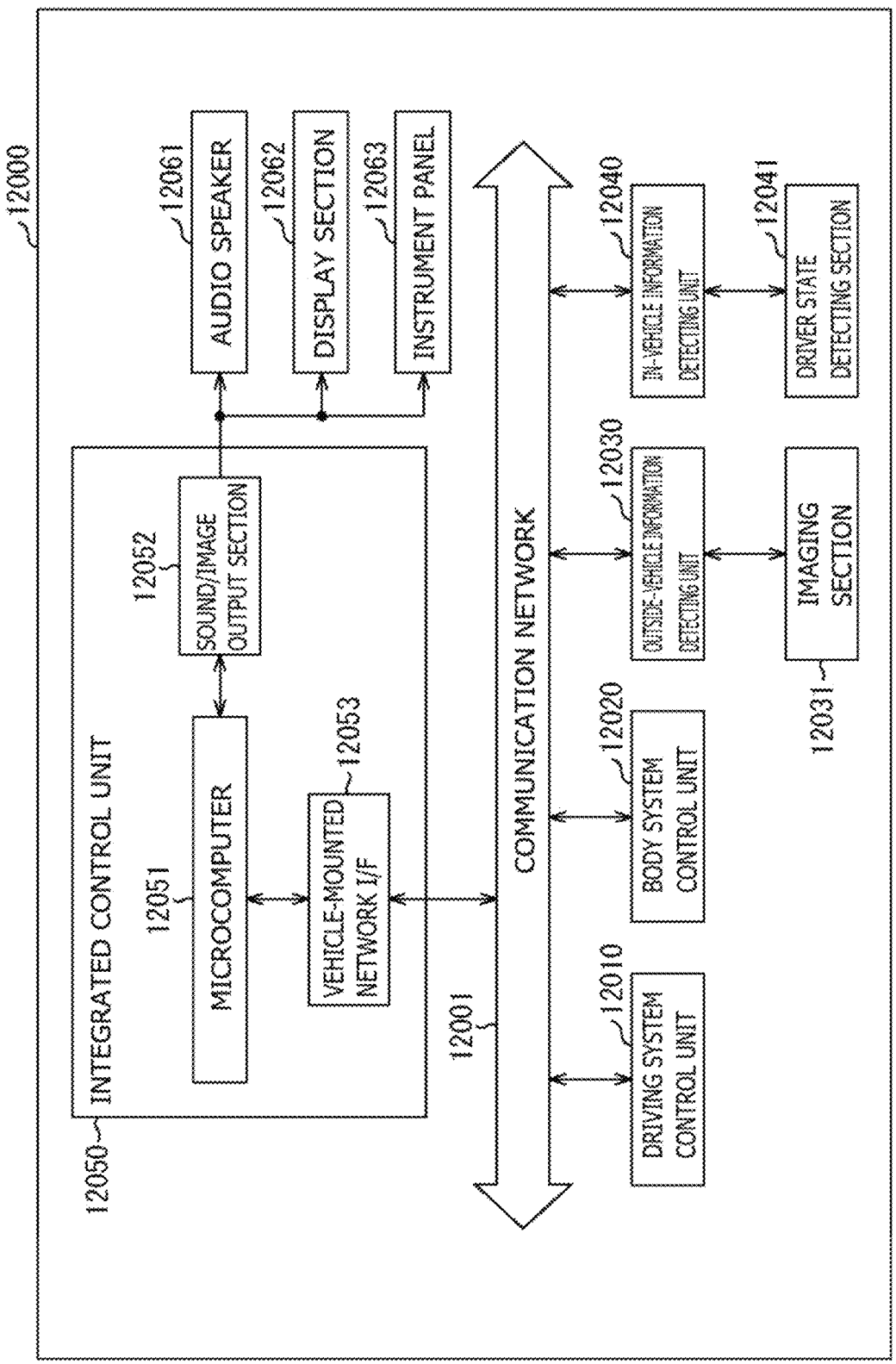
[ FIG. 43 ]

[ FIG. 44 ]
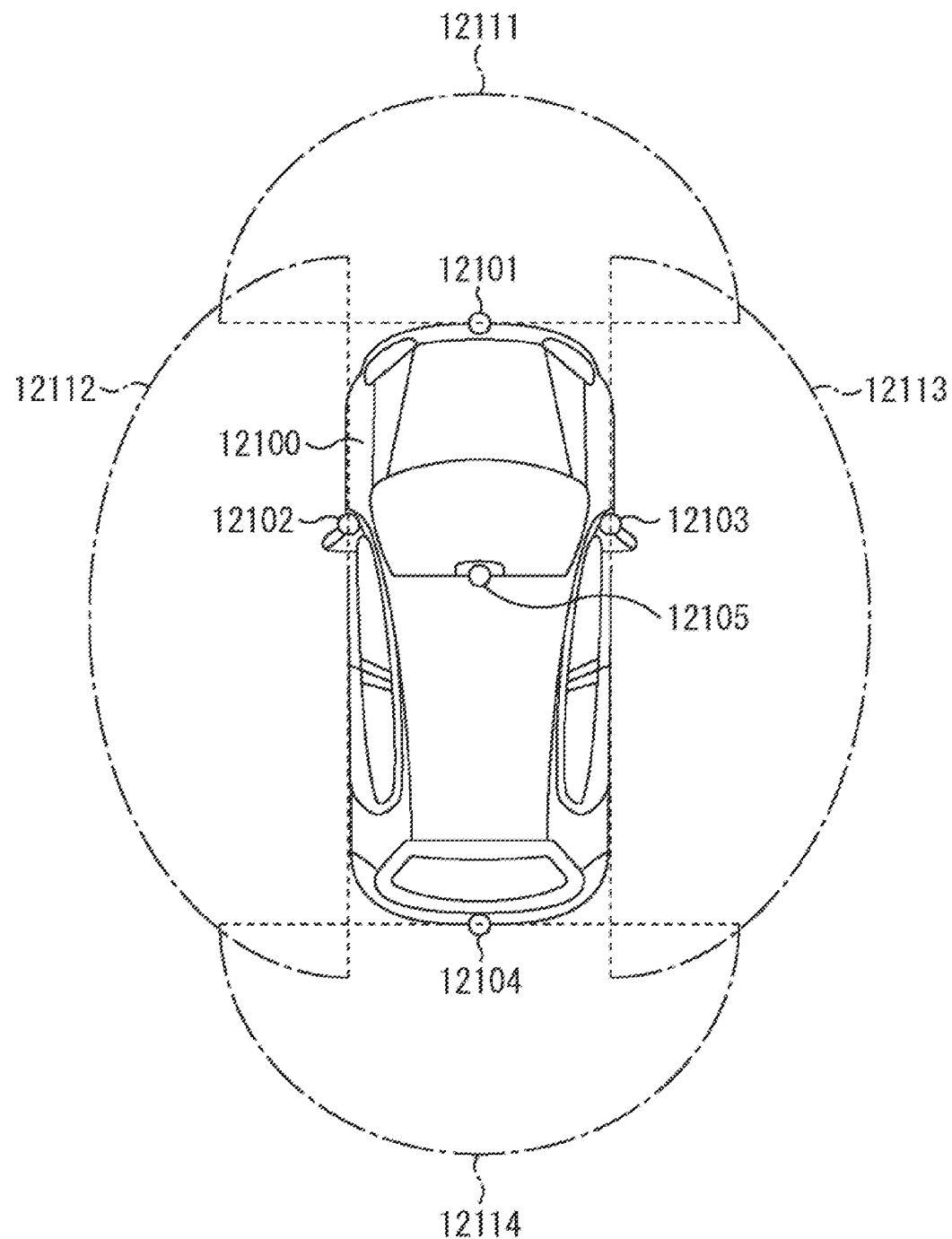

IMAGING ELEMENT AND IMAGING DEVICE

TECHNICAL FIELD

The present disclosure relates to an imaging element and an imaging device each including a photoelectric conversion layer including an organic semiconductor material.

BACKGROUND ART

In recent years, a so-called stacked imaging element has been used in an imaging device such as a CCD (Charge Coupled Device) image sensor or a CMOS (Complementary Metal Oxide Semiconductor) image sensor. In the stacked imaging element, an organic photoelectric conversion layer including an organic semiconductor material is stacked on a semiconductor substrate including a photodiode embedded and formed therein. In the stacked imaging element, it is possible to extract R/G/B signals from one pixel and no demosaic process is necessary. There is thus an advantage that no false color occurs.

The stacked imaging element, however, has the following issues. For example, an inorganic photoelectric converter including a photodiode temporarily accumulates electric charge generated by photoelectric conversion and the inorganic photoelectric converter then transfers the electric charge to a floating diffusion layer (floating diffusion; FD). This allows the inorganic photoelectric converter to be completely depleted. In contrast, an organic photoelectric converter including an organic photoelectric conversion layer directly accumulates electric charge generated by photoelectric conversion in a floating diffusion layer FD. It is therefore difficult to completely deplete the organic photoelectric converter. This increases kTC noise, increases random noise, and deteriorates the quality of a captured image.

To address this, for example, PTL 1 discloses an imaging element including an electric charge accumulation electrode in a photoelectric converter. The photoelectric converter is provided above a semiconductor substrate. In the photoelectric converter, a first electrode, a photoelectric conversion layer, and a second electrode are stacked. The electric charge accumulation electrode is disposed apart from the first electrode and disposed to be opposed to the photoelectric conversion layer with an insulating layer interposed in between. This imaging element is able to accumulate electric charge generated by photoelectric conversion on the electric charge accumulation electrode. This makes it possible to completely deplete an electric charge accumulation section at the start of exposure and erase the electric charge. As a result, the occurrence of phenomena such as an increase in kTC noise and ab increase in random noise is suppressed. A decrease in the quality of a captured image is reduced. Further, PTL 1 discloses an example in which the photoelectric conversion layer has a structure in which a lower semiconductor layer and an upper photoelectric conversion layer are stacked as a configuration for preventing the electric charge accumulated in the photoelectric conversion layer from being recombined and increasing the transfer efficiency to the first electrode.

CITATION LIST

Patent Literature

PTL 1: Japanese Unexamined Patent Application Publication No. 2017-157816

SUMMARY OF THE INVENTION

Incidentally, the lower semiconductor layer described above is formed by using, for example, an oxide semiconductor material such as IGZO, but the oxide semiconductor material is easily reduced by hydrogen to generate an oxygen defect. For this reason, the imaging element provided with the lower semiconductor layer may have a decreased operation stability and an increase in the reliability is requested.

It is desirable to provide an imaging element and an imaging device that each allow the reliability to increase.

An imaging element according to an embodiment of the present disclosure includes: a semiconductor substrate having an effective pixel region in which a plurality of pixels is disposed and a peripheral region provided around the effective pixel region; a photoelectric converter; a first hydrogen block layer; an interlayer insulating layer; and a separation groove. The photoelectric converter includes a first electrode, a second electrode, and an electric charge accumulation layer and a photoelectric conversion layer. The first electrode is provided on a light receiving surface side of the semiconductor substrate and includes a plurality of electrodes. The second electrode is disposed to be opposed to the first electrode. The electric charge accumulation layer and the photoelectric conversion layer are stacked and provided in order between the first electrode and the second electrode and extend in the effective pixel region. The first hydrogen block layer covers a top and a side surface of the photoelectric conversion layer and a side surface of the electric charge accumulation layer. The interlayer insulating layer is provided between the semiconductor substrate and the photoelectric converter. The separation groove separates the interlayer insulating layer in at least a portion of a region between the effective pixel region and the peripheral region. The separation groove has a side surface and a bottom surface covered with the first hydrogen block layer.

An imaging device according to an embodiment of the present disclosure includes the imaging element according to the embodiment of the present disclosure described above.

The imaging element according to the embodiment of the present disclosure and the imaging device according to the embodiment are each provided with the separation groove that separates the interlayer insulating layer between the effective pixel region and the peripheral region. The interlayer insulating layer is provided between the semiconductor substrate and the photoelectric converter. The first hydrogen block layer extends on the side surface and the bottom surface of the separation groove. The first hydrogen block layer covers the tops of the electric charge accumulation layer and the photoelectric conversion layer included in the photoelectric converter and the side surfaces of the photoelectric conversion layer and the electric charge accumulation layer. This suppresses the entry of hydrogen into the photoelectric conversion layer and the electric charge accumulation layer via the interlayer insulating layer.

BRIEF DESCRIPTION OF DRAWING

FIG. 1 is a cross-sectional schematic diagram illustrating a schematic configuration of an imaging element according to a first embodiment of the present disclosure.

FIG. 2 is a schematic diagram illustrating an example of a planar configuration of the imaging element illustrated in FIG. 1.

FIG. 3 is a schematic diagram illustrating another example of the planar configuration of the imaging element illustrated in FIG. 1.

FIG. 4 is a schematic diagram illustrating another example of the planar configuration of the imaging element illustrated in FIG. 1.

FIG. 5 is a schematic diagram illustrating another example of the planar configuration of the imaging element illustrated in FIG. 1.

FIG. 6 is an equivalent circuit diagram of the imaging element illustrated in FIG. 1.

FIG. 7 is a schematic diagram illustrating disposition of a lower electrode and a transistor included in a controller of the imaging element illustrated in FIG. 1.

FIG. 8A is a plane schematic diagram illustrating an example of a layout of a lower electrode included in an organic photoelectric converter illustrated in FIG. 1.

FIG. 8B is a perspective view of the layout of the lower electrode illustrated in FIG. 8A.

FIG. 9A is a plane schematic diagram illustrating another example of the layout of the lower electrode included in the organic photoelectric converter illustrated in FIG. 1.

FIG. 9B is a perspective view of the layout of the lower electrode illustrated in FIG. 9A.

FIG. 10 is a plane schematic diagram illustrating an example of a layout of one inorganic photoelectric converter illustrated in FIG. 1 and a variety of transistors related to this.

FIG. 11 is a plane schematic diagram illustrating an example of a layout of another inorganic photoelectric converter illustrated in FIG. 1 and a variety of transistors related to this.

FIG. 12 is a disposition diagram of a signal line for driving an accumulation electrode illustrated in FIG. 1.

FIG. 13 is a diagram illustrating a portion of wiring lines coupled to adjacent photoelectric converters and a variety of transistors related to these.

FIG. 14 is a diagram illustrating the portion of the wiring lines coupled to the adjacent photoelectric converters and the variety of transistors related to these.

FIG. 15 is a diagram illustrating the portion of the wiring lines coupled to the adjacent photoelectric converters and the variety of transistors related to these.

FIG. 16A is a cross-sectional view for describing a method of manufacturing the imaging element illustrated in FIG. 1.

FIG. 16B is a cross-sectional schematic diagram illustrating a step subsequent to FIG. 16A.

FIG. 16C is a cross-sectional schematic diagram illustrating a step subsequent to FIG. 16B.

FIG. 16D is a cross-sectional schematic diagram illustrating a step subsequent to FIG. 16C.

FIG. 17 is a timing chart illustrating an operation example of the imaging element illustrated in FIG. 1.

FIG. 18 is a cross-sectional schematic diagram illustrating a schematic configuration of an imaging element according to a modification example 1 of the present disclosure.

FIG. 19 is a schematic diagram illustrating an example of a planar configuration of the imaging element illustrated in FIG. 18.

FIG. 20 is a cross-sectional schematic diagram illustrating a schematic configuration of an imaging element according to a modification example 2 of the present disclosure.

FIG. 21 is a schematic diagram illustrating an example of a planar configuration of the imaging element illustrated in FIG. 20.

FIG. 22 is a schematic diagram illustrating another example of the planar configuration of the imaging element illustrated in FIG. 20.

FIG. 23 is a cross-sectional schematic diagram illustrating a schematic configuration of an imaging element according to a modification example 3 of the present disclosure.

FIG. 24 is a schematic diagram illustrating an example of a planar configuration of the imaging element illustrated in FIG. 23.

FIG. 25 is a cross-sectional schematic diagram illustrating an example of a schematic configuration of an imaging element according to a modification example 4 of the present disclosure.

FIG. 26 is a cross-sectional schematic diagram illustrating another example of the schematic configuration of the imaging element according to a modification example 4 of the present disclosure.

FIG. 28 is a cross-sectional schematic diagram illustrating a schematic configuration of an imaging element according to a modification example 6 of the present disclosure.

FIG. 29 is a cross-sectional schematic diagram illustrating an example of a schematic configuration of an imaging element according to a second embodiment of the present disclosure.

FIG. 30 is a cross-sectional schematic diagram illustrating another example of the schematic configuration of the imaging element according to the second embodiment of the present disclosure.

FIG. 31 is a plane schematic diagram illustrating another example of a layout of a lower electrode included in an organic photoelectric converter according to a modification example 7 of the present disclosure.

FIG. 32 is a plane schematic diagram illustrating another example of a layout of one inorganic photoelectric converter according to the modification example 7 of the present disclosure and a variety of transistors related to this.

FIG. 33 is a plane schematic diagram illustrating another example of a layout of another inorganic photoelectric converter according to the modification example 7 of the present disclosure and a variety of transistors related to this.

FIG. 34 is a diagram illustrating another example of wiring lines coupled to a photoelectric converter according to the modification example 7 of the present disclosure and a variety of transistors related to this.

FIG. 35 is a diagram illustrating another example of the wiring lines coupled to the photoelectric converter according to the modification example 7 of the present disclosure and the variety of transistors related to this.

FIG. 36 is a diagram illustrating another example of the wiring lines coupled to the photoelectric converter according to the modification example 7 of the present disclosure and the variety of transistors related to this.

FIG. 37 is a diagram illustrating another example of the wiring lines coupled to the photoelectric converter according to the modification example 7 of the present disclosure and the variety of transistors related to this.

FIG. 38 is a block diagram illustrating a configuration of an imaging device including the imaging element illustrated in FIG. 1 or the like as a pixel.

FIG. 39 is a functional block diagram illustrating an example of an electronic apparatus (camera) including the imaging device illustrated in FIG. 38.

FIG. 40 is a block diagram depicting an example of a schematic configuration of an in-vivo information acquisition system.

FIG. 41 is a view depicting an example of a schematic configuration of an endoscopic surgery system.

FIG. 42 is a block diagram depicting an example of a functional configuration of a camera head and a camera control unit (CCU).

FIG. 43 is a block diagram depicting an example of schematic configuration of a vehicle control system.

FIG. 44 is a diagram of assistance in explaining an example of installation positions of an outside-vehicle information detecting section and an imaging section.

MODES FOR CARRYING OUT THE INVENTION

Figure 27:
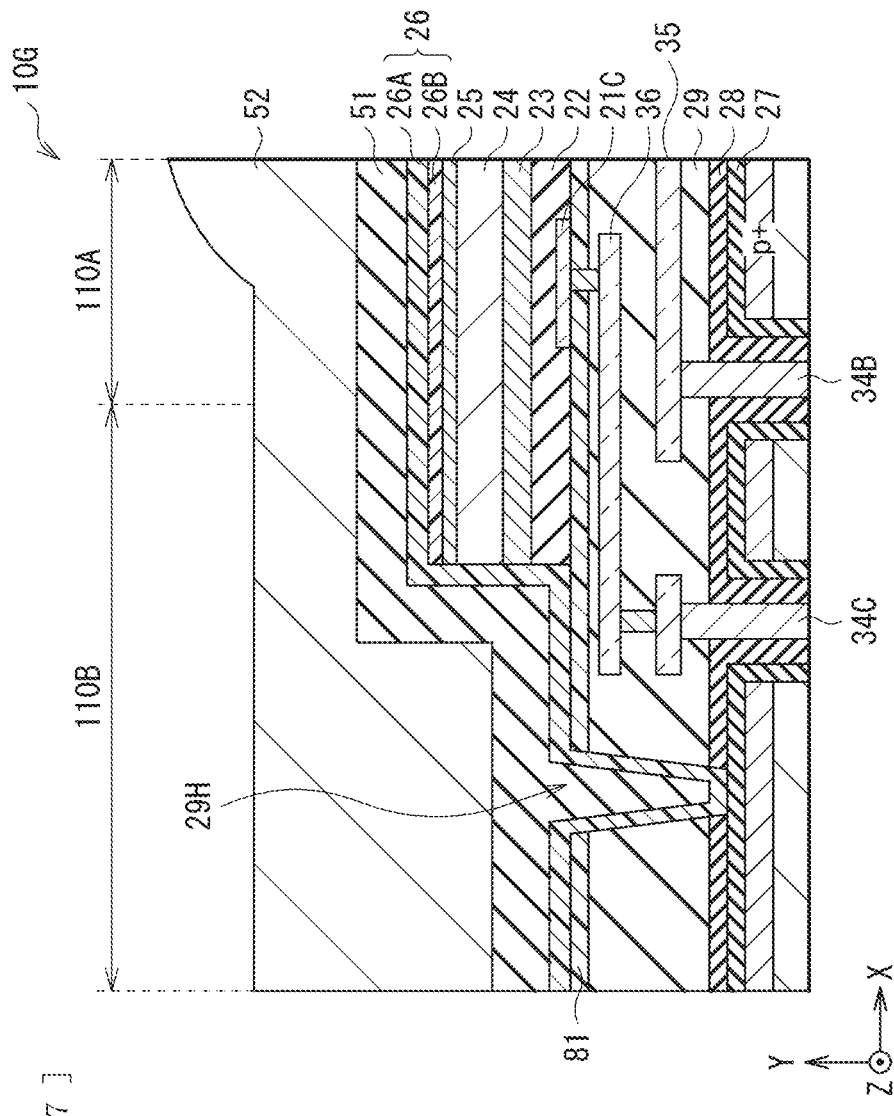
FIG. 27 is a cross-sectional schematic diagram illustrating a schematic configuration of an imaging element according to a modification example 5 of the present disclosure.

The following describes an embodiment of the present disclosure in detail with reference to the drawings. The following description is a specific example of the present disclosure, but the present disclosure is not limited to the following modes. In addition, the present disclosure is not limited to the disposition, dimensions, dimensional ratios, and the like of the respective components illustrated in the drawings. It is to be noted that description is given in the following order.

1. First Embodiment (Example of an imaging element having, between an effective pixel region and a peripheral region, a separation groove that separates an interlayer insulating layer)
1-1. Configuration of Imaging Element
1-2. Method of Manufacturing Imaging Element
1-3. Workings and Effects
2. Modification Example 1 (Example in which there are provided double separation grooves around an effective pixel region)
3. Modification Example 2 (Example in which there is provided a separation groove around a pad electrode)
4. Modification Example 3 (Example in which there are provided respective separation grooves around an effective pixel region and around pad electrodes)
5. Modification Example 4 (Example of the depth of a separation groove)
6. Modification Example 5 (Example in which there is provided a second hydrogen block layer in a lower layer of a photoelectric converter 20)
7. Modification Example 6 (Example in which an insulating layer on a lower electrode is formed as a second hydrogen block layer)
8. Second Embodiment (Example of an imaging element further including a guard ring between an effective pixel region and a peripheral region)
9. Modification Example 7 (Another example of a pixel layout)
10. Application Examples
11. Practical Application Examples

1. First Embodiment

FIG. 1 schematically illustrates a cross-sectional configuration of an imaging element (imaging element 10A) according to a first embodiment of the present disclosure. FIG. 2 schematically illustrates an example of a planar configuration of the imaging element 10A illustrated in FIG. 1 and each of FIGS. 3 to 5 schematically illustrates another example of the planar configuration of the imaging element 10A illustrated in FIG. 1. It is to be noted that FIG. 1 illustrates a cross section taken along an I-I line illustrated in FIG. 2. FIG. 6 is an equivalent circuit diagram of the imaging element 10A illustrated in FIG. 1. FIG. 7 schematically illustrates the disposition of a lower electrode 21 and a transistor included in a controller of an imaging element 10 illustrated in FIG. 1. The imaging element 10A is included, for example, in one pixel (unit pixel P) in an imaging device (imaging device 1; see FIG. 38) such as a CMOS (Complementary Metal Oxide Semiconductor) image sensor included in an electronic apparatus such as a digital still camera or a video camera. The imaging device 1 has an effective pixel region 110A and a peripheral region 110B. A plurality of pixels is disposed in the effective pixel region 110A. The peripheral region 110B is provided around the effective pixel region 110A. For example, a peripheral circuit such as a row scanner 131 is formed in the peripheral region 110B. The imaging element 10A is formed in each of the plurality of pixels.

The imaging element 10A is provided with a photoelectric converter 20 on a light receiving surface (first surface; surface 30S1) of a semiconductor substrate 30. The photoelectric converter 20 has a configuration in which the lower electrode 21 (first electrode) including a plurality of electrodes, an insulating layer 22, an electric charge accumulation layer 23, a photoelectric conversion layer 24, and an upper electrode 25 (second electrode) are stacked in this order from the semiconductor substrate 30 side. The electric charge accumulation layer 23 and the photoelectric conversion layer 24 are formed to extend, for example, over the whole of the effective pixel region 110A as a layer common to the plurality of pixels provided in the effective pixel region 110A. Further, a hydrogen block layer 26 (first hydrogen block layer) is formed that covers the top and the side surface of the photoelectric conversion layer 24, and the side surface of the electric charge accumulation layer 23. The imaging element 10A according to the present embodiment is provided with the interlayer insulating layer 29 between the semiconductor substrate 30 and the photoelectric converter 20. The interlayer insulating layer 29 has a separation groove 29H that separates the effective pixel region 110A side and the peripheral region 110B side. The side surface and the bottom surface of the separation groove 29H is covered with the hydrogen block layer 26. This separation groove 29H corresponds to a specific example of a "separation groove" of the present disclosure. It is to be noted that the imaging elements 10A have a pixel sharing structure in which four pixels adjacent to each other share one floating diffusion FD1, one floating diffusion FD2, and one floating diffusion FD3 that correspond to them.

(1-1. Configuration of Imaging Element)

The imaging element 10A is a so-called vertical spectroscopic imaging element in which the one photoelectric converter 20 and two inorganic photoelectric converters 32B and 32R are stacked in the vertical direction. The photoelectric converter 20 is formed by using, for example, an organic material. The photoelectric converter 20 is provided on the first surface (back surface; surface 30S1) side of the semiconductor substrate 30 as described above. The inorganic photoelectric converters 32B and 32R are embedded and formed in the semiconductor substrate 30 and stacked in the thickness direction of the semiconductor substrate 30.

Although described in detail below, the photoelectric converter 20 includes the electric charge accumulation layer 23 and the photoelectric conversion layer 24 between the lower electrode 21 and the upper electrode 25. The lower electrode 21 and the upper electrode 25 are disposed to be opposed to each other. The photoelectric converter 20 is provided with the insulating layer 22 between the lower electrode 21 and the electric charge accumulation layer 23. The lower electrode 21 of the photoelectric converter 20 includes a plurality of electrodes (a readout electrode 21A, an accumulation electrode 21B, and a shield electrode 21C). The readout electrode 21A is electrically coupled to the electric charge accumulation layer 23 via an opening 22H formed in the insulating layer 22. The photoelectric conversion layer 24 includes a p-type semiconductor and an n-type semiconductor and has a bulk heterojunction structure in the layer. The bulk heterojunction structure is a p/n junction surface formed by mixing a p-type semiconductor and an n-type semiconductor.

The photoelectric converter 20 and the inorganic photoelectric converters 32B and 32R selectively detect pieces of light in wavelength ranges different from each other and perform photoelectric conversion. Specifically, for example, the photoelectric converter 20 acquires a color signal of green (G). The inorganic photoelectric converters 32B and 32R respectively acquire a color signal of blue (B) and a color signal of red (R) by using different absorption coefficients. This allows the imaging element 10A to acquire a plurality of types of color signals in one pixel without using color filters.

It is to be noted that, in the present embodiment, a case is described where the electron of a pair (electron-hole pair) of an electron and a hole generated by photoelectric conversion is read out as signal charge (case where an n-type semiconductor region is used as a photoelectric conversion layer). In addition, in the diagram, "+(plus)" attached to "p" and "n" indicates high p-type or n-type impurity concentration.

The second surface (front surface; 30S2) of the semiconductor substrate 30 is provided, for example, with the floating diffusions (floating diffusion layers) FD1 (a region 35 in the semiconductor substrate 30), FD2, and FD3, transfer transistors TR2*trs* and TR3*trs*, amplifier transistors (modulation elements) TR1*amp* and TR2*amp*, reset transistors TR1*rst* and TR2*rst*, and selection transistors TR1*sel*. It is to be noted that the first surface (surface 30S1) side of the semiconductor substrate 30 is referred to as light incidence side S1 and the second surface (surface 30S2) side is referred to as wiring layer side S2 in the diagrams. A multilayer wiring layer 40, a logic substrate 60, and a support substrate 70 are stacked in this order on the second surface (surface 30S2) side of the semiconductor substrate 30.

The multilayer wiring layer 40 has, for example, a configuration in which wiring layers 41, 42, and 43 are stacked in an insulating layer 44. The logic substrate 60 is provided with a logic circuit (not illustrated) and a pad electrode 61 (transmission electrode) that is used for external output. The plurality (six in FIG. 2) of pad electrodes 61 is provided in the peripheral region 110B on the surface of the logic substrate 60 on the semiconductor substrate 30 side. The plurality of pad electrodes 61 is disposed on one side of the logic substrate 60 in one direction (e.g., Z axis direction) as illustrated in FIG. 2. The logic substrate 60 has, for example, a rectangular shape. This is not, however, limitative. For example, as illustrated in FIG. 3, the plurality of pad electrodes 61 may be disposed on two opposed sides of the logic substrate 60. For example, as illustrated in FIG. 4, the plurality of pad electrodes 61 may be disposed on two intersecting sides. Alternatively, for example, as illustrated in FIG. 5, the plurality of pad electrodes 61 may be disposed on each of the four sides. In addition, each of FIGS. 2 to 5 illustrates the example in which the plurality of pad electrodes 61 is disposed, but it may be the one pad electrode 61 that is disposed. There is provided an opening H on the pad electrode 61. The opening H extends through the semiconductor substrate 30 and the multilayer wiring layer 40. The pad electrode 61 is electrically coupled to the outside via this opening H. The coupling is established, for example, in a method such as wire bonding or bump.

In the photoelectric converter 20, the lower electrode 21, the insulating layer 22, the electric charge accumulation layer 23, the photoelectric conversion layer 24, and the upper electrode 25 are stacked in this order from the first surface (surface 30S1) side of the semiconductor substrate 30 as described above. For example, the lower electrodes 21 are formed separately for the respective imaging elements 10A. Each of the lower electrodes 21 includes the readout electrode 21A, the accumulation electrode 21B, and the shield electrode 21C. The readout electrode 21A and the accumulation electrode 21B are separated from each other with the insulating layer 22 interposed in between. The shield electrode 21C surrounds the four pixels that are adjacent to each other. The readout electrode 21A of the lower electrode 21 is shared between two or four pixels that are adjacent to each other and electrically coupled to the electric charge accumulation layer 23 via the opening 22H provided in the insulating layer 22, for example, as illustrated in each of FIGS. 8A and 9A. In FIG. 1, the electric charge accumulation layer 23, the photoelectric conversion layer 24, and the upper electrode 25 are provided as continuous layers common to the plurality of imaging elements 10A and extend over the whole of the effective pixel region 110A. The hydrogen block layer 26 is further provided on the upper electrode 25. The hydrogen block layer 26 is provided to cover the side surfaces of the upper electrode 25, the photoelectric conversion layer 24, the electric charge accumulation layer 23, and the insulating layer 22 from the top of the upper electrode 25, for example, in the peripheral region 110B.

There are provided, for example, a fixed electric charge layer 27, an insulating layer 28, and an interlayer insulating layer 29 between the first surface (surface 30S1) of the semiconductor substrate 30 and the lower electrode 21 in this order from the semiconductor substrate 30 side. The interlayer insulating layer 29 is provided with the separation groove 29H in the peripheral region 110B as described above. The separation groove 29H separates the effective pixel region 110A side and the peripheral region 110B side. The hydrogen block layer 26 described above further covers the side surface and the bottom surface of the separation groove 29H that extends on the interlayer insulating layer 29 and provided on the interlayer insulating layer 29. There are provided a first protective layer 51 and an on-chip lens layer 52 over the hydrogen block layer 26 in this order.

There are provided through electrodes 34A, 34B, and 34C between the first surface (surface 30S1) and the second surface (surface 30S2) of the semiconductor substrate 30. The through electrode 34A is electrically coupled to the readout electrode 21A of the photoelectric converter 20. The photoelectric converter 20 is coupled, for example, to a gate Gamp of the amplifier transistor TR1*amp* and the one source/drain region of a reset transistor RST (reset transistor TR1*rst*) also serving as the floating diffusion FD1 via a through electrode 34. This allows the imaging element 10A to favorably transfer the electric charge (electrons here) generated by the photoelectric converter 20 on the first surface (surface 30S21) side of the semiconductor substrate 30 to the second surface (surface 30S2) side of the semiconductor substrate 30, thereby increasing characteristics. The through electrode 34B is electrically coupled to the accumulation electrode 21B of the photoelectric converter 20. This allows a voltage to be applied to the accumulation electrode 21B independently of the readout electrode 21A. The through electrode 34C is electrically coupled to the shield electrode 21C. This suppresses the leakage of electric charge to an adjacent pixel.

Each of the lower ends of the through electrodes 34A, 34B, and 34C is coupled to the wiring layer 41. Especially the through electrode 34A is coupled to a coupling section 41A in the wiring layer 41. The coupling section 41A and the floating diffusion FD1 (region 35) are coupled, for example, via a lower first contact 45. The upper end of the through electrode 34A is coupled to the readout electrode 21A, for example, via a pad section 35A, a via V2, a pad section 36A, and a via V1.

The one through electrode 34A is provided for the four pixels that are adjacent to each other. The through electrode 34A has a function of a connector for the photoelectric converter 20 of each pixel and the gate Gamp of the amplifier transistor TR1*amp* and the floating diffusion FD1. The through electrode 34A serves as a transmission path for the electric charge (electrons here) generated by the photoelectric converter 20.

A reset gate Grst of the reset transistor TR1*rst* is disposed next to the floating diffusion FD1 (one source/drain region of the reset transistor TR1*rst*). This allows the reset transistor TR1*rst* to reset the electric charge accumulated in the floating diffusion FD1.

In the imaging element 10A according to the present embodiment, the light entering the photoelectric converter 20 from the upper electrode 25 side is absorbed by the photoelectric conversion layer 24. The excitons generated by this move to the interface between an electron donor and an electron acceptor included in the photoelectric conversion layer 24 and undergo exciton separation. In other words, the excitons are dissociated into electrons and holes. The electric charge (electrons and holes) generated here is transported to different electrodes by diffusion due to a concentration difference in the carriers and an internal electric field caused by the different work functions of the anode (upper electrode 25 here) and the cathode (lower electrode 21 here). The transported electric charge is detected as a photocurrent. In addition, the application of a potential between the lower electrode 21 and the upper electrode 25 makes it possible to control the transport direction of electrons and holes.

The following describes configurations, materials, and the like of the respective sections.

The photoelectric converter 20 is a photoelectric conversion element that absorbs green light corresponding to a portion or the whole of a selective wavelength range (e.g., 450 nm or more and 650 nm or less) and generates an electron-hole pair.

As described above, the lower electrode 21 includes the readout electrode 21A, the accumulation electrode 21B, and the shield electrode 21C that are formed separately. The readout electrode 21A is for transferring the electric charge (electrons here) generated in the photoelectric conversion layer 24 to the floating diffusion FD1. For example, the readout electrode 21A is coupled to the floating diffusion FD1 via the via V1, the pad section 36A, the via V2, the pad section 35A, the through electrode 34A, the coupling section 41A, and the lower first contact 45. The accumulation electrode 21B is for accumulating the electrons of the electric charge generated in the photoelectric conversion layer 24 in the electric charge accumulation layer 23 as signal charge. The accumulation electrode 21B is provided in a region that is opposed to the light receiving surfaces of the inorganic photoelectric converters 32B and 32R formed in the semiconductor substrate 30 and covers these light receiving surfaces. It is desirable that the accumulation electrode 21B be larger than the readout electrode 21A. This makes it possible to accumulate a large amount of electric charge. The shield electrode 21C is for suppressing the leakage of electric charge to an adjacent pixel as described above.

The lower electrode 21 includes an electrically conducive film having light transmissivity. The lower electrode 21 includes, for example, ITO (indium tin oxide). However, a tin oxide ($SnO_2$)-based material to which a dopant is added or a zinc oxide-based material obtained by adding a dopant to zinc oxide (ZnO) may be used in addition to this ITO as a material included in the lower electrode 21. Examples of the zinc oxide-based material include aluminum zinc oxide (AZO) to which aluminum (Al) is added as a dopant, gallium (Ga)-added gallium zinc oxide (GZO), and indium (In)-added indium zinc oxide (IZO). In addition to these, CuI, $InSbO_4$, ZnMgO, $CuInO_2$, $MgIN_2O_4$, CdO, $ZnSnO_3$, and the like may also be used. It is preferable that the thickness of the lower electrode 21 be, for example, 20 nm to 200 nm. More preferably, the thickness of the lower electrode 21 is 30 nm or more and 100 nm or less.

The insulating layer 22 is for electrically insulating the accumulation electrode 21B and the electric charge accumulation layer 23. The insulating layer 22 is provided, for example, on the interlayer insulating layer 29 and the lower electrode 21 to cover the lower electrode 21. In addition, the insulating layer 22 is provided with the opening 22H above the readout electrode 21A of the lower electrode 21 and the readout electrode 21A and the electric charge accumulation layer 23 are electrically coupled via this opening 22H. The insulating layer 22 includes, for example, for example, a single layer film including one of silicon oxide ($SiO_2$), silicon nitride ($Si_3N_4$), silicon oxynitride (SiON), and the like or a stacked film including two or more of them. It is to be noted that the chemical formulae described above are examples. It is assumed that the same type of compound which is not compliant with stoichiometry is also included in addition to the chemical formulae described above. The same applies to the chemical formulae described below. The thickness of the insulating layer 22 is, for example, 20 nm to 500 nm.

The electric charge accumulation layer 23 is provided below the photoelectric conversion layer 24. Specifically, the electric charge accumulation layer 23 is provided between the insulating layer 22 and the photoelectric conversion layer 24. The electric charge accumulation layer 23 is for accumulating the signal charge (electrons here) generated by the photoelectric conversion layer 24. It is preferable that the electric charge accumulation layer 23 be formed by using a material having higher electric charge mobility and having a larger band gap than those of the photoelectric conversion layer 24. For example, it is preferable that the band gap of a material included in the electric charge accumulation layer 23 be 3.0 eV or more. Examples of such a material include an oxide semiconductor material such as IGZO, an organic semiconductor material, and the like. Examples of the organic semiconductor material include transition metal dichalcogenide, silicon carbide, diamond, graphene, a carbon nanotube, a fused polycyclic hydrocarbon compound, a fused heterocyclic compound, and the like. The thickness of the electric charge accumulation layer 23 is, for example, 10 nm or more and 300 nm or less. Providing the electric charge accumulation layer 23 including the material described above below the photoelectric conversion layer 24 makes it possible to prevent electric charge from being recombined during electric charge accumulation and increase the transfer efficiency.

The photoelectric conversion layer 24 converts light energy to electric energy. The photoelectric conversion layer 24 includes, for example, two or more types of organic semiconductor materials (p-type semiconductor material or n-type semiconductor material) that respectively function as a p-type semiconductor or an n-type semiconductor. The photoelectric conversion layer 24 includes, in the layer, the junction surface (p/n junction surface) between these p-type semiconductor material and n-type semiconductor material. The p-type semiconductor relatively functions as an electron donor (donor) and the n-type semiconductor relatively functions an electron acceptor (acceptor). The photoelectric conversion layer 24 provides a field in which excitons generated in absorbing light are separated into electrons and holes. Specifically, excitons are separated into electrons and holes at the interface (p/n junction surface) between the electron donor and the electron acceptor.

The photoelectric conversion layer 24 may include an organic material or a so-called dye material in addition to the p-type semiconductor material and the n-type semiconductor material. The organic material or the dye material photoelectrically converts light in a predetermined wavelength range and transmits light in another wavelength range. In a case where the photoelectric conversion layer 24 is formed by using the three types of organic materials including a p-type semiconductor material, an n-type semiconductor material, and a dye material, it is preferable that the p-type semiconductor material and the n-type semiconductor material be materials each having light transmissivity in a visible region (e.g., 450 nm to 800 nm). The thickness of the photoelectric conversion layer 24 is, for example, 50 nm to 500 nm.

The organic material included in the photoelectric conversion layer 24 includes the following materials. Examples of the dye material include a rhodamine-based dye, a merocyanine-based dye, a quinacridone derivative, a subphthalocyanine-based dye, and derivatives thereof. Additionally, an organic material other than the dye material includes pentacene, benzothienobenzothiophene, fullerene, and derivatives thereof. The photoelectric conversion layer 24 includes two or more of the organic materials described above in combination. The organic materials described above function as a p-type semiconductor or an n-type semiconductor depending on the combination.

It is to be noted that, in the present embodiment, the photoelectric converter 20 is an element which photoelectrically converts green light, but may also be configured as an element that photoelectrically convert blue light or red light. In that case, a dye material included in the photoelectric conversion layer 24 includes the following. In a case where blue light is photoelectrically converted, for example, a coumaric acid dye, tris-8-hydroxyquinoline aluminum (Alq3), a merocyanine-based dye, and derivatives thereof are included. In a case where red light is photoelectrically converted, for example, a phthalocyanine-based dye, a subphthalocyanine-based dye, and derivatives thereof are included.

In addition, the following organic materials may be used for the photoelectric conversion layer 24. For example, any one of naphthalene, anthracene, phenantherene, tetracene, pyrene, perylene, and fluoranthene or derivatives thereof are favorably used as an organic material other than the organic materials described above. Alternatively, a polymer such as phenylenevinylene, fluorene, carbazole, indole, pyrene, pyrrole, picoline, thiophene, acetylene, and diacetylene or derivatives thereof may be used. Additionally, it is possible to favorably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a fused polycyclic aromatic group such as anthracene and pyrene and an aromatic ring or a heterocyclic compound are fused, a cyanine-like dye bonded by two nitrogen-containing hetero rings such as quinoline, benzothiazole, or benzoxazole having a squarylium group and croconic methine group as a bonded chain or by a squarylium group or a croconic methine group, etc. It is to be noted that a dithiol metal complex-based dye, a metallophthalocyanine dye, a metalloporphyrine dye, or a ruthenium complex dye is preferable as the metal complex dye described above, but this is not limitative.

Further, in the present embodiment, the example has been described in which an organic material is included in the photoelectric conversion layer 24, but this is not limitative. For example, the photoelectric conversion layer 24 may include an inorganic material such as crystalline silicon, amorphous silicon, microcrystalline silicon, crystalline selenium, amorphous selenium, a chalcopyrite-based compound, and a compound semiconductor. Examples of the chalcopyrite-based compound include CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, AgInSe$_2$, and the like. Examples of the compound semiconductor include CdSe, CdS, In$_2$Se$_3$, In$_2$S$_3$, Bi$_2$Se$_3$, Bi$_2$S$_3$, ZnSe, ZnS, PbSe, PbS, and the like in addition to a III-V group compound semiconductor such as GaAs, InP, AlGaAs, InGaP, AlGaInP, and InGaAsP. The inorganic material described above is used, for example, in a quantum dot shape.

There may be provided other layers between the photoelectric conversion layer 24 and the lower electrode 21 (e.g., between the electric charge accumulation layer 23 and the photoelectric conversion layer 24) and between the photoelectric conversion layer 24 and the upper electrode 25. Specifically, for example, the electric charge accumulation layer 23, an electron blocking film, the photoelectric conversion layer 24, a hole blocking film, a work function adjustment layer, and the like may be stacked in order from the lower electrode 21 side. Further, there may be provided an underlying layer and a hole transfer layer between the lower electrode 21 and the photoelectric conversion layer 24 and there may be provided a buffer layer and an electron transfer layer between the photoelectric conversion layer 24 and the upper electrode 25.

The upper electrode 25 includes an electrically conductive film having light transmissivity as with the lower electrode 21. In the imaging device 1 including the imaging element 10A as one pixel, the upper electrodes 25 may be separated for the respective pixels or formed as an electrode common to the respective pixels. The thickness of the upper electrode 25 is, for example, 10 nm to 200 nm. Although not illustrated, a wiring line is electrically coupled to the upper electrode 25. A voltage is applied to the upper electrode 25.

The hydrogen block layer 26 is for suppressing the entry of hydrogen (H$_2$) into the electric charge accumulation layer 23 and the photoelectric conversion layer 24. As described above, the hydrogen block layer 26 is provided on the upper electrode 25 in the effective pixel region 110A. In the peripheral region 110B, the hydrogen block layer 26 is stacked from the upper surface of the upper electrode 25 to the interlayer insulating layer 29 through the side surfaces of the upper electrode 25, the photoelectric conversion layer 24, and the electric charge accumulation layer 23 and the upper surface and the side surface the insulating layer 22. The hydrogen block layer 26 is formed to extend, for example, to the end of the peripheral region 110B. Further, the interlayer insulating layer 29 is provided with the separation groove 29H as described above. The separation groove 29H separates the effective pixel region 110A side and the peripheral region 110B side. The hydrogen block layer 26 covers even the side surface and the bottom surface of this separation groove 29H.

Example of a material included in the hydrogen block layer 26 includes an insulating material. Specifically, it is preferable to use a material having light transmissivity and a high sealing property. Examples of such a material include metal oxide such as aluminum oxide ($Al_2O_3$), silicon nitride, carbon-containing silicon oxide (SiOC), and the like. Alternatively, an oxide semiconductor such as ITO (indium tin oxide) may be used for the hydrogen block layer 26. In addition, it is preferable that the hydrogen block layer 26 have, for example, a smaller amount of hydrogen contained therein than that of the insulating layer 22 or that the film itself do not include any hydrogen. Further, it is preferable that the hydrogen block layer 26 have small stress and further have ultraviolet absorbing ability. Still further, it is preferable to form a film having a small amount of moisture contained therein and suppress the entry of moisture ($H_2O$). As described above, it is preferable to use aluminum oxide among the materials described above as a material for the hydrogen block layer 26. The hydrogen block layer 26 includes a single layer film formed by using the material described above or a stacked film including two or more of the materials described. The thickness of the hydrogen block layer 26 is, for example, 10 nm or more and 1000 nm or less.

The fixed electric charge layer 27 may be a film having positive fixed electric charge or a film having negative fixed electric charge. A material for the film having the negative fixed electric charge includes aluminum oxide, hafnium oxide ($HfO_2$), zirconium oxide (ZrO), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($H_{O2}O_3$), thulium oxide ($Tm_2O_3$), ytterbium oxide ($Yb_2O_3$), lutetium oxide ($Lu_2O_3$), yttrium oxide ($Y_2O_3$), hafnium nitride (HfN), aluminum nitride (AlN), hafnium oxynitride (HfON), aluminum oxynitride (AlON), and the like.

The fixed electric charge layer 27 may have a configuration in which two or more types of films are stacked. This makes it possible to further increase a function of a hole accumulation layer, for example, in a case of a film having negative fixed electric charge.

The insulating layer 28 is provided on the fixed electric charge layer 27 formed on the first surface (surface 30S1) of the semiconductor substrate 30. The insulating layer 28 is provided between the fixed electric charge layer 27 and the through electrodes 34A, 34B, and 34C in through holes 30H1, 30H2, and 30H3 where the through electrodes 34A, 34B, and 34C are formed. The insulating layer 28 is for electrically insulating the through electrode 34 and the semiconductor substrate 30. A material for the insulating layer 28 is not particularly limited, but the insulating layer 28 is formed by using, for example, silicon oxide, TEOS, silicon nitride, silicon oxynitride, and the like.

The interlayer insulating layer 29 is provided between the semiconductor substrate 30 (specifically, the insulating layer 28) and the photoelectric converter 20. The interlayer insulating layer 29 is provided in the layer, for example, with wiring lines such as the pad sections 35A and 36A, pad sections 35B and 36B, pad sections 35C and 36C, and the vias V1 and V2. The pad sections 35A and 36A electrically couple the readout electrode 21A and the through electrode 34A. The pad sections 35B and 36B electrically couple the accumulation electrode 21B and the through electrode 34B. The pad sections 35C and 36C electrically couple the shield electrode 21C and the through electrode 34C. The vias V1 and V2 electrically couple the respective electrodes and the pad sections. The interlayer insulating layer 29 includes, for example, a single layer film including one of silicon oxide, TEOS, silicon nitride, silicon oxynitride, and the like or a stacked film including two or more of them as with the insulating layer 28.

The interlayer insulating layer 29 is further provided with the separation groove 29H that separates the effective pixel region 110A side and the peripheral region 110B side in the peripheral region 110B. Specifically, this separation groove 29H is provided between the opening H and the effective pixel region 110A in a plan view. The opening H is provided on the pad electrode 61 disposed at the periphery of the peripheral region 110B. The side surface and the bottom surface of the separation groove 29H is covered with the hydrogen block layer 26 as described above. This suppresses, for example, the entry of hydrogen into the electric charge accumulation layer 23 and the photoelectric conversion layer 24 from the opening H via the interlayer insulating layer 29. In the present embodiment, the separation groove 29H is continuously provided in the peripheral region 110B to surround the effective pixel region 110A. It is to be noted that the separation groove 29H preferably extends to the first surface (surface 30S1) of the semiconductor substrate 30 through the interlayer insulating layer 29 and the insulating layer 28, but this is not limitative.

The first protective layer 51 is provided, for example, on the whole of the surface of the semiconductor substrate 30 including the effective pixel region 110A and the peripheral region 110B. It is preferable that the first protective layer 51 be formed by using, for example, a material having light transmissivity and a high sealing property. Examples of such a material include an insulating material such as aluminum oxide, silicon nitride, and carbon-containing silicon oxide. In addition, it is preferable that the first protective layer 51 have, for example, a smaller amount of hydrogen contained therein than that of the insulating layer 22 or that the film itself do not include any hydrogen as with the hydrogen block layer 26. Further, it is preferable that the first protective layer 51 have small stress and further have ultraviolet absorbing ability. Still further, it is preferable that the first protective layer 51 have a small amount of moisture contained therein. It is preferable to suppress the entry of moisture ($H_2O$). As described above, it is preferable to use aluminum oxide among the materials described above as a material for the first protective layer 51. The formation of the first protective layer 51 by using aluminum oxide provides the first protective layer 51 with a hydrogen block function and makes it possible to collectively form the hydrogen block layer 26 and the first protective layer 51.

It is to be noted that the first protective layer 51 may be formed by using a material similar to those of the insulating layer 28 and the interlayer insulating layer 29 described above. For example, the first protective layer 51 may be a single layer film including one of silicon oxide, silicon nitride, silicon oxynitride, and the like. Alternatively, the first protective layer 51 may be a stacked film including two or more of aluminum oxide, silicon nitride, a carbon-containing silicon oxide film, silicon oxide, and silicon oxynitride. The thickness of the first protective layer 51 is, for example, 100 nm to 1000 nm.

The on-chip lens layer 52 is provided in the effective pixel region 110A on the first protective layer 51. In the on-chip lens layer 52, an on-chip lens 52L (microlens) is formed, for example, for each of the unit pixels P. The on-chip lens 52L condenses light coming from the above on the respective light receiving surfaces of the photoelectric converter 20, the inorganic photoelectric converter 32B, and the inorganic photoelectric converter 32R. It is to be noted that there may be provided, below the on-chip lens 52L, an optical member such as a color filter that controls a spectrum. A material for the on-chip lens layer 52 includes aluminum oxide that is used for the hydrogen block layer 26 as an inorganic film in addition to silicon oxide, silicon nitride, silicon oxynitride, and the like. The formation of the on-chip lens layer 52 by using aluminum oxide provides the on-chip lens layer 52 with a hydrogen block function in addition to a lens function. In addition, the formation of the first protective layer 51 and the on-chip lens layer 52 by using aluminum oxide also makes it possible to collectively form the hydrogen block layer 26, the first protective layer 51, and the on-chip lens layer 52. Additionally, the on-chip lens layer 52 may be formed by using a metal oxide-containing resin having, for example, metal nanoparticles dispersed in an organic film.

The semiconductor substrate 30 includes, for example, an n-type silicon (Si) substrate and includes a p well 31 in a predetermined region (e.g., pixel section 1a). The second surface (surface 30S2) of the p well 31 is provided with transfer transistors TR1*trs*, TR2*trs*, and TR3*trs*, the amplifier transistors TR1*amp* and TR2*amp*, the reset transistors TR1*rst* and TR2*rst*, the selection transistors TR1*sel* and TR2*sel*, and the like described above. The peripheral region 110B of the semiconductor substrate 30 may be provided, for example, with a pixel readout circuit, a pixel drive circuit, and the like that are included in a logic circuit.

The imaging element 10A has a layout in which four pixels that are adjacent to each other share the one floating diffusion FD1, the one floating diffusion FD2, and the one floating diffusion FD3 as described above. FIG. 8A illustrates an example of a layout of the lower electrode 21 included in the photoelectric converter 20 and FIG. 8B illustrates the layout of the lower electrode 21 illustrated in FIG. 8A as a perspective view. FIG. 9A illustrates an example of a layout of the lower electrode 21 included in the photoelectric converter 20 and FIG. 9B illustrates the layout of the lower electrode 21 illustrated in FIG. 9A as a perspective view. FIG. 10 illustrates an example of a layout of the inorganic photoelectric converter 32B and a variety of transistors related to this. FIG. 11 illustrates an example of a layout of an inorganic photoelectric converter R and a variety of transistors related to this. FIG. 12 illustrates an example of a signal wiring line for driving the accumulation electrode 21B in the photoelectric converter 20. Each of FIGS. 13 to 15 illustrates an example of wiring lines that are coupled to the respective photoelectric converters 20, 32B, and 32R and a variety of transistors related to these.

With regard to the photoelectric converters 20, the four photoelectric converters 20 that are adjacent to each other are coupled to the one floating diffusion FD1. The one reset transistor TR1*rst* and a power supply line Vdd are coupled in series to the floating diffusion FD1. Further, aside from this, one of the amplifier transistors TR1*amp*, one of the selection transistors TR1*sel*, and a signal line (data output line) VSL1 are coupled in series to the floating diffusion FD1. In the photoelectric converters 20 according to the present embodiment, the four accumulation electrodes 21B that are adjacent to each other, the reset transistor TR1*rst*, the amplifier transistor TR1*amp*, and the selection transistor TR1*sel* are included in a set of controllers (first controller) that performs a readout operation and a reset operation of the four photoelectric converters 20 that are adjacent to each other. Each of pixels is provided with the one reset transistor TR1*rst*, the one amplifier transistor TR1*amp*, and the one selection transistor TR1*sel*. In a case where signal charge is read out from the four photoelectric converters 20 that are adjacent to each other, this first controller is used to perform readout processes in order, for example, in a time division manner.

In the inorganic photoelectric converter 32B, four photodiodes PD2 that are adjacent to each other are coupled to the one floating diffusion FD2 via the four transfer transistors TR2*trs*. The four transfer transistors TR2*trs* are provided to the respective pixels.

In the inorganic photoelectric converter 32R, four photodiodes PD3 that are adjacent to each other are coupled to the one floating diffusion FD3 via the four transfer transistors TR3*trs* as with the inorganic photoelectric converter 32B. The four transfer transistors TR3*trs* are provided to the respective pixels.

The one reset transistor TR2*rst* and the power supply line Vdd are coupled in series to the one floating diffusion FD2. Further, aside from this, one of the amplifier transistors TR2*amp*, one of the selection transistors TR2*sel*, and a signal line (data output line) VSL2 are coupled in series to the floating diffusion FD2. In the imaging elements 10A each having the pixel sharing structure as in the present embodiment, the inorganic photoelectric converters 32B and the inorganic photoelectric converters 32R use the transfer transistors TR2*trs* and the transfer transistors TR3*trs*, the reset transistors TR2*rst*, the amplifier transistors TR2*amp*, and the selection transistors TR2*sel* to configure a set of controllers (second controller) that performs a readout operation and a reset operation of the four inorganic photoelectric converters 32B and inorganic photoelectric converters 32R that are adjacent to each other. Each of the transfer transistors TR2*trs* and each of the transfer transistors TR3*trs* are provided to a pixel. The reset transistors TR2*rst* are provided to the respective pixels. The amplifier transistors TR2*amp* are provided to the respective pixels. The selection transistors TR2*sel* are provided to the respective pixels. In other words, the four inorganic photoelectric converters 32B and the four inorganic photoelectric converters 32R included in the stacked imaging elements 10A for four pixels have a configuration in which one set of controllers (second controller) is shared except for the transfer transistors TR2*trs* and TR3*trs*. In a case where signal charge is read out from the floating diffusion FD2 corresponding to the four inorganic photoelectric converters 32B that are adjacent to each other and the floating diffusion FD3 corresponding to the four inorganic photoelectric converters 32R, this second controller is used to perform readout processes in order, for example, in a time division manner.

It is to be noted that, in the present embodiment, the floating diffusions FD2 and FD3 shared by the four inorganic photoelectric converters 32B and inorganic photoelectric converters 32R that are adjacent to each other are disposed at positions that are spaced apart from each other by one pixel. This makes it possible to achieve the high integration of the imaging element 10A.

(1-2. Method of Manufacturing Imaging Element)

It is possible to manufacture the imaging element 10A according to the present embodiment, for example, as follows.

First, for example, the p well 31 is formed as a well of a first electrical conduction type in the semiconductor substrate 30. The inorganic photoelectric converters 32B and 32R each of which is of a second electrical conduction type (e.g., n type) are formed in this p well 31. A p+ region is formed near the first surface (surface 30S1) of the semiconductor substrate 30.

For example, n+ regions that serve as the floating diffusions FD1 to FD3 are formed on the second surface (surface 30S2) of the semiconductor substrate 30 and a gate insulating film 33 and a gate wiring layer 47 are then formed. The gate wiring layer 47 includes the respective gates of the variety of transfer transistors TR1*trs*, TR2*trs*, and TR3*trs*, the selection transistors TR1*sel* and TR2*sel*, the amplifier transistors TR1*amp* and TR2*amp*, and the reset transistors TR1*rst* and TR2*rst*. This forms the variety of transfer transistors TR1*trs*, TR2*trs*, and TR3*trs*, the selection transistors TR1*sel* and TR2*sel*, the amplifier transistors TR1*amp* and TR2*amp*, and the reset transistors TR1*rst* and TR2*rst*. Further, the multilayer wiring layer 40 is formed on the second surface (surface 30S2) of the semiconductor substrate 30. The multilayer wiring layer 40 includes the wiring layers 41 to 43 and the insulating layer 44. The wiring layers 41 to 43 include the lower first contact 45 and the coupling section 41A.

As the base of the semiconductor substrate 30, for example, an SOI (Silicon on Insulator) substrate is used in which the semiconductor substrate 30, an embedded oxide film (not illustrated), and a holding substrate (not illustrated) are stacked. The embedded oxide film and the holding substrate are joined to the first surface (surface 30S1) of the semiconductor substrate 30. After ion implantation, annealing treatment is performed.

Next, the support substrate 70 on which the logic substrate 60 is formed is joined to the second surface (surface 30S2) side (multilayer wiring layer 40 side) of the semiconductor substrate 30 and flipped. Subsequently, the semiconductor substrate 30 is separated from the embedded oxide film and the holding substrate of the SOI substrate to expose the first surface (surface 30S1) of the semiconductor substrate 30. It is possible to perform the steps described above with technology used in a normal CMOS process such as ion implantation and CVD (Chemical Vapor Deposition).

Next, the semiconductor substrate 30 is processed from the first surface (surface 30S1) side, for example, by dry etching to form the annular through holes 30H1, 30H2, 30H3, and 30H4, for example. The depth of each of the through holes 30H1 to 30H3 extend from the first surface (surface 30S1) to the second surface (surface 30S2) of the semiconductor substrate 30.

Next, the fixed electric charge layer 27 is formed on the first surface (surface 30S1) of the semiconductor substrate 30 and the side surface of a through hole 30H by using, for example, an atomic layer deposition (Atomic Layer Deposition; ALD) method. This forms the fixed electric charge layer 27 that is continuous over the first surface (surface 30S1) of the semiconductor substrate 30 and the side surfaces and the bottom surfaces of the through holes 30H1, 30H2, 30H3, and 30H4. Next, the insulating layer 28 is formed on the fixed electric charge layer 27 on the first surface (surface 30S1) of the semiconductor substrate 30 and in the through holes 30H1, 30H2, 30H3, and 30H4. After that, an insulating film that is included in the interlayer insulating layer 29 is further formed on the insulating layer 28.

Next, a through hole is formed in the insulating layer 28 formed in the through holes 30H1, 30H2, and 30H3, for example, by dry etching. The through hole reaches the coupling section 41A through the insulating film included in the interlayer insulating layer 29, the insulating layer 28, the fixed electric charge layer 27, and the insulating layer 44. It is to be noted that the insulating film included in the interlayer insulating layer 29 on the first surface (surface 30S1) is also decreased in thickness in this case. Next, an electrically conducive film is formed on the insulating film included in the interlayer insulating layer 29 and in a through hole 27H and a photoresist PR is then formed at a predetermined position on the electrically conducive film. After that, the through electrodes 34A, 34B, and 34C that respectively include the pad sections 35A, 35B, and 35C on the first surface (surface 30S1) of the semiconductor substrate 30 are formed by etching and removing the photoresist PR.

Next, the via V2, the pad sections 36, 36B, and 36C, and the via V1 are each formed on the insulating film included in the interlayer insulating layer 29 and the through electrodes 34A, 34B, and 34C and the surface of the interlayer insulating layer 29 is then planarized by using a CMP (Chemical Mechanical Polishing) method. Subsequently, an electrically conductive film is formed on the interlayer insulating layer 29 and the photoresist PR is then formed at a predetermined position on the electrically conducive film. After that, the readout electrode 21A, the accumulation electrode 21B, and the shield electrode 21C are formed by etching and removing the photoresist PR. Next, the insulating layer 22 is formed on the interlayer insulating layer 29, the readout electrode 21A, the accumulation electrode 21B, and the shield electrode 21C and the opening 22H is then provided on the readout electrode 21A. Subsequently, the electric charge accumulation layer 23, the photoelectric conversion layer 24, and the upper electrode 25 are formed on the insulating layer 22.

It is to be noted that, in a case where the electric charge accumulation layer 23 and another organic layer are formed by using organic materials, it is preferable that the electric charge accumulation layer 23 and the other organic layer be formed continuously (in an in-situ vacuum process) in a vacuum step. In addition, the method of forming the photoelectric conversion layer 24 is not necessarily limited to a method in which vacuum evaporation is used. Another method, for example, spin coating technology, printing technology, or the like may be used.

Next, as illustrated in FIG. 16A, for example, an aluminum oxide film 26B is formed as a hard mask in the effective pixel region 110A on the upper electrode 25 by using, for example, a physical vapor deposition (physical vapor deposition; PVD) method, for example, to have a thickness of 10 nm to 50 nm. It is to be noted that the method of forming the film is not limited to this. For example, a CVD method or an ALD method may be used. Examples of the method of forming the film by using the PVD method include an EB (electron beam) evaporation method, a variety of sputtering methods (a magnetron sputtering method, an RF-DC coupled bias sputtering method, an ECR sputtering method, a facing target sputtering method, a high-frequency sputtering method), and the like. Especially in a case where the upper electrode 25 has large surface roughness, it is preferable to form the film by using a CVD/ALD method having excellent coverage. However, the film formation rate of the CVD/ALD method is remarkably lower than that of the PVD method. It is therefore preferable to use the PVD method as long as it is possible to sufficiently cover the upper electrode 25 in the PVD method. Next, the aluminum oxide film 26B is patterned by using, for example, a lithographic method to form a hard mask. It is to be noted that FIG. 16B described below illustrates an example in which the photoresist PR is removed, but the resist may be left behind after the aluminum oxide film 26B is patterned and the next step may be performed.

Next, as illustrated in FIG. 16B, the electric charge accumulation layer 23, the photoelectric conversion layer 24, and the upper electrode 25 formed in the peripheral region 110B are etched by using the aluminum oxide film 26B as a hard mask. Subsequently, the insulating layer 22 is etched. Next, the photoresists PR are patterned on the insulating layer 22, the aluminum oxide film 26B, and the interlayer insulating layer 29. After that, for example, as illustrated in FIG. 16C, the separation groove 29H is formed in the peripheral region 110B. The separation groove 29H surrounds the effective pixel region 110A and extends through the interlayer insulating layer 29 and the insulating layer 28.

Next, as illustrated in FIG. 16D, an aluminum oxide film 26A is formed over the whole of the top of the aluminum oxide film 26B and the interlayer insulating layer 29 by using, for example, a PVD method to have, for example, a thickness of 50 nm to 1000 nm. The interlayer insulating layer 29 includes the side surfaces of the upper electrode 25, the photoelectric conversion layer 24, the electric charge accumulation layer 23, and the insulating layer 22 and the side surface and the bottom surface of the separation groove 29H. This forms the hydrogen block layer 26 including the aluminum oxide films 26A and 26B. It is to be noted that the aluminum oxide film 26A may be formed by using a CVD method or an ALD method as with the aluminum oxide film 26B. For example, it is preferable to use a CVD/ALD method having excellent coverage in a case where a step difference between the electric charge accumulation layer 23, the photoelectric conversion layer 24, and the upper electrode 25 is large. It is preferable to use a PVD method in a case where a high film formation rate and warpage (stress) adjustment for the semiconductor substrate 30 are prioritized. Further, a PVD method and a CVD/ALD method may be combined to form the hydrogen block layer 26 including a stacked film. Next, the first protective layer 51 is formed on the hydrogen block layer 26 and the separation groove 29H is filled. Finally, the on-chip lens layer 52 is formed on the first protective layer 51. As described above, the imaging element 10A illustrated in FIG. 1 is completed.

In a case where light enters the photoelectric converter 20 via the on-chip lens 52L in the imaging element 10A, the light passes through the photoelectric converter 20 and the inorganic photoelectric converters 32B and 32R in order. While the light passes through the photoelectric converter 20 and the inorganic photoelectric converters 32B and 32R, the light is photoelectrically converted for each of the pieces of color light of green, blue, and red. The following describes an operation of acquiring signals of the respective colors.

(Acquisition of Green Color Signal by Photoelectric Converter 20)

First, the green light of the pieces of light having entered the imaging element 10A is selectively detected (absorbed) and photoelectrically converted by the photoelectric converter 20.

The photoelectric converter 20 is coupled to the gate Gamp of an amplifier transistor AMP and the floating diffusion FD1 via the through electrode 34A. The electrons of the electron-hole pairs generated by the photoelectric converter 20 are thus extracted from the lower electrode 21 side, transferred to the second surface (surface 30S2) side of the semiconductor substrate 30 via the through electrode 34, and accumulated in the floating diffusion FD1. At the same time as this, the amplifier transistor AMP modulates the amount of electric charge generated by the photoelectric converter 20 to a voltage.

In addition, the reset gate Grst of the reset transistor TR1rst is disposed next to the floating diffusion FD1. This causes the reset transistor TR1rst to reset the electric charge accumulated in the floating diffusion FD1.

Here, the photoelectric converter 20 is coupled to not only the amplifier transistor TR1amp, but also the floating diffusion FD1 via the through electrode 34A, allowing the reset transistor TR1rst to easily reset the electric charge accumulated in the floating diffusion FD1.

In contrast, in a case where the through electrode 34A and the floating diffusion FD1 are not coupled, it is difficult to reset the electric charge accumulated in the floating diffusion FD1. The electric charge is pulled out to the upper electrode 25 side by applying a high voltage. The photoelectric conversion layer 24 may be thus damaged. In addition, a structure that allows for resetting in a short period of time leads to increased dark-time noise and results in a trade-off. This structure is thus difficult.

FIG. 17 illustrates an operation example of the imaging element 10A. (A) illustrates the potential at the accumulation electrode 21B, (B) illustrates the potential at the floating diffusion FD1 (readout electrode 21A), and (C) illustrates the potential at the gate (Gsel) of the reset transistor TR1rst. In the imaging element 10A, voltages are individually applied to the readout electrode 21A and the accumulation electrode 21B.

In the imaging element 10A, a drive circuit applies a potential V1 to the readout electrode 21A and applies a potential V2 to the accumulation electrode 21B in an accumulation period. Here, it is assumed that the potentials V1 and V2 satisfy V2>V1. This causes the electric charge (electrons here) generated by photoelectric conversion to be drawn to the accumulation electrode 21B and accumulated in the region of the electric charge accumulation layer 23 opposed to the accumulation electrode 21B (accumulation period). Additionally, the value of the potential in the region of the electric charge accumulation layer 23 opposed to the accumulation electrode 21B becomes more negative with the passage of time of photoelectric conversion. It is to be noted that holes are sent from the upper electrode 25 to the drive circuit.

In the imaging element 10A, a reset operation is performed in the second portion of the accumulation period. Specifically, at a timing t1, a scanner changes the voltage of a reset signal RST from the low level to the high level. This turns on the reset transistor TR1rst in the unit pixel P. As a result, the voltage of the floating diffusion FD1 is set at a power supply voltage VDD and the voltage of the floating diffusion FD1 is reset (reset period).

After the reset operation is completed, the electric charge is read out. Specifically, the drive circuit applies a potential V3 to the readout electrode 21A and applies a potential V4 to the accumulation electrode 21B at a timing t2. Here, it is assumed that the potentials V3 and V4 satisfy V3<V4. This causes the electric charge (electrons here) accumulated in the region corresponding to the accumulation electrode 21B to be read out from the readout electrode 21A to the floating diffusion FD1. In other words, the electric charge accumulated in the electric charge accumulation layer 23 is read out by a controller (transfer period).

After the readout operation is completed, the drive circuit applies the potential V1 to the readout electrode 21A and applies the potential V2 to the accumulation electrode 21B again. This causes the electric charge (electrons here) generated by photoelectric conversion to be drawn to the accumulation electrode 21B and accumulated in the region of the photoelectric conversion layer 24 opposed to the accumulation electrode 21B (accumulation period).

(Acquisition of Blue Color Signal and Red Color Signal by Inorganic Photoelectric Converters 32B and 32R)

Next, the blue light and the red light of the pieces of light having passed through the photoelectric converter 20 are absorbed and photoelectrically converted in order by the inorganic photoelectric converter 32B and the inorganic photoelectric converter 32R, respectively. In the inorganic photoelectric converter 32B, the electrons corresponding to the incident blue light are accumulated in an n region of the inorganic photoelectric converter 32B and the accumulated electrons are transferred to the floating diffusion FD2 by the transfer transistor TR2*trs*. Similarly, in the inorganic photoelectric converter 32R, the electrons corresponding to the incident red light are accumulated in an n region of the inorganic photoelectric converter 32R and the accumulated electrons are transferred to the floating diffusion FD3 by the transfer transistor TR3*trs*.

(1-3. Workings and Effects)

As described above, in recent years, a stacked imaging element has been used in an imaging device such as a CCD image sensor or a CMOS image sensor because the stacked imaging element is able to extract R/G/B signals from one pixel and requests no demosaic process, causing no false color to occur. This stacked imaging element has a configuration in which an organic photoelectric converter including an organic photoelectric conversion layer is stacked on a semiconductor substrate in which a photodiode is embedded and formed. The organic photoelectric conversion layer includes a semiconductor material.

However, in the stacked imaging element as described above, the electric charge generated by the organic photoelectric converter is directly accumulated in the floating diffusion layer FD. It is therefore difficult to completely deplete the organic photoelectric converter, increasing kTC noise, increasing random noise, and deteriorating the quality of a captured image. Accordingly, an imaging element provided with an electric charge accumulation electrode has been developed as a stacked imaging element that is able to completely deplete the electric charge accumulation section of the organic photoelectric converter. The electric charge accumulation electrode is disposed, in the organic photoelectric converter disposed above the semiconductor substrate, on one electrode (e.g., first electrode) side of a pair of electrodes (first electrode and second electrode) disposed to be opposed to each other with the organic photoelectric conversion layer interposed in between. The electric charge accumulation electrode is disposed apart from the first electrode. The electric charge accumulation electrode is disposed to be opposed to the organic photoelectric conversion layer with an insulating layer interposed in between.

In this imaging element, the organic photoelectric conversion layer has a structure in which, for example, a lower semiconductor layer and an upper photoelectric conversion layer are stacked. The lower semiconductor layer is formed by using an oxide semiconductor material. The upper photoelectric conversion layer is formed by using an organic semiconductor material. This makes it possible to prevent the electric charge accumulated in the organic photoelectric conversion layer from being recombined and increase the transfer efficiency to the first electrode. However, the oxide semiconductor material included in the lower semiconductor layer tends to be reduced by hydrogen. This may cause oxygen defects and lower the operation stability.

In contrast, in the imaging element 10A according to the present embodiment, the separation groove 29H that separates the interlayer insulating layer 29 provided between the semiconductor substrate 30 and the photoelectric converter 20 is provided in the peripheral region 110B to surround the effective pixel region 110A. The side surface and the bottom surface of the separation groove 29H are covered with the hydrogen block layer 26. This hydrogen block layer 26 is formed by using, for example, aluminum oxide. The hydrogen block layer 26 covers, for example, the upper surface of the upper electrode 25 extending to the effective pixel region 110A and the side surfaces of the upper electrode 25, the photoelectric conversion layer 24, the electric charge accumulation layer 23, and the insulating layer 22. The hydrogen block layer 26 is directly stacked on the interlayer insulating layer 29 in the peripheral region 110B. This suppresses the entry of hydrogen ($H_2$) from the upper electrode 25 side and the opening H provided, for example, on the pad electrode 61 via the interlayer insulating layer 29 and from the lower electrode 21 side into the electric charge accumulation layer 23 and the photoelectric conversion layer 24.

As described above, in the present embodiment, the separation groove 29H is provided in the peripheral region 110B to surround the effective pixel region 110A. The separation groove 29H separates the interlayer insulating layer 29 provided between the semiconductor substrate 30 and the photoelectric converter 20. The side surface and the bottom surface of the separation groove 29H are covered with the hydrogen block layer 26. This suppresses the entry of hydrogen ($H_2$) into the electric charge accumulation layer 23 and the photoelectric conversion layer 24 via the interlayer insulating layer 29. For example, less oxygen defects occur in the electric charge accumulation layer 23, increasing the operation stability. In other words, it is possible to increase the reliability of the imaging element 10A and the imaging device 1 including the imaging element 10A.

In addition, in the present embodiment, the hydrogen block layer 26 is formed by using a material that makes it possible to form a film having a small amount of moisture contained therein in addition to a small amount of hydrogen contained therein. This suppresses the entry of moisture ($H_2O$) into the photoelectric conversion layer 24 and makes it possible to prevent the photoelectric conversion layer 24 from being deteriorated.

Next, a second embodiment and modification examples 1 to 7 are described. It is to be noted that the components corresponding to those of the imaging element 10A according to the first embodiment are denoted by the same signs and descriptions thereof are omitted.

2. Modification Example 1

FIG. 18 schematically illustrates a cross-sectional configuration of an imaging element (imaging element 10B) according to a modification example (modification example 1) of the present disclosure. FIG. 19 schematically illustrates an example of a planar configuration of the imaging element 10B illustrated in FIG. 18. It is to be noted that FIG. 18 illustrates a cross section taken along an II-II line illustrated in FIG. 19. The imaging element 10B is included, for example, in one pixel (unit pixel P) in the imaging device 1 such as a CMOS image sensor included in an electronic apparatus such as a digital still camera or a video camera as with the first embodiment described above. The imaging element 10B according to the present modification example is different from the imaging element 10A according to the first embodiment described above in that the peripheral region 110B is provided with double separation grooves (a separation groove 29H1 and a separation groove 20H2) that separate the interlayer insulating layer 29 and surround the effective pixel region 110A as illustrated in FIGS. 18 and 19.

In this way, the plurality of separation grooves 29H may be provided that surround the effective pixel region 110A. This makes it possible to further suppress the entry of hydrogen ($H_2$) into the electric charge accumulation layer 23 from the lower electrode 21 side. This makes it possible to further increase the reliability of an imaging element 10G and the imaging device 1 including the imaging element 10G.

3. Modification Example 2

FIG. 20 schematically illustrates a cross-sectional configuration of an imaging element (imaging element 10C) according to a modification example (modification example 2) of the present disclosure. FIG. 21 schematically illustrates an example of a planar configuration of the imaging element 10C illustrated in FIG. 20. It is to be noted that FIG. 20 illustrates a cross section taken along an line illustrated in FIG. 21. The imaging element 10C is included, for example, in one pixel (unit pixel P) in the imaging device 1 such as a CMOS image sensor included in an electronic apparatus such as a digital still camera or a video camera as with the first embodiment described above. The imaging element 10C according to the present modification example is different from the imaging element 10A according to the first embodiment described above in that the separation groove 29H is provided to surround the opening H formed on each of the plurality of pad electrodes 61 provided in the peripheral region 110B as illustrated in FIGS. 20 and 21.

In addition, FIG. 21 illustrates the example in which the separation grooves 29H are provided that individually surround the plurality (six here) of openings H formed on the plurality of respective pad electrodes 61, but this is not limitative. For example, as illustrated in FIG. 22, the separation groove 29H may collectively surround the plurality of openings H arranged, for example, along one side of the peripheral region 110B.

The entry of hydrogen ($H_2$) into the electric charge accumulation layer 23 and the photoelectric conversion layer 24 via the interlayer insulating layer 29 is mainly caused from the side surface of the opening H provided on the pad electrode 61 and extending from the on-chip lens layer 52 to the pad electrode 61. The separation groove 29H is therefore provided to surround the opening H. The separation groove 29H separates the interlayer insulating layer 29. This makes it possible to mostly suppress the entry of hydrogen ($H_2$) into the electric charge accumulation layer 23 from the lower electrode 21 side. This makes it possible to increase the reliability of the imaging element 10G and the imaging device 1 including the imaging element 10G.

4. Modification Example 3

FIG. 23 schematically illustrates a cross-sectional configuration of an imaging element (imaging element 10D) according to a modification example (modification example 3) of the present disclosure. FIG. 24 schematically illustrates an example of a planar configuration of the imaging element 10D illustrated in FIG. 23. It is to be noted that FIG. 23 illustrates a cross section taken along an IV-IV line illustrated in FIG. 24. The imaging element 10D is included, for example, in one pixel (unit pixel P) in the imaging device 1 such as a CMOS image sensor included in an electronic apparatus such as a digital still camera or a video camera as with the first embodiment described above. The imaging element 10D according to the present modification example is a combination of the first embodiment and the modification example 2, for example. As illustrated in FIGS. 23 and 24, the imaging element 10D is provided with separation grooves (a separation groove 29H3 and separation grooves 29H4) both around the effective pixel region 110A and around the openings H. The separation groove 29H3 and the separation grooves 29H4 separate the interlayer insulating layer 29 in the peripheral region 110B. The openings H are formed on the plurality of respective pad electrodes 61.

In this way, the separation groove 29H3 and the separation grooves 29H4 respectively surround the effective pixel region 110A and the openings H on the pad electrodes 61. This makes it possible to further suppress the entry of hydrogen ($H_2$) into the electric charge accumulation layer 23 from the lower electrode 21 side. This makes it possible to further increase the reliability of the imaging element 10G and the imaging device 1 including the imaging element 10G.

5. Modification Example 4

FIG. 25 schematically illustrates an example of a cross-sectional configuration of an imaging element (imaging element 10E) according to a modification example (modification example 4) of the present disclosure. The imaging element 10E is included, for example, in one pixel (unit pixel P) in the imaging device 1 such as a CMOS image sensor included in an electronic apparatus such as a digital still camera or a video camera as with the first embodiment described above. The imaging element 10E according to the present modification example is different from that of the first embodiment described above in that the separation groove 29H extends to the logic substrate 60. The separation groove 29H separates the interlayer insulating layer 29.

In the first embodiment and the modification examples 1 to 3 described above, the example has been described in which the separation groove 29H extends to the first surface (surface S1) of the semiconductor substrate 30, but the depth (D1) of the separation groove 29H is not limited to this. The depth (D1) of the separation groove 29H may be less than the depth (D2) of the opening H from the surface (surface 29S) of the interlayer insulating layer 29 to the pad electrode 61 or greater than the depth (D2) of the opening H as in the present modification example. In addition, in the first embodiment and the modification examples 1 to 3 described above, the bottom surface of the separation groove 29H is the first surface (surface 30S1) of the semiconductor substrate 30, but may be formed, for example, inside the semiconductor substrate 30.

In this way, the separation groove 29H that separates the interlayer insulating layer 29 may be formed to extend to the logic substrate 60. This makes it possible to suppress the entry of hydrogen ($H_2$) into the electric charge accumulation layer 23 from the opening H, for example, via the insulating layer 44, through holes 34H1, 34H2, and 34H3, and the like. The through electrodes 34A, 34B, and 34C extends through the through holes 34H1, 34H2, and 34H3. This makes it possible to further increase the reliability of the imaging element 10G and the imaging device 1 including the imaging element 10G.

Additionally, for example, as in an imaging element 10F illustrated in FIG. 26, there may be separately provided a separation groove 40H that separates the insulating layer 44 included in the multilayer wiring layer 40 into the effective pixel region 110A side and the peripheral region 110B side. This allows the imaging element 10F to have an effect similar to that of the imaging element 10E. It is to be noted that it is preferable to form an insulating layer 48 on the side surface and the bottom surface of the separation groove 40H as with the separation groove 29H. The insulating layer 48 includes, for example, aluminum oxide. Further, it is preferable to fill the separation groove 40H with an insulating layer 49. Examples of a material for the insulating layer 49 include a material similar to that of the first protective layer 51.

6. Modification Example 5

FIG. 27 schematically illustrates a portion of a cross-sectional configuration of an imaging element (imaging element 10G) according to a modification example (modification example 5) of the present disclosure. The imaging element 10G is included, for example, in one pixel (unit pixel P) in the imaging device 1 such as a CMOS image sensor included in an electronic apparatus such as a digital still camera or a video camera as with the first embodiment described above. The imaging element 10G according to the present embodiment is further provided with a hydrogen block layer 81 (second hydrogen block layer) in a lower layer of the lower electrode 21, for example, on the interlayer insulating layer 29. In addition, the insulating layer 22, the electric charge accumulation layer 23, the photoelectric conversion layer 24, and the upper electrode 25 of the imaging element 10G are formed to have the same end surface. The imaging element 10G according to the present modification example is different from the imaging element 10A according to the first embodiment on the two points described above.

The hydrogen block layer 81 is provided on the interlayer insulating layer 29 as described above, for example, on the whole of the effective pixel region 110A and the peripheral region 110B. The hydrogen block layer 81 is for suppressing the entry of hydrogen ($H_2$) from under the electric charge accumulation layer 23. Example of a material included in the hydrogen block layer 81 includes an insulating material. Specifically, it is preferable to use a material having light transmissivity and a high sealing property. Examples of such a material include aluminum oxide, silicon nitride, a carbon-containing silicon oxide film, and the like. In addition, it is preferable that the hydrogen block layer 81 have, for example, a smaller amount of hydrogen contained therein than that of the insulating layer 22 or that the film itself do not include any hydrogen. Further, the hydrogen block layer 81 has small stress. As described above, it is preferable to use aluminum oxide among the materials described above as a material for the hydrogen block layer 81. The thickness of the hydrogen block layer 81 is, for example, 10 nm or more and 1000 nm or less.

As described above, in the present modification example, a lower layer of the lower electrode 21 is further provided with the hydrogen block layer 81. This makes it possible to further suppress the entry of hydrogen ($H_2$) into the electric charge accumulation layer 23 from the lower electrode 21 side. This makes it possible to further increase the reliability of the imaging element 10G and the imaging device 1 including the imaging element 10G.

It is to be noted that, in the present modification example, the example has been described in which the hydrogen block layer 81 provided in a lower layer of the lower electrode 21 is provided immediately below the lower electrode 21, but this is not limitative. It is sufficient if the hydrogen block layer 81 is provided between the semiconductor substrate 30 and the lower electrode 21. For example, the hydrogen block layer 81 may be formed in the interlayer insulating layer 29.

7. Modification Example 6

FIG. 28 schematically illustrates a portion of a cross-sectional configuration of an imaging element (imaging element 10H) according to a modification example (modification example 6) of the present disclosure. The imaging element 10H is included, for example, in one pixel (unit pixel P) in the imaging device 1 such as a CMOS image sensor included in an electronic apparatus such as a digital still camera or a video camera as with the first embodiment described above. The imaging element 10H is provided with an insulating layer 92 including a material similar to those of the hydrogen block layer 26 and the hydrogen block layer 81 as an insulating layer that electrically insulates the lower electrode 21 and the electric charge accumulation layer 23 in the first embodiment described above. In addition, in the imaging element 10H, the insulating layer 92 is formed, for example, over the effective pixel region 110A and the peripheral region 110B. The imaging element 10H according to the present modification example is different from the imaging element 10A according to the first embodiment on the two points described above.

The insulating layer 92 is for electrically insulating the accumulation electrode 21B and the shield electrode 21C from the electric charge accumulation layer 23 and for suppressing the entry of hydrogen ($H_2$) from under the electric charge accumulation layer 23. It is preferable that a material included in the insulating layer 92 have light transmissivity and a high sealing property as with the hydrogen block layer 26 and the hydrogen block layer 81. Further, a dense film with fewer defects is preferable. Examples of such a material include aluminum oxide.

As described above, in the present modification example, the insulating layer 92 that electrically insulates the accumulation electrode 21B and the shield electrode 21C from the electric charge accumulation layer 23 is formed by using, for example, aluminum oxide. This provides the insulating layer 92 with a function of a hydrogen block layer. It is possible to suppress the entry of hydrogen ($H_2$) from under the electric charge accumulation layer 23. This makes it possible to further increase the reliability of the imaging element 10H and the imaging device 1 including the imaging element 10H.

8. Second Embodiment

FIG. 29 illustrates an example of a cross-sectional configuration of an imaging element (imaging element 10I) according to a second embodiment of the present disclosure. The imaging element 10I is included, for example, in one pixel (unit pixel P) in the imaging device 1 such as a CMOS image sensor included in an electronic apparatus such as a digital still camera or a video camera as with the first embodiment described above. The imaging device 1 has the effective pixel region 110A and the peripheral region 110B. A plurality of pixels is disposed in the effective pixel region 110A. The peripheral region 110B is provided around the effective pixel region 110A. For example, a peripheral circuit such as the row scanner 131 is formed in the peripheral region 110B. The imaging element 10I is formed in each of the plurality of pixels.

The imaging element 10I according to the present embodiment is further provided with a through electrode 34D closer to the effective pixel region 110A in the peripheral region 110B, for example, than the separation groove 29H in addition to the components of the imaging element 10A according to the first embodiment described above. The separation groove 29H separates the interlayer insulating layer 29. The through electrode 34D penetrates the semiconductor substrate 30. The through electrode 34D is electrically coupled to a pad section 36D via a pad section 35D and the via V2. As illustrated in FIG. 29, there is provided an opening 51H1 on the pad section 36D. The opening 51H1 extends through the first protective layer 51 and the hydrogen block layer 26 and exposes the pad section 36. The side surface and the bottom surface of the opening 51H1 are covered with a wiring line 53. The wiring line 53 is coupled to the pad section 36D on the bottom surface of an opening 51H and is included in a guard ring 55. The wiring line 53 further extends on the first protective layer 51. The wiring line 53 is coupled to the upper electrode 25 on the bottom surface of an opening 51H2 extending through the first protective layer 51 on the upper electrode 25. This electrically couples the upper electrode 25 to the through electrode 34D via the wiring line 53, the pad section 36D, the via V2, and the pad section 35D. A voltage is applied to the upper electrode 25. In addition, these upper electrode 25, wiring line 53, pad section 36D, via V2, pad section 35D, and through electrode 34D function as a transmission path for the electric charge (holes here) generated by the photoelectric converter 20.

In the present embodiment, there is further provided a second protective layer 54 on the first protective layer 51 and the wiring line 53. The opening 51H1 and the opening 51H2 are filled with this second protective layer 54. A material for the second protective layer 54 includes a material similar to that of the first protective layer 51. There is provided a light-shielding film 56 on the second protective layer 54 in the peripheral region 110B. Examples of a material for the light-shielding film 56 include tungsten (W), titanium (Ti), titanium nitride (TiN), or aluminum (Al). The light-shielding film 56 is configured, for example, as a stacked film of W/TiN/Ti or a single layer film of W. The thickness of the light-shielding film 56 is, for example, 50 nm or more and 400 nm or less. The on-chip lens layer 52 is provided on the second protective layer 54 and the light-shielding film 56 as in the imaging element 10A.

As described above, in the present embodiment, the guard ring 55 is formed in the peripheral region 110B. This makes it possible to further suppress the entry of hydrogen ($H_2$) or moisture ($H_2O$) from the outside. This makes it possible to further increase the reliability of the imaging element 10I and the imaging device 1 including the imaging element 10I.

In addition, FIG. 29 illustrates the example in which the separation groove 29H is provided outside the guard ring 55, but the separation groove 29H may be provided inside (effective pixel region 110A side) the guard ring 55, for example, as illustrated in FIG. 30.

9. Modification Example 7

FIG. 31 illustrates another example of a layout of the lower electrode 21 included in the photoelectric converter 20 of the imaging element 10A according to a modification example (modification example 7) of the present disclosure, for example. FIG. 32 illustrates another example of a layout of the inorganic photoelectric converter 32B of the imaging element 10A according to a modification example of the present disclosure and a variety of transistors related to this. FIG. 33 illustrates another example of a layout of the inorganic photoelectric converter R of the imaging element 10A according to a modification example of the present disclosure and a variety of transistors related to this, for example. Each of FIGS. 34 to 37 illustrates another example of wiring lines that are coupled to the respective photoelectric converters 20, 32B, and 32R and a variety of transistors related to these. In the first embodiment described above, the example has been described in which four pixels adjacent to each other have the pixel sharing structure in which the one floating diffusion FD1, the one floating diffusion FD2, and the one floating diffusion FD3 that correspond to them are shared, but this is not limitative. For example, it is possible to form the imaging element 10A according to the first embodiment described above as a stacked imaging element having no pixel sharing structure or a stacked imaging element having a so-called single pixel structure as illustrated in FIGS. 31 to 37.

10. Application Examples

Application Example 1

FIG. 38 illustrates an overall configuration of an imaging device (imaging device 1) that includes the imaging element 10A (or the imaging elements 10B to 10D) described in the first mode (or the second embodiment and the modification examples 1 to 7) described above for each of the pixels. This imaging device 1 is a CMOS image sensor. The imaging device 1 includes a pixel section 1a as an imaging area and a peripheral circuit section 130 in a peripheral region of this pixel section 1a on the semiconductor substrate 30. The peripheral circuit section 130 includes, for example, the row scanner 131, a horizontal selector 133, a column scanner 134, and a system controller 132. It is to be noted that the pixel section 1a corresponds to the effective pixel region 110A in the first embodiment or the like described above.

The pixel section 1a includes, for example, the plurality of unit pixels P (each corresponding to the imaging element 10) that are two-dimensionally disposed in a matrix. These unit pixels P are provided, for example, with pixel drive lines Lread (specifically, a row selection line and a reset control line) in each of pixel rows and provided with vertical signal lines Lsig in each of pixel columns. The pixel drive lines Lread are each for transmitting drive signals for reading out signals from pixels. One end of each of the pixel drive lines Lread is coupled to the output end of the row scanner 131 corresponding to each row.

The row scanner 131 is a pixel driver that includes a shift register, an address decoder, and the like and drives the respective unit pixels P of the pixel section 1a, for example, row by row. Signals outputted from the respective unit pixels P in the pixel rows selectively scanned by the row scanner 131 are supplied to the horizontal selector 133 through the respective vertical signal lines Lsig. The horizontal selector 133 includes an amplifier, a horizontal selection switch, and the like provided for each of the vertical signal lines Lsig.

The column scanner 134 includes a shift register, an address decoder, and the like and drives the respective horizontal selection switches of the horizontal selector 133 in order while scanning the horizontal selection switches.

The selective scanning by this column scanner 134 causes the signals of the respective pixels transmitted through the respective vertical signal lines Lsig to be outputted in order to a horizontal signal line 135 and transmitted to the outside of the semiconductor substrate 30 through the horizontal signal line 135.

The circuit portions including the row scanner 131, the horizontal selector 133, the column scanner 134, and the horizontal signal line 135 may be formed directly on the semiconductor substrate 30 or provided in external control IC. In addition, those circuit portions may be formed on another substrate coupled by a cable or the like.

The system controller 132 receives a clock supplied from the outside of the semiconductor substrate 30, data for an instruction about an operation mode, and the like and outputs data such as internal information regarding the imaging device 1. The system controller 132 further includes a timing generator that generates a variety of timing signals and controls the driving of the peripheral circuits such as the row scanner 131, the horizontal selector 133, and the column scanner 134 on the basis of the variety of timing signals generated by the timing generator.

Application Example 2

The imaging device 1 described above is applicable, for example, to any type of electronic apparatus having an imaging function. The electronic apparatus includes a camera system such as a digital still camera or a video camera, a mobile phone having an imaging function, or the like. FIG. 39 illustrates a schematic configuration of an electronic apparatus 2 (camera) as an example thereof. This electronic apparatus 2 is, for example, a video camera that is able to shoot a still image or a moving image. The electronic apparatus 2 includes the imaging device 1, an optical system (optical lens) 310, a shutter device 311, a driver 313 that drives the imaging device 1 and the shutter device 311, and a signal processor 312.

The optical system 310 guides image light (incident light) from a subject to the pixel section 1a of the imaging device 1. This optical system 310 may include a plurality of optical lenses. The shutter device 311 controls a period in which the imaging device 1 is irradiated with light and a period in which light is blocked. The driver 313 controls a transfer operation of the imaging device 1 and a shutter operation of the shutter device 311. The signal processor 312 performs various kinds of signal processing on a signal outputted from the imaging device 1. An image signal Dout subjected to the signal processing is stored in a storage medium such as a memory or outputted to a monitor or the like.

Further, the imaging device 1 described above is also applicable to the following electronic apparatuses (a capsule type endoscope 10100 and a mobile body such as a vehicle).

11. Practical Application Examples

Practical Application Example to In-vivo Information Acquisition System

Further, the technology (the present technology) according to the present disclosure is applicable to a variety of products. For example, the technology according to the present disclosure may be applied to an endoscopic surgery system.

FIG. 40 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 40, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The above has described the example of the in-vivo information acquisition system to which the technology according to the present disclosure may be applied. The technology according to the present disclosure may be applied, for example, to the image pickup unit 10112 among the components described above. This increases the detection accuracy.

Practical Application Example to Endoscopic Surgery System

The technology (the present technology) according to the present disclosure is applicable to a variety of products. For example, the technology according to the present disclosure may be applied to an endoscopic surgery system.

FIG. 41 is a view depicting an example of a schematic configuration of an endoscopic surgery system to which the technology according to an embodiment of the present disclosure (present technology) can be applied.

In FIG. 41, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 42 is a block diagram depicting an example of a functional configuration of the camera head 11102 and the CCU 11201 depicted in FIG. 41.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to the image pickup unit 11402 among the components described above. The application of the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

Practical Application Example to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 43 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 43, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 43, an audio speaker 12061, a display section 12062, and an instrument panel 12063 are illustrated as the output device. The display section 12062 may, for example, include at least one of an on-board display and a head-up display.

FIG. 44 is a diagram depicting an example of the installation position of the imaging section 12031.

In FIG. 44, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 44 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given with reference to the first and second embodiments, the modification examples 1 to 7, the application examples, and the practical application examples, but the contents of the present disclosure are not limited to the embodiments or the like described above. It is possible to make a variety of modifications. It is possible to combine, for example, the first and second embodiments and the modification examples 1 to 7 with each other, for example, as with the modification example 3 described as an example of a combination of the first embodiment and the modification example 2.

In addition, for example, the imaging element 10A in the first embodiment described above has a configuration in which the photoelectric converter 20 that detects green light and the inorganic photoelectric converters 32B and 32R that respectively detect blue light and red light are stacked, but the contents of the present disclosure are not limited to such a structure. In other words, the photoelectric converter 20 may detect red light or blue light or the inorganic photoelectric converters may each detect green light.

Further, the number of photoelectric converters (e.g., photoelectric converters 20) provided on the light receiving surface (first surface 30S1) side of the semiconductor substrate 30, the number of inorganic photoelectric converters (e.g., inorganic photoelectric converters 32B and 32R) embedded and formed in the semiconductor substrate 30, or the ratio between the photoelectric converters and the inorganic photoelectric converters is not limited. For example, there may be provided a plurality of photoelectric converters on the light receiving surface (first surface 30S1) side of the semiconductor substrate 30 to obtain color signals of a plurality of colors.

Still further, in the embodiments or the like described above, the example has been described in which a plurality of electrodes included in the lower electrode 21 includes the two electrodes of the readout electrode 21A and the accumulation electrode 21B. There may be, however, provided additionally three or four or more electrodes including a transfer electrode, a discharge electrode, or the like.

Further, in the first embodiment described above, the example has been described in which the electric charge accumulation layer 23, the photoelectric conversion layer 24, and the upper electrode 25 are formed as continuous layers common to the plurality of imaging elements 10A, but they may be formed separately for each pixel P. However, in such a case, dark current characteristics may deteriorate due to the influence of process damage on the electric charge accumulation layer 23 and the photoelectric conversion layer 24. Further, in a case where the continuous layers common to the plurality of imaging elements 10A are formed to extend in the effective pixel region 110A as in the first embodiment described above, the pixels are coupled to each other by the photoelectric conversion layer. Color mixture may therefore occur due to electric charge mixing between pixels. This is suppressed by providing the shield electrode 21C as described above.

It is to be noted that the effects described herein are merely examples, but are not limitative. In addition, there may be other effects.

It is to be noted that the present disclosure may have the following configurations. The following configurations according to the present technology suppress the entry of hydrogen into the photoelectric conversion layer and the electric charge accumulation layer via the interlayer insulating layer, making it possible to increase the reliability.

(1)

An imaging element including:

a semiconductor substrate having an effective pixel region in which a plurality of pixels is disposed and a peripheral region provided around the effective pixel region;

a photoelectric converter including a first electrode, a second electrode, and an electric charge accumulation layer and a photoelectric conversion layer, the first electrode being provided on a light receiving surface side of the semiconductor substrate and including a plurality of electrodes, the second electrode being disposed to be opposed to the first electrode, the electric charge accumulation layer and the photoelectric conversion layer being stacked and provided in order between the first electrode and the second electrode and extending in the effective pixel region;

a first hydrogen block layer that covers a top and a side surface of the photoelectric conversion layer and a side surface of the electric charge accumulation layer;

an interlayer insulating layer provided between the semiconductor substrate and the photoelectric converter; and a separation groove that separates the interlayer insulating layer in at least a portion of a region between the effective pixel region and the peripheral region, the separation groove having a side surface and a bottom surface covered with the first hydrogen block layer.

(2)

The imaging element according to (1), in which the separation groove is continuously provided around the effective pixel region.

(3)

The imaging element according to (2), in which the one or more separation grooves are provided.

(4)

The imaging element according to any of (1) to (3), further including one or more transmission electrodes in the peripheral region, the one or more transmission electrodes being used for external output, in which the separation groove is provided closer to the effective pixel region than the one or more transmission electrodes.

(5)

The imaging element according to (4), in which the semiconductor substrate further includes a logic substrate on a surface side opposite to the light receiving surface, and the transmission electrode is provided on the logic substrate and the transmission electrode has an opening thereon, the opening extending through the interlayer insulating layer and the semiconductor substrate.

(6)

The imaging element according to (4) or (5), in which the separation groove is continuously provided around the one or more transmission electrodes in a plan view.

(7)

The imaging element according to (6), in which the separation groove is provided for each of the transmission electrodes.

(8)

The imaging element according to any of (5) to (7), in which a depth of the separation groove is greater than or equal to a thickness of the interlayer insulating layer and less than or equal to a depth of the opening.

(9)

The imaging element according to any of (5) to (8), in which the separation groove has a depth greater than a depth of the opening.

(10)

The imaging element according to any of (1) to (9), further including a lens on a light receiving surface side of the photoelectric converter, in which the lens is formed by using a same material as a material of the first hydrogen block layer.

(11)

The imaging element according to any of (1) to (10), in which the photoelectric conversion layer is formed by using an organic material.

(12)

The imaging element according to any of (1) to (11), in which the photoelectric conversion layer is formed by using an inorganic material.

(13)

The imaging element according to (11), in which the organic material includes a rhodamine-based dye, a merocyanine-based dye, a quinacridone derivative, a subphthalocyanine-based dye, a coumaric acid dye, tris-8-hydroxyquinoline aluminum (Alq3), a merocyanine-based dye, and a phthalocyanine-based dye or derivatives thereof.

(14)

The imaging element according to (12), in which the inorganic material includes crystalline silicon, amorphous silicon, microcrystalline silicon, crystalline selenium, amorphous selenium, a chalcopyrite-based compound, and a compound semiconductor.

(15)

The imaging element according to (12), in which the inorganic material is used in a quantum dot shape.

(16)

The imaging element according to any of (1) to (15), further including a second hydrogen block layer below the electric charge accumulation layer.

(17)

The imaging element according to (16), in which the second hydrogen block layer is provided between the semiconductor substrate and the electric charge accumulation layer.

(18)

The imaging element according to (16) or (17), in which the photoelectric converter further includes an insulating layer between the first electrode and the electric charge accumulation layer, and the insulating layer is formed as the second hydrogen block layer.

(19)

The imaging element according to any of (1) to (18), in which the first hydrogen block layer is formed to include metal oxide having light transmissivity and an oxide semiconductor having light transmissivity.

(20)

An imaging device including an imaging element, in which the imaging element includes a semiconductor substrate having an effective pixel region in which a plurality of pixels is disposed and a peripheral region provided around the effective pixel region, a photoelectric converter including a first electrode, a second electrode, and an electric charge accumulation layer and a photoelectric conversion layer, the first electrode being provided on a light receiving surface side of the semiconductor substrate and including a plurality of electrodes, the second electrode being disposed to be opposed to the first electrode, the electric charge accumulation layer and the photoelectric conversion layer being stacked and provided in order between the first electrode and the second electrode and extending in the effective pixel region, a first hydrogen block layer that covers a top and a side surface of the photoelectric conversion layer and a side surface of the electric charge accumulation layer, an interlayer insulating layer provided between the semiconductor substrate and the photoelectric converter, and a separation groove that separates the interlayer insulating layer in at least a portion of a region between the effective pixel region and the peripheral region, the separation groove having a side surface and a bottom surface covered with the first hydrogen block layer.

This application claims the priority on the basis of Japanese Patent Application No. 2019-025595 filed with Japan Patent Office on Feb. 15, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising
an imaging element, wherein
the imaging element includes
a semiconductor substrate having an effective pixel region in which a plurality of pixels is disposed and a peripheral region provided around the effective pixel region,
a photoelectric converter including a first electrode, a second electrode, and an electric charge accumulation layer and a photoelectric conversion layer, the first electrode being provided on a light receiving surface side of the semiconductor substrate and including a plurality of electrodes, the second electrode being disposed to be opposed to the first electrode, the electric charge accumulation layer and the photoelectric conversion layer being stacked and provided in order between the first electrode and the second electrode and extending in the effective pixel region,
a first hydrogen block layer that covers a top and a side surface of the photoelectric conversion layer and a side surface of the electric charge accumulation layer,
an interlayer insulating layer provided between the semiconductor substrate and the photoelectric converter, and
a separation groove that separates the interlayer insulating layer in at least a portion of a region between the effective pixel region and the peripheral region, the separation groove having a side surface and a bottom surface covered with the first hydrogen block layer.

2. An imaging element comprising:
a semiconductor substrate having an effective pixel region in which a plurality of pixels is disposed and a peripheral region provided around the effective pixel region;
a photoelectric converter including a first electrode, a second electrode, and an electric charge accumulation layer and a photoelectric conversion layer, the first electrode being provided on a light receiving surface side of the semiconductor substrate and including a plurality of electrodes, the second electrode being disposed to be opposed to the first electrode, the electric charge accumulation layer and the photoelectric conversion layer being stacked and provided in order between the first electrode and the second electrode and extending in the effective pixel region;
a first hydrogen block layer that covers a top and a side surface of the photoelectric conversion layer and a side surface of the electric charge accumulation layer;
an interlayer insulating layer provided between the semiconductor substrate and the photoelectric converter; and
a separation groove that separates the interlayer insulating layer in at least a portion of a region between the effective pixel region and the peripheral region, the separation groove having a side surface and a bottom surface covered with the first hydrogen block layer.

3. The imaging element according to claim 2, further comprising a lens on a light receiving surface side of the photoelectric converter, wherein
the lens is formed by using a same material as a material of the first hydrogen block layer.

4. The imaging element according to claim 2, wherein the first hydrogen block layer is formed to include metal oxide having light transmissivity and an oxide semiconductor having light transmissivity.

5. The imaging element according to claim 2, wherein the separation groove is continuously provided around the effective pixel region.

6. The imaging element according to claim 5, wherein the one or more separation grooves are provided.

7. The imaging element according to claim 2, wherein the photoelectric conversion layer is formed by using an organic material.

8. The imaging element according to claim 7, wherein the organic material includes a rhodamine-based dye, a merocyanine-based dye, a quinacridone derivative, a subphthalocyanine-based dye, a coumaric acid dye, tris-8-hydroxyquinoline aluminum (Alq3), a merocyanine-based dye, and a phthalocyanine-based dye or derivatives thereof.

9. The imaging element according to claim 2, wherein the photoelectric conversion layer is formed by using an inorganic material.

10. The imaging element according to claim 9, wherein the inorganic material includes crystalline silicon, amorphous silicon, microcrystalline silicon, crystalline selenium, amorphous selenium, a chalcopyrite-based compound, and a compound semiconductor.

11. The imaging element according to claim 9, wherein the inorganic material is used in a quantum dot shape.

12. The imaging element according to claim 2, further comprising a second hydrogen block layer below the electric charge accumulation layer.

13. The imaging element according to claim 12, wherein the second hydrogen block layer is provided between the semiconductor substrate and the electric charge accumulation layer.

14. The imaging element according to claim 12, wherein
the photoelectric converter further includes an insulating layer between the first electrode and the electric charge accumulation layer, and
the insulating layer is formed as the second hydrogen block layer.

15. The imaging element according to claim 2, further comprising one or more transmission electrodes in the peripheral region, the one or more transmission electrodes being used for external output, wherein
the separation groove is provided closer to the effective pixel region than the one or more transmission electrodes.

16. The imaging element according to claim 15, wherein
the semiconductor substrate further includes a logic substrate on a surface side opposite to the light receiving surface, and
the transmission electrode is provided on the logic substrate and the transmission electrode has an opening thereon, the opening extending through the interlayer insulating layer and the semiconductor substrate.

17. The imaging element according to claim 15, wherein the separation groove is continuously provided around the one or more transmission electrodes in a plan view.

18. The imaging element according to claim 16, wherein a depth of the separation groove is greater than or equal to a thickness of the interlayer insulating layer and less than or equal to a depth of the opening.

19. The imaging element according to claim 16, wherein the separation groove has a depth greater than a depth of the opening.

20. The imaging element according to claim 17, wherein the separation groove is provided for each of the transmission electrodes.

* * * * *